(12) United States Patent
Tran et al.

(10) Patent No.: US 11,646,078 B2
(45) Date of Patent: May 9, 2023

(54) SET-WHILE-VERIFY CIRCUIT AND RESET-WHILE VERIFY CIRCUIT FOR RESISTIVE RANDOM ACCESS MEMORY CELLS

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Stanley Hong, San Jose, CA (US); Feng Zhou, Fremont, CA (US); Xian Liu, Sunnyvale, CA (US); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/199,243

(22) Filed: Mar. 11, 2021

(65) Prior Publication Data
US 2021/0257023 A1    Aug. 19, 2021

Related U.S. Application Data

(62) Division of application No. 16/119,416, filed on Aug. 31, 2018, now abandoned, which is a division of
(Continued)

(51) Int. Cl.
*G11C 7/22* (2006.01)
*G11C 13/00* (2006.01)

(52) U.S. Cl.
CPC .......... *G11C 13/004* (2013.01); *G11C 13/003* (2013.01); *G11C 13/0007* (2013.01);
(Continued)

(58) Field of Classification Search
CPC .... G11C 13/004; G11C 7/065; G11C 13/0064
See application file for complete search history.

(56) References Cited

U.S. PATENT DOCUMENTS

| 5,153,499 A | 10/1992 | Klesh |
| 5,554,874 A | 9/1996 | Doluca |
| (Continued) | | |

FOREIGN PATENT DOCUMENTS

| EP | 0 898 376 A2 | 2/1999 |
| JP | 2014-93530 | 5/2019 |
| (Continued) | | |

OTHER PUBLICATIONS

Notice of Grounds for Rejection dated Feb. 16, 2022 corresponding to the related S. Korean Patent Application No. 10-2021-7038103.
(Continued)

*Primary Examiner* — Mushfique Siddique
(74) *Attorney, Agent, or Firm* — DLA Piper LLP US

(57) ABSTRACT

Numerous embodiments of circuitry for a set-while-verify operation and a reset-while verify operation for resistive random access memory cells are disclosed. In one embodiment, a set-while-verify circuit for performing a set operation on a selected RRAM cell in the array applies a combination of voltages or current to a bit line, word line, and source line associated with the selected RRAM cell and stops said applying when the set operation is complete. In another embodiment, a reset-while-verify circuit for performing a reset operation on a selected RRAM cell in the array applies a combination of voltages or current to a bit line, word line, and source line associated with the selected RRAM cell and stops said applying when the reset operation is complete.

2 Claims, 44 Drawing Sheets

Related U.S. Application Data application No. 15/701,071, filed on Sep. 11, 2017, now Pat. No. 10,755,779.

(52) U.S. Cl.
CPC ...... *G11C 13/0023* (2013.01); *G11C 13/0026* (2013.01); *G11C 13/0028* (2013.01); *G11C 13/0061* (2013.01); *G11C 13/0064* (2013.01); *G11C 13/0069* (2013.01); *G11C 2013/009* (2013.01); *G11C 2013/0042* (2013.01); *G11C 2013/0054* (2013.01); *G11C 2013/0066* (2013.01); *G11C 2013/0078* (2013.01); *G11C 2013/0083* (2013.01); *G11C 2213/32* (2013.01); *G11C 2213/52* (2013.01); *G11C 2213/56* (2013.01); *G11C 2213/79* (2013.01); *G11C 2213/82* (2013.01); *H10B 63/30* (2023.02); *H10N 70/821* (2023.02); *H10N 70/8418* (2023.02); *H10N 70/8833* (2023.02)

(56) References Cited

U.S. PATENT DOCUMENTS

| | | | |
|---|---|---|---|
| 5,721,705 | A | 2/1998 | Hong |
| 6,272,054 | B1 | 8/2001 | Barth, Jr. |
| 6,850,430 | B1 | 2/2005 | Perner |
| 7,057,922 | B2 * | 6/2006 | Fukumoto ............. B82Y 10/00 365/158 |
| 9,312,001 | B1 | 4/2016 | Huang |
| 9,361,980 | B1 * | 6/2016 | Tsai .................. G11C 13/0028 |
| 9,754,640 | B1 | 9/2017 | Yang |
| 2007/0008770 | A1 | 1/2007 | Nagao |
| 2007/0247893 | A1 | 10/2007 | Bednorz |
| 2007/0268737 | A1 | 11/2007 | Hidaka |
| 2007/0268742 | A1 | 11/2007 | Liu |
| 2008/0007993 | A1 | 1/2008 | Masahiro |
| 2008/0175036 | A1 | 7/2008 | Oh |
| 2009/0067229 | A1 | 3/2009 | Kang |
| 2010/0054020 | A1 | 3/2010 | Ueda |
| 2010/0073034 | A1 | 3/2010 | Valentino |
| 2010/0085799 | A1 * | 4/2010 | Cho .................. G11C 13/004 365/207 |
| 2010/0091550 | A1 | 4/2010 | Chen |
| 2010/0118588 | A1 | 5/2010 | Chen |
| 2011/0007581 | A1 | 1/2011 | Jung |
| 2011/0026302 | A1 | 2/2011 | Xi |
| 2011/0216574 | A1 | 9/2011 | Ichihara |
| 2011/0235401 | A1 * | 9/2011 | Kunitake ............ G11C 13/0023 29/592.1 |
| 2011/0255330 | A1 | 10/2011 | Sasaki |
| 2012/0230098 | A1 * | 9/2012 | Frey ................... G11C 13/0064 365/163 |
| 2012/0314481 | A1 | 12/2012 | Close et al. |
| 2012/0326218 | A1 | 12/2012 | Wang |
| 2013/0044535 | A1 * | 2/2013 | Shimakawa ....... G11C 13/0009 365/148 |
| 2013/0119340 | A1 | 5/2013 | Hou |
| 2013/0121056 | A1 | 5/2013 | Liu |
| 2013/0201750 | A1 * | 8/2013 | Lee .................... G11C 13/0064 365/148 |
| 2013/0250657 | A1 | 9/2013 | Haukness |
| 2014/0126267 | A1 | 5/2014 | Ikeda |
| 2014/0133211 | A1 | 5/2014 | Nazarian |
| 2014/0185362 | A1 | 7/2014 | Haukness |
| 2014/0192586 | A1 | 7/2014 | Nardi et al. |
| 2014/0211538 | A1 | 7/2014 | Lee |
| 2014/0241034 | A1 | 8/2014 | Tsai |
| 2014/0332752 | A1 | 11/2014 | Kouno |
| 2015/0103613 | A1 | 4/2015 | Schubert |
| 2015/0187393 | A1 | 7/2015 | Ueda |
| 2015/0235698 | A1 | 8/2015 | Tsai |
| 2015/0255124 | A1 | 9/2015 | Gu et al. |
| 2015/0364186 | A1 | 12/2015 | Ryu |
| 2015/0380086 | A1 * | 12/2015 | Park .................... G11C 13/0004 365/148 |
| 2016/0118114 | A1 | 4/2016 | Kwon |
| 2016/0148686 | A1 | 5/2016 | Chia-Jung |
| 2016/0181517 | A1 | 6/2016 | Zhou |
| 2016/0358651 | A1 | 12/2016 | Shih et al. |
| 2017/0140819 | A1 | 5/2017 | Lee |
| 2017/0236581 | A1 | 8/2017 | Yang |
| 2017/0287557 | A1 | 10/2017 | Rajamohanan |
| 2018/0151224 | A1 | 5/2018 | Chih |

FOREIGN PATENT DOCUMENTS

| | | |
|---|---|---|
| KR | 10-2015-0116072 | 10/2015 |
| WO | 2016/155410 A1 | 10/2016 |

OTHER PUBLICATIONS

Notification of Reasons for Refusal dated Mar. 1, 2022 corresponding to the related Japanese Patent Application No. 2020-514596.
Notice of Grounds for Rejection dated Aug. 22, 2022 corresponding to the related S. Korean Patent Application No. 10-2021-7038103.

\* cited by examiner

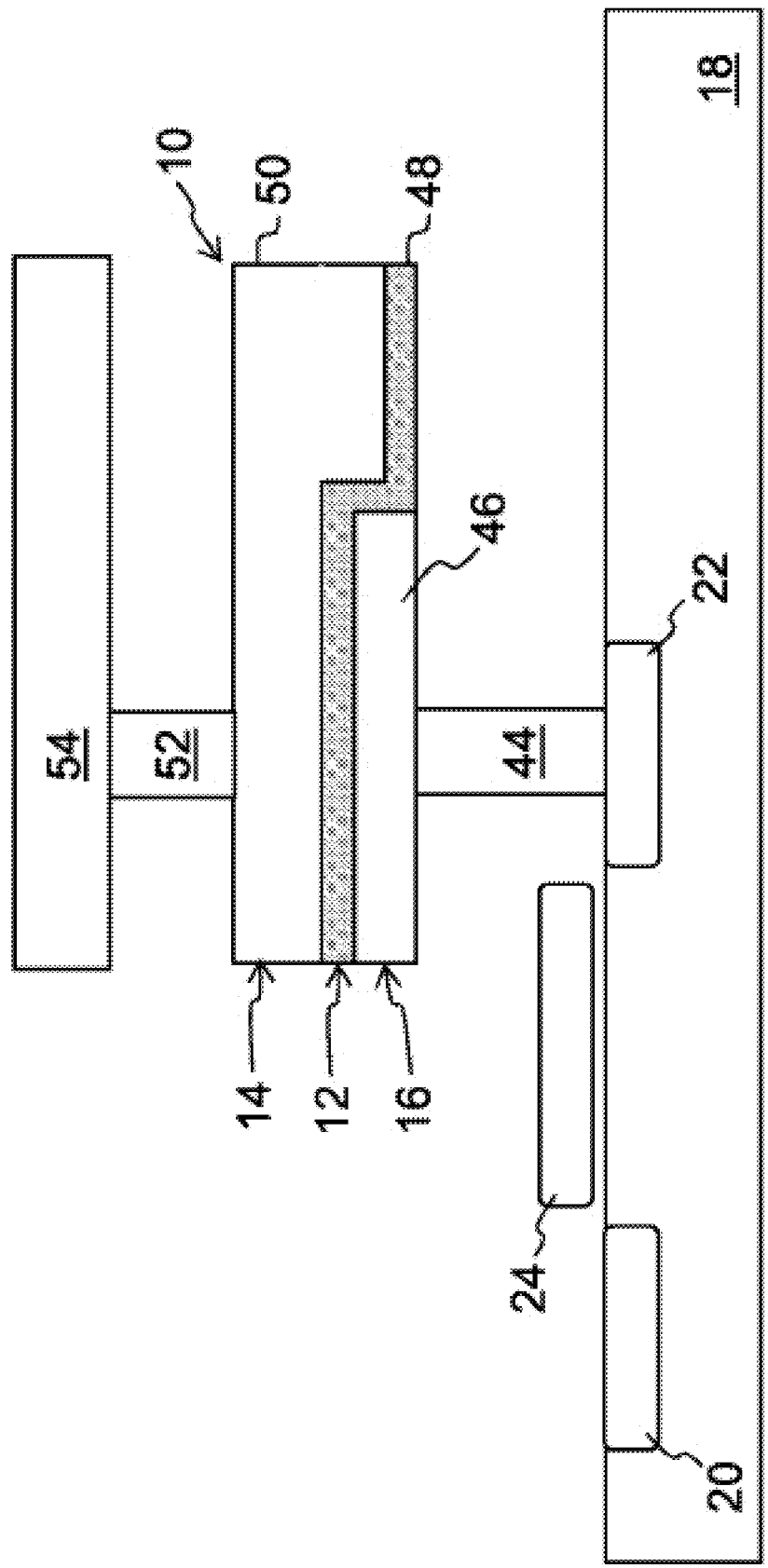

SET-WHILE-VERIFY CIRCUIT AND RESET-WHILE VERIFY CIRCUIT FOR RESISTIVE RANDOM ACCESS MEMORY CELLS

PRIORITY CLAIM

This application is a divisional application of U.S. patent Ser. No. 16/119,416, filed on Aug. 31, 2018, and titled, "Methods For Writing To An Array Of Resistive Random Access Memory Cells," which is a divisional application of U.S. patent application Ser. No. 15/701,071, filed on Sep. 11, 2017, and titled, "Circuitry For Writing To And Reading From An Array Of Resistive Random Access Memory Cells," which is incorporated by reference herein.

TECHNICAL FIELD

Numerous embodiments of circuitry for a set-while-verify operation and a reset-while verify operation for resistive random access memory cells are disclosed.

BACKGROUND OF THE INVENTION

Resistive random access memory (RRAM) is a type of nonvolatile memory. Generally, RRAM memory cells each include a resistive dielectric material layer sandwiched between two conductive electrodes. The dielectric material is normally insulating. However, by applying the proper voltage across the dielectric layer, a conduction path (typically referred to as a filament) can be formed through the dielectric material layer. Once the filament is formed, it can be "reset" (i.e., broken or ruptured, resulting in a high resistance state across the RRAM cell) and set (i.e., re-formed, resulting in a lower resistance state across the RRAM cell), by applying the appropriate voltages across the dielectric layer. The low and high resistance states can be utilized to indicate a digital signal of "1" or "0" depending upon the resistance state, and thereby provide a reprogrammable non-volatile memory cell that can store a bit of information.

FIG. 1 shows a conventional configuration of an RRAM memory cell 1. Memory cell 1 includes a resistive dielectric material layer 2 sandwiched between two conductive material layers that form top and bottom electrodes 3 and 4, respectively.

FIGS. 2A-2D show the switching mechanism of the dielectric material layer 2. Specifically, FIG. 2A shows the resistive dielectric material layer 2 in its initial state after fabrication, where the layer 2 exhibits a relatively high resistance. FIG. 2B shows the formation of a conductive filament 7 through the layer 2 by applying the appropriate voltage across the layer 2. The filament 7 is a conductive path through the layer 2, such that the layer exhibits a relatively low resistance across it (because of the relatively high conductivity of the filament 7). FIG. 2C shows the formation of a rupture 8 in filament 7 caused by the application of a "reset" voltage across the layer 2. The area of the rupture 8 has a relatively high resistance, so that layer 2 exhibits a relatively high resistance across it. FIG. 2D shows the restoration of the filament 7 in the area of the rupture 8 caused by the application of a "set" voltage across layer 2. The restored filament 7 means the layer 2 exhibits a relatively low resistance across it. The relatively low resistance of layer 2 in the "formation" or "set" states of FIGS. 2B and 2D respectively can represent a digital signal state (e.g. a "1"), and the relatively high resistance of layer 2 in the "reset" state of FIG. 2C can represent a different digital signal state (e.g. a "0"). The RRAM cell 1 can repeatedly be "reset" and "set," so it forms an ideal reprogrammable nonvolatile memory cell.

One of the drawbacks of this type of RRAM memory cell is that the voltage and current needed to form the filament are relatively high (and could be significantly higher than the voltages needed to set and reset the memory cell).

To solve this issue, Applicants previously filed U.S. patent application Ser. No. 14/582,089, published as United States Patent Application Publication 2016/0181517, which is incorporated herein by reference. That application presented an improved RRAM memory cell that requires a lower voltage and current for forming the cell's filament. Specifically, that application disclosed a geometrically enhanced RRAM cell with electrodes and resistive dielectric layer configured in a manner that reduces the voltage necessary for forming the cell's conductive filament. Applicant had discovered that by providing a sharp corner in the resistive dielectric layer at a point between the two electrodes significantly reduces the voltage and current necessary to effectively form the filament. This design will be described below with reference to FIGS. 3-6.

FIG. 3 illustrates the general structure of RRAM memory cell 10, which includes a resistive dielectric layer 12 having elongated first and second portions 12a and 12b respectively that meet at a right angle. Specifically, first portion 12a is elongated and extends horizontally, and second portion 12b is elongated and extends vertically, such that the two portions 12a and 12b meet at a sharp corner 12c (i.e. resistive dielectric layer 12 has an "L" shape). The first electrode 14 is disposed above horizontal layer portion 12a and to the left of vertical layer portion 12b. The second electrode 16 is disposed below horizontal layer portion 12a and to the right of vertical layer portion 12b. Therefore, each of the first and second layer portions 12a and 12b are disposed between and in electrical contact with the electrodes 14 and 16. Electrodes 14 and 16 can be formed of appropriately conductive material such as W, Al, Cu, Ti, Pt, TaN, TiN, etc., and resistive dielectric layer 12 is made of a transition metal oxide, such as HfOx, TaOx, TiOx, WOx, VOx, CuOx, or multiple layers of such materials, etc.). Alternatively, resistive dielectric layer 12 can be a composite of discrete sub-layers with one or more sub-layers of transition metal oxides (e.g. layer 12 could be multiple layers: an Hf layer disposed between a TaOx layer and an HfOx layer). It has been discovered that filament formation through layer 12 at the sharp corner 12c can occur at lower voltages than if the dielectric layer 12 were planar due to the enhanced electric field at the sharp corner 12c.

FIGS. 4A-4C show the steps in forming the inventive RRAM memory cell 10 and related circuitry. The process begins by forming a select transistor on a substrate 18. The transistor includes source/drain regions 20/22 formed in the substrate 18 and a gate 24 disposed over and insulated from the channel region there between. On the drain 22 is formed conductive blocks 26 and 28, and conductive plug 30, as illustrated in FIG. 4A.

A layer of conductive material 32 is formed over plug 30 (e.g. using photolithography techniques well known in the art). A block of conductive material 34 is then formed over just a portion of the layer of conductive material 32. The corner where layer 32 and block 34 meet can be sharpened by plasma treatment. Then, transition metal oxide layer 36 is deposited on layer 32 and on the vertical portion of block 34. This is followed by a conductive material deposition and CMP etch back to form a block of conductive material 38 on layer 36. The resulting structure is shown in FIG. 4B.

A conductive plug 40 is formed on conductive block 38. A conductive line (e.g. bit line) 42 is formed over and connected to plug 40. The resulting structure is shown in FIG. 4C. Layer 32 and block 34 form the lower electrode 16, layer 36 forms the resistive dielectric layer 12, and block 38 forms the upper electrode 14, of RRAM cell 10. FIG. 4C further contains a schematic representation for an RRAM memory cell, where the RRAM cell corresponds to RRAM cell 10 with its select transistor, and where BL is electrode 42, WL is electrode 24, and SL is electrode 20.

FIGS. 5A-5C show the steps in forming an alternate embodiment of the inventive RRAM memory cell 10 and related circuitry. The process begins by forming the select transistor on a substrate 18 as described above (source/drain regions 20/22 formed in the substrate 18, and gate 24 disposed over and insulated from the channel region there between). On the drain 22 is formed a conductive block 44, as illustrated in FIG. 5A.

A layer of conductive material 46 is formed over block 44. A transition metal oxide layer 48 is deposited on block 46, along one of the vertical side surfaces of block 46, and away from block 46. This is followed by forming a layer of conductive material 50 by deposition and CMP etch back. The resulting structure is shown in FIG. 5B. Hence, there exists a sharp tip corner 46a of material 46 that is pointing to another sharp tip corner intersection of layers 48/50. This enhances the localized field at top corner 46a which reduces the necessary forming voltage.

A conductive plug 52 is formed on conductive layer 50. A conductive line (e.g. bit line) 54 is formed over and connected to plug 52. The resulting structure is shown in FIG. 5C. Layer 46 forms the lower electrode 16, layer 48 forms the resistive dielectric layer 12, and layer 50 forms the upper electrode 14, of RRAM cell 10.

As a non-limiting example, RRAM cell 10 in its original state is shown in FIG. 6A. Electrodes 14 and 16 are formed of CU and resistive dielectric layer 12 is formed of HfOx. In order to form a conductive filament 56 through the sharp corner 12c as shown in FIG. 6B, a voltage difference of about 3-6V is applied across electrodes 14 and 16. In order to reset the RRAM cell 10 by forming a rupture 58 in filament 56 as shown in FIG. 6C, a voltage difference of about 1-4 V is applied across electrodes 14 and 16. In order to set the RRAM cell 10 by removing rupture 58 in filament 56 as shown in FIG. 6D, a voltage difference of about 1-4 V is applied across electrodes 16 and 14 (i.e. reverse polarity relative to forming and reset voltages).

Although RRAM cell technology is known in the prior art, what is needed are improved array architectures and layouts. What is further needed are improved circuits for performing read and write operations with respect to RRAM cells such as RRAM memory cell 1 and 10.

SUMMARY OF THE INVENTION

The inventions disclosed herein include numerous embodiments for circuits for performing set-while-verify and reset-while verify operations in resistive random access memory cells.

In one embodiment, a non-volatile memory system comprises an array of resistive random access memory (RRAM) cells organized into rows and columns, wherein each cell comprises a top electrode, a bottom electrode, and a switching layer between the top electrode and bottom electrode; a plurality of bit lines, each bit line coupled to a column of RRAM cells; a plurality of word lines, each word line coupled to a row of RRAM cells; a plurality of source lines, each source line coupled to two adjacent rows of RRAM cells; and a set-while-verify circuit for performing a set operation on a selected RRAM cell in the array by applying a combination of voltages or current to a bit line, word line, and source line associated with the selected RRAM cell and stopping said applying when the set operation is complete.

In another embodiment, a non-volatile memory system comprises: an array of resistive random access memory (RRAM) cells organized into rows and columns, wherein each cell comprises a top electrode, a bottom electrode, and a switching layer between the top electrode and bottom electrode; a plurality of bit lines, each bit line coupled to a column of RRAM cells; a plurality of word lines, each word line coupled to a row of RRAM cells; a plurality of source lines, each source line coupled to two adjacent rows of RRAM cells; and a reset-while-verify circuit for performing a reset operation on a selected RRAM cell in the array by applying a combination of voltages or current to a bit line, word line, and source line associated with the selected RRAM cell and stopping said applying when the reset operation is complete.

BRIEF DESCRIPTION OF THE DRAWINGS

FIGS. 5A-5C are side cross sectional views showing the steps in forming an alternate embodiment of the RRAM cell of FIG. 3.

DETAILED DESCRIPTION OF THE PREFERRED EMBODIMENT

Figure 1:
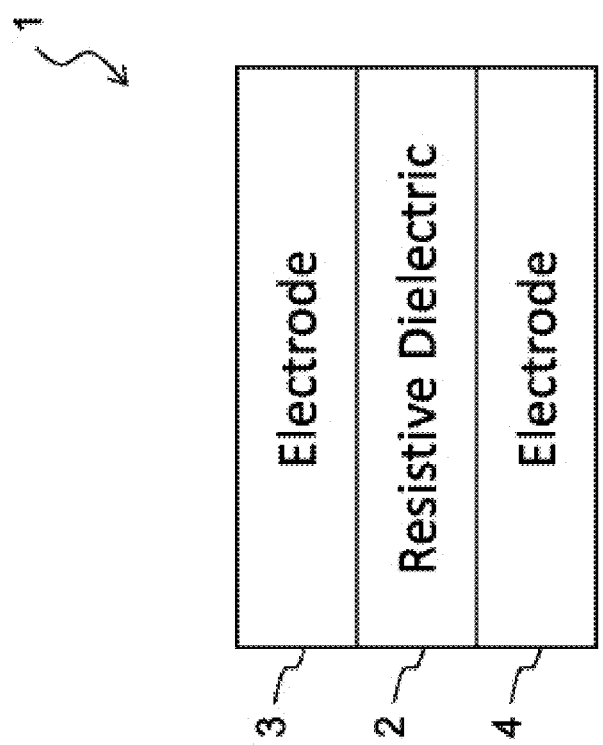
FIG. 1 is a side cross sectional view of a conventional Resistive Random Access Memory (RRAM) cell.
Figure 2B:
FIG. 2B is a side cross sectional view of the resistive dielectric layer of the conventional RRAM cell in its formed state.
Figure 2D:
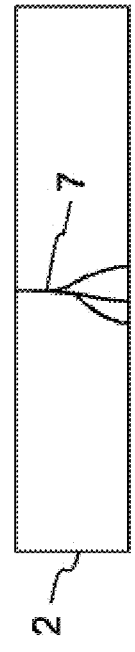
FIG. 2D is a side cross sectional view of the resistive dielectric layer of the conventional RRAM cell in its set state.
Figure 2A:
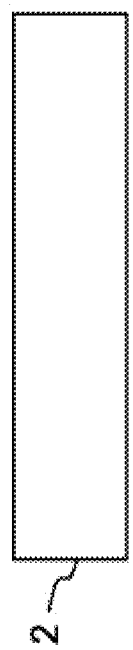
FIG. 2A is a side cross sectional view of the resistive dielectric layer of the conventional RRAM cell in its initial state after fabrication.
Figure 2C:
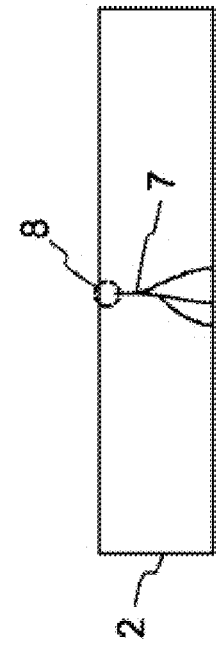
FIG. 2C is a side cross sectional view of the resistive dielectric layer of the conventional RRAM cell in its reset state.
Figure 3:
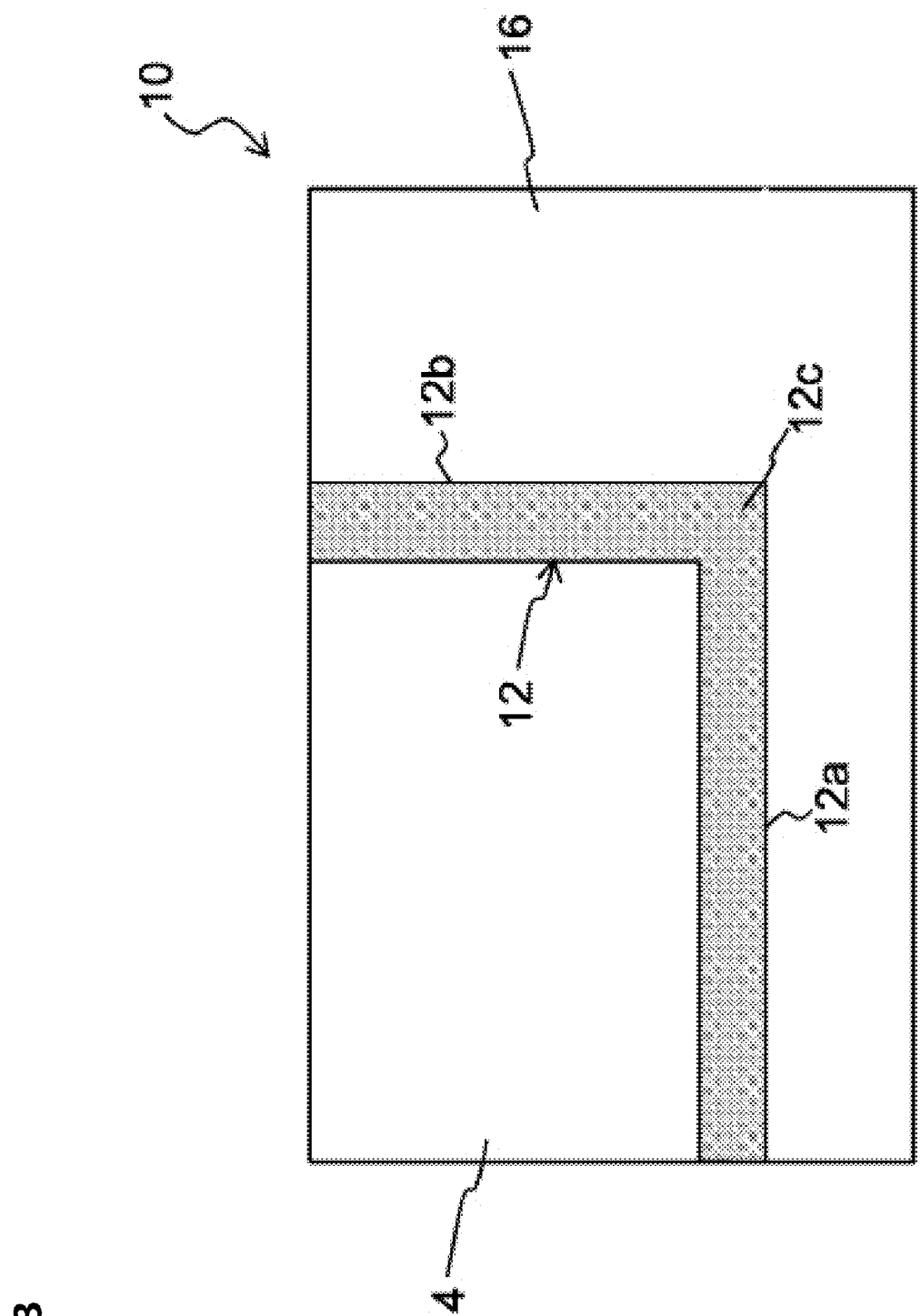
FIG. 3 is a side cross sectional view of an RRAM cell invented by Applicant and described in a previous patent application.
Figure 4A:
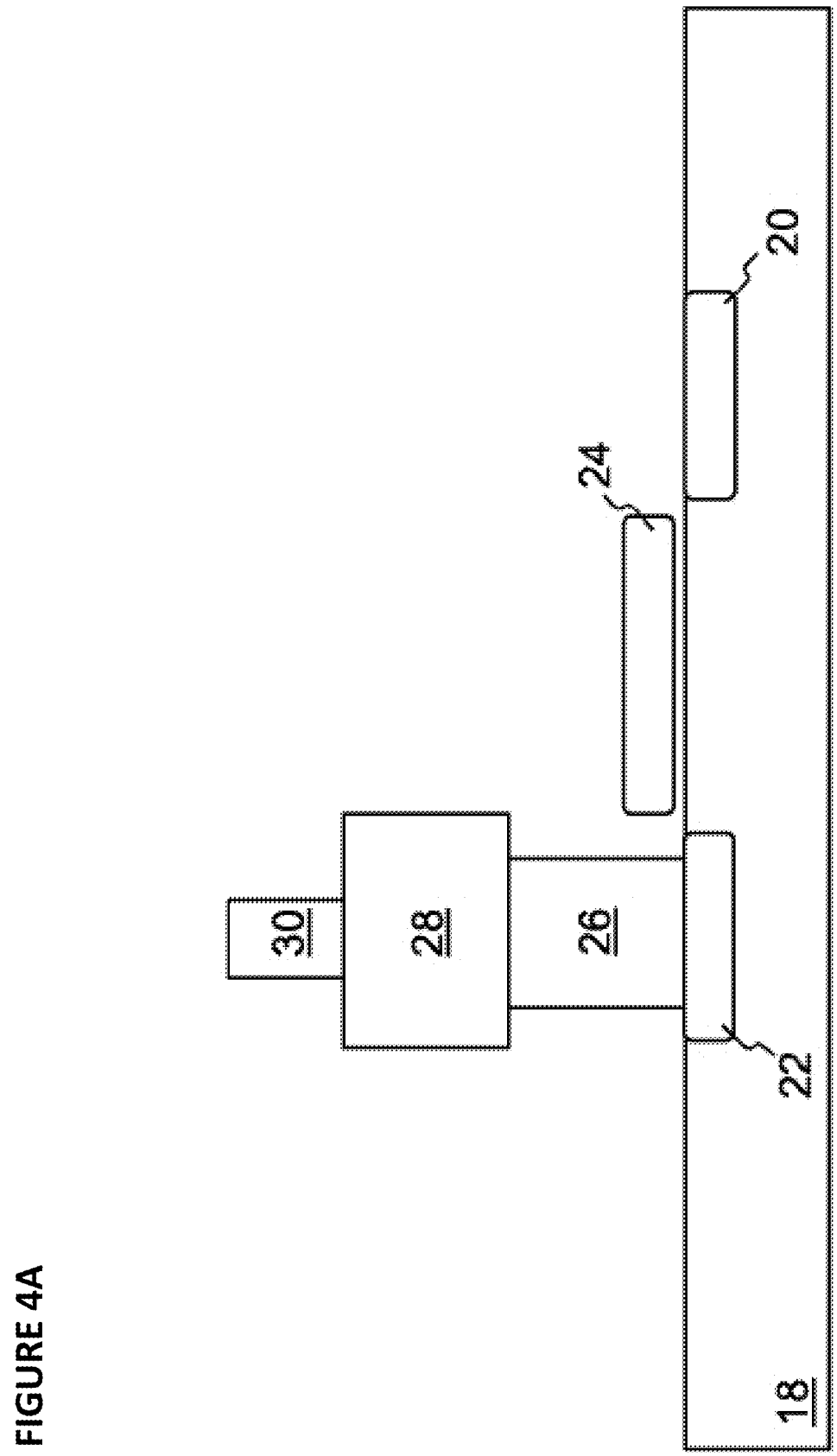
FIGS. 4A-4C are side cross sectional views showing the steps in forming the RRAM cell of FIG. 3.
Figure 4B:
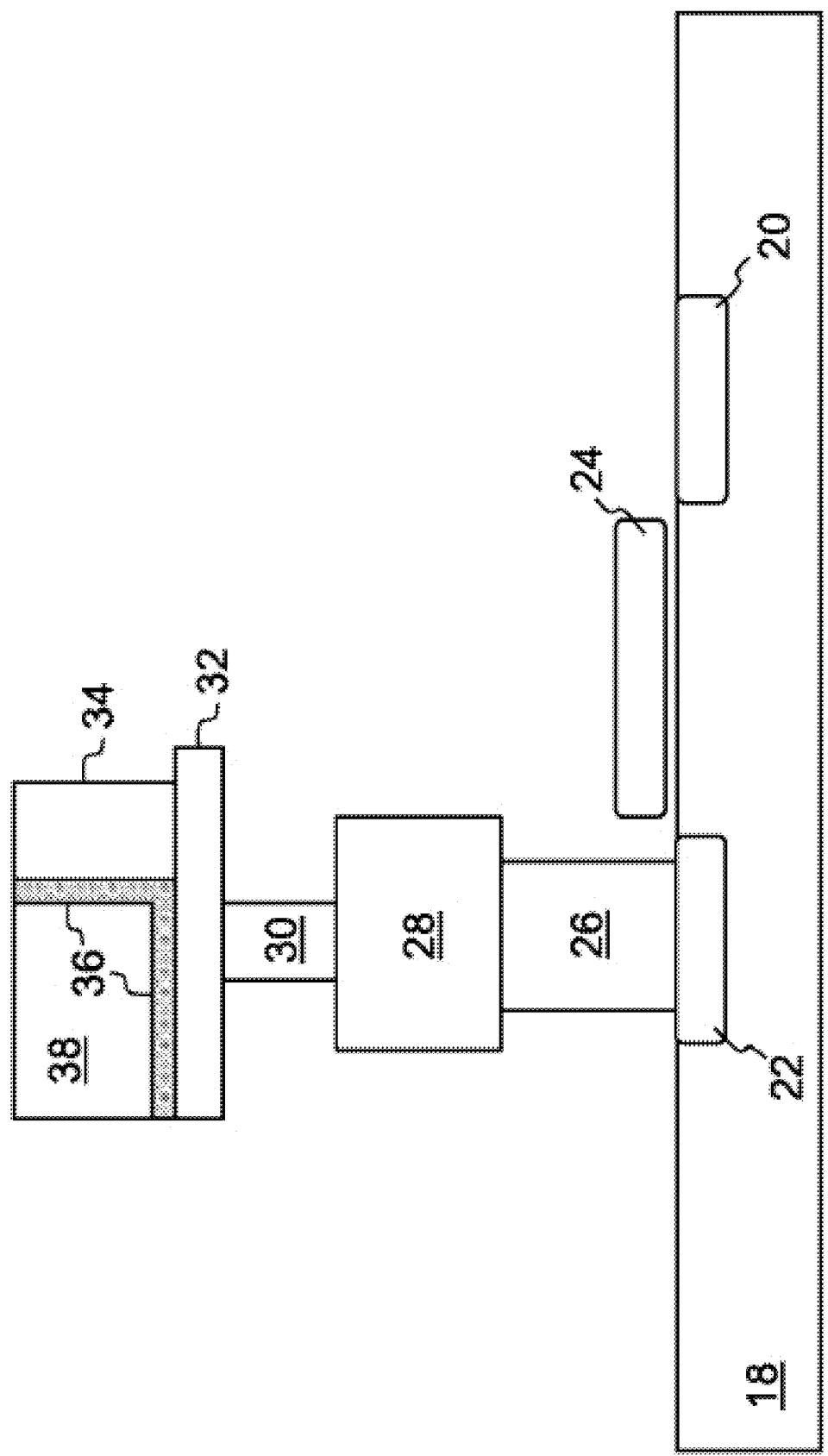
Figure 4C:
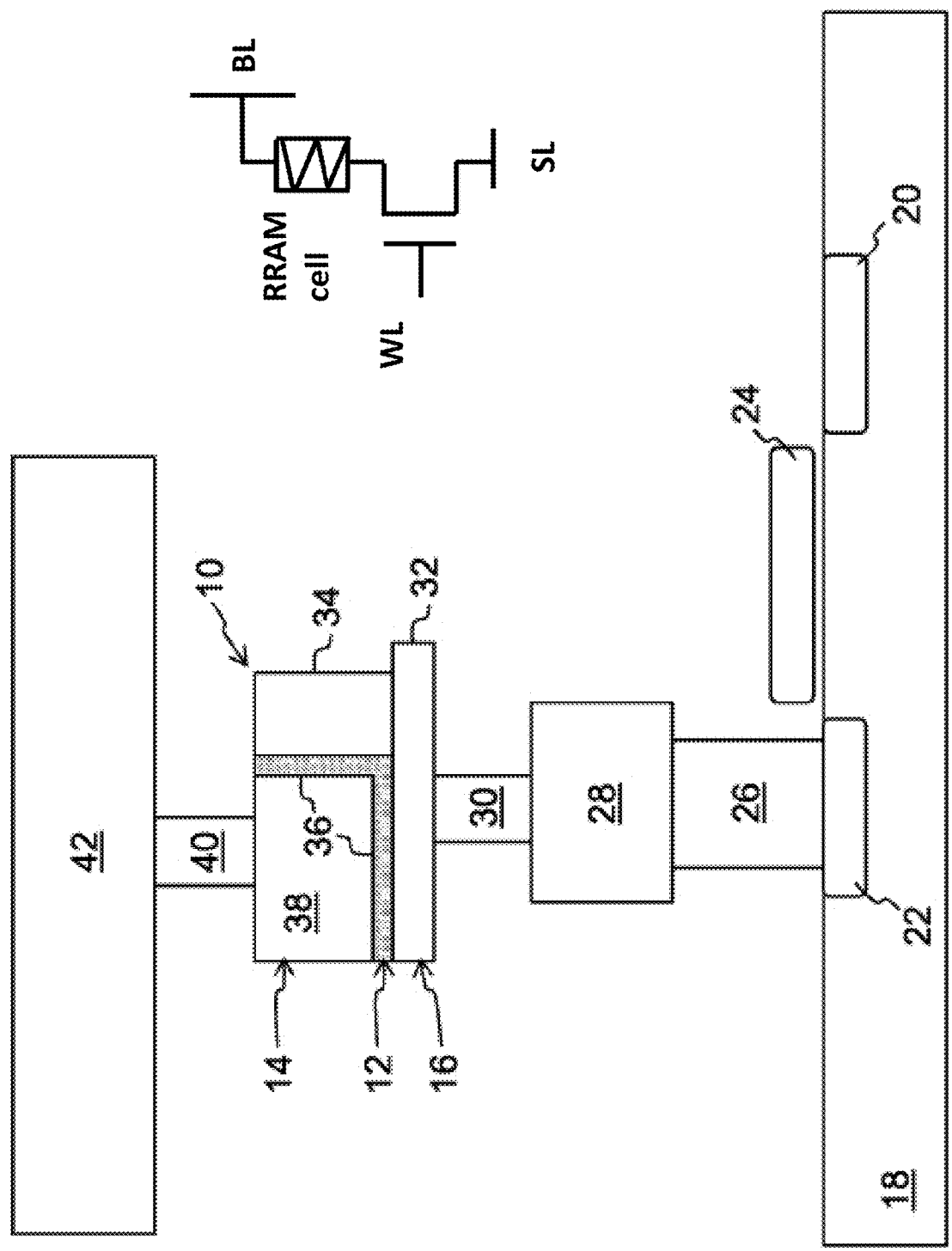
Figure 5A:
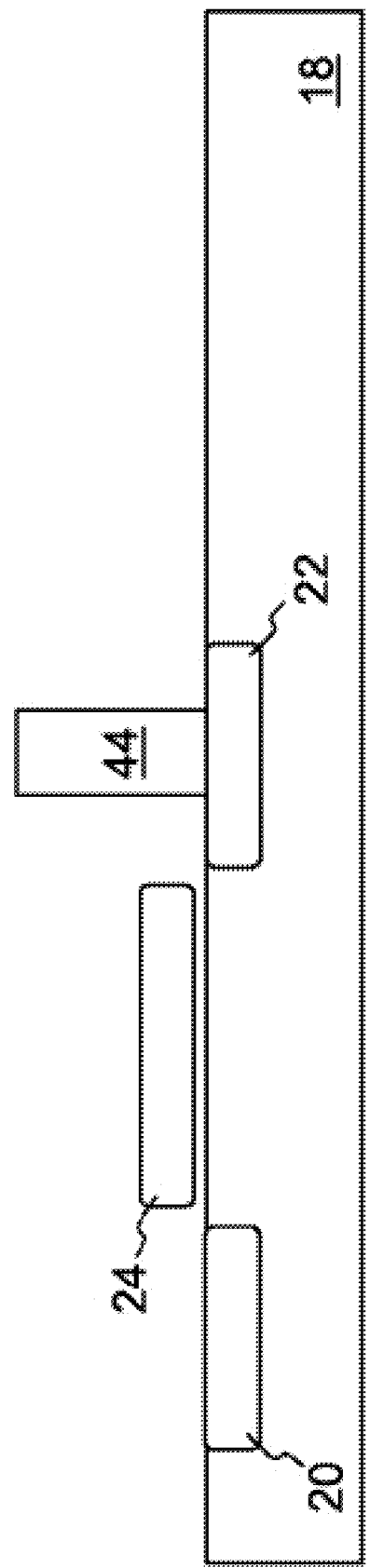
Figure 5B:
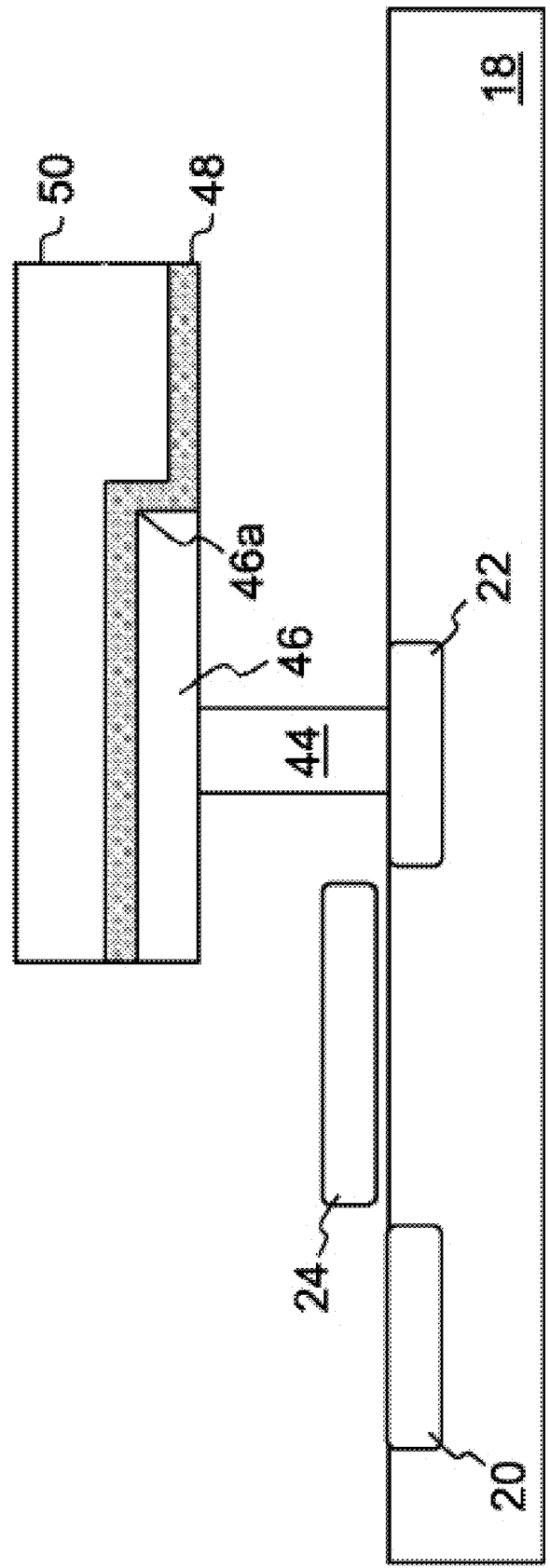
Figure 6A:
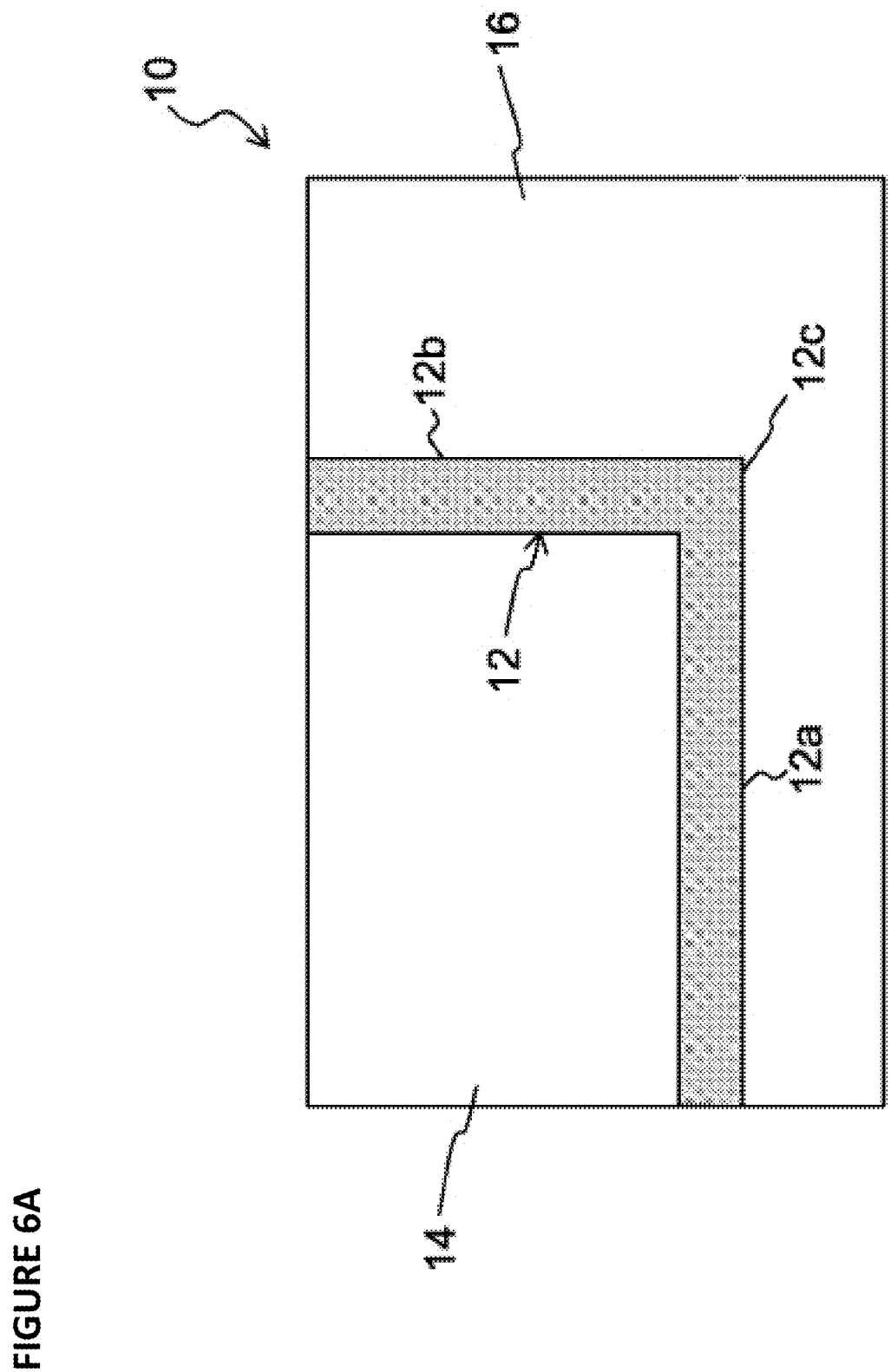
FIG. 6A is a side cross sectional view of the RRAM cell of FIG. 3 in its initial state.
Figure 6B:
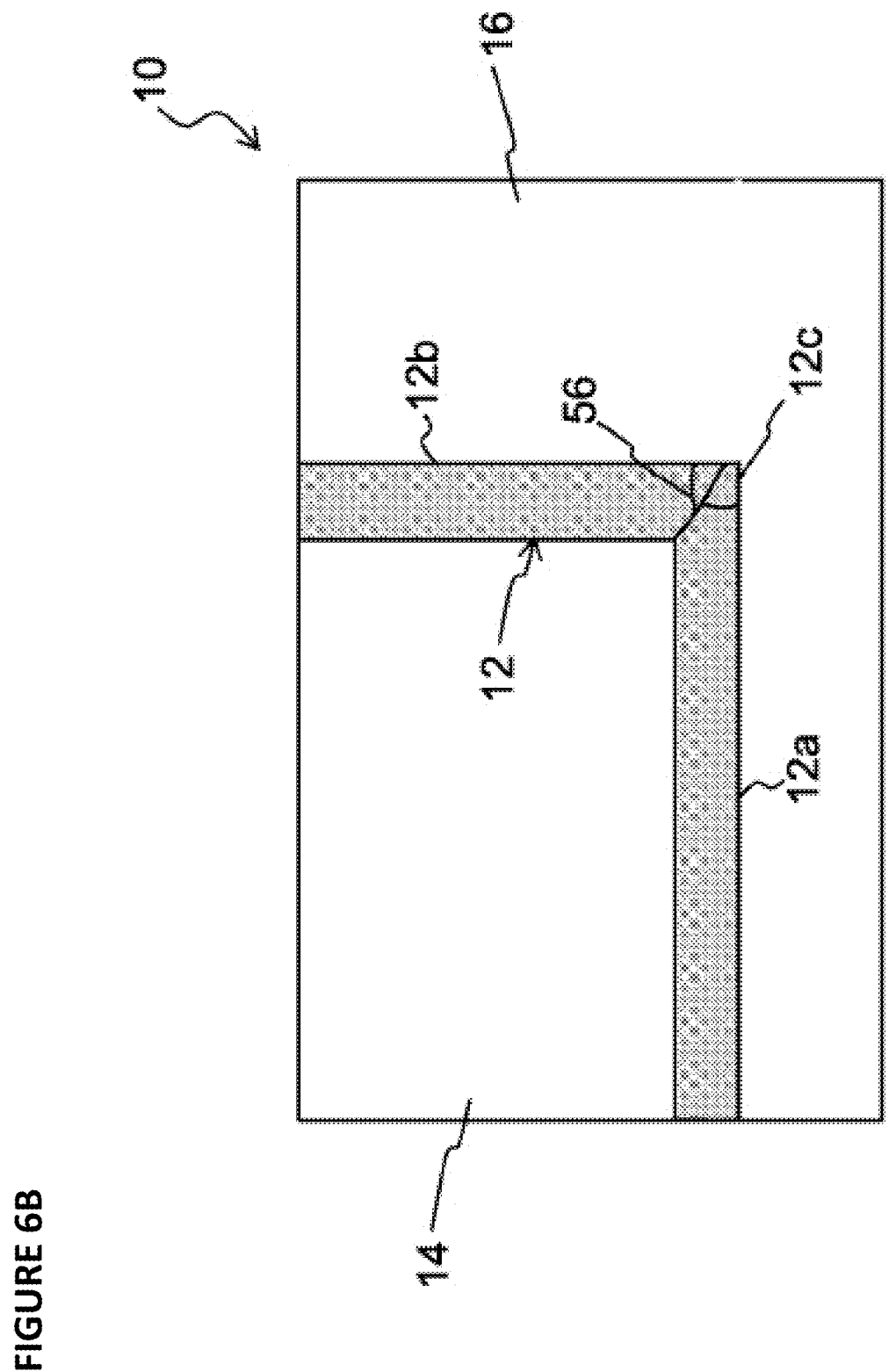
FIG. 6B is a side cross sectional view of the RRAM cell of FIG. 3 in its formed state.
Figure 6C:
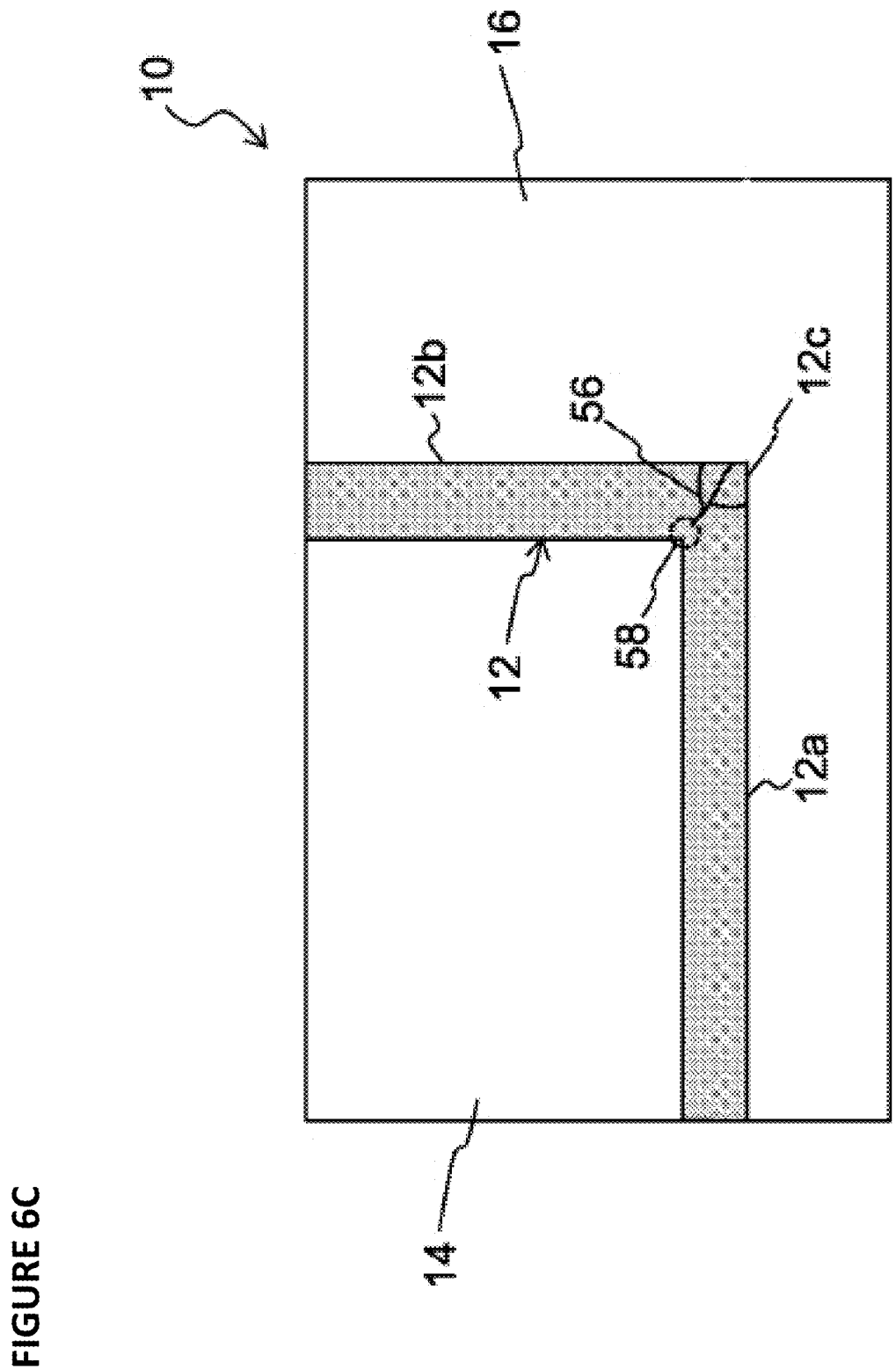
FIG. 6C is a side cross sectional view of the RRAM cell of FIG. 3 in its reset state.
Figure 6D:
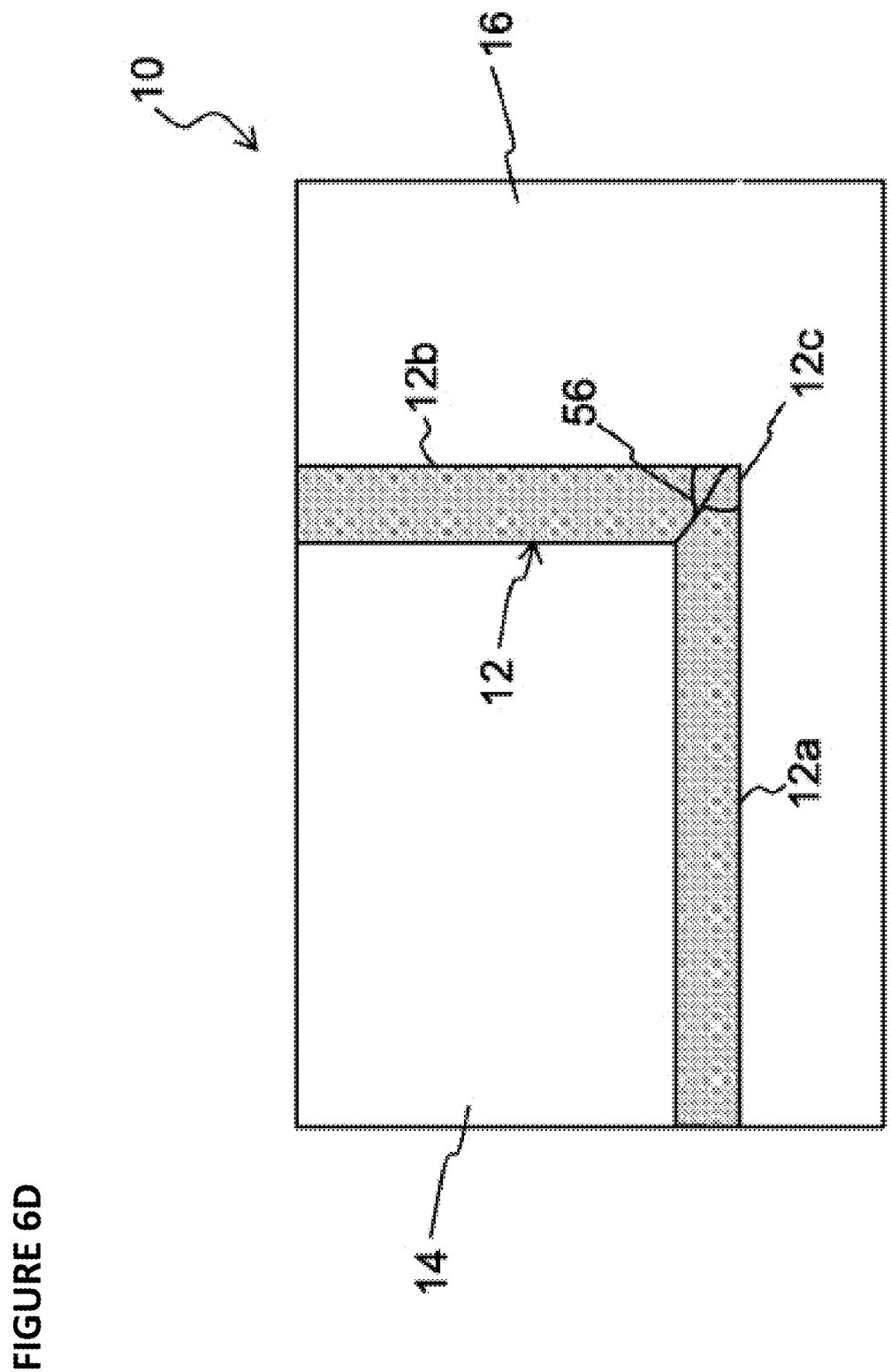
FIG. 6D is a side cross sectional view of the RRAM cell of FIG. 3 in its set state.
Figure 7B:
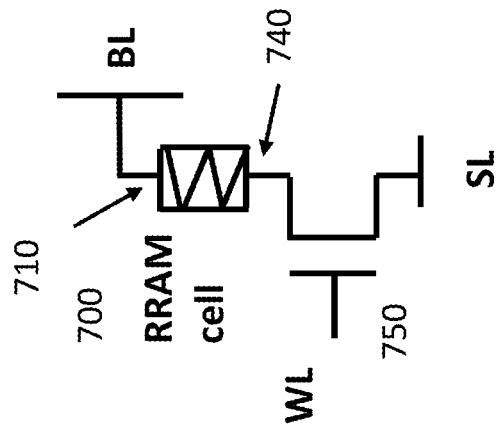
FIG. 7B depicts an RRAM cell with a select transistor.
Figure 7A:
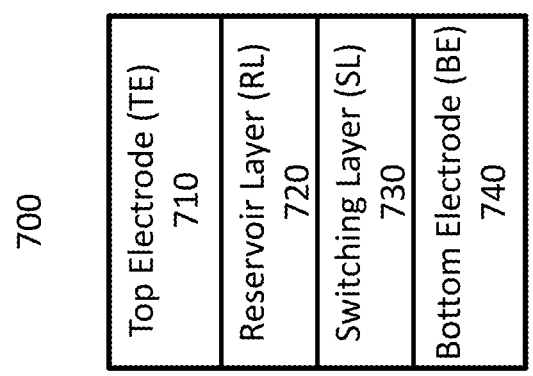
FIG. 7A depicts an RRAM cell.

FIG. 7A depicts an embodiment of RRAM cell 700. RRAM cell 700 comprises top electrode 710, bottom electrode 740, reservoir layer 720, and switching layer 730. In one embodiment, top electrode 710 and bottom electrode 740 are constructed with TiN, reservoir layer 720 is constructed with Ti, and switching layer 730 is constructed with HfOx. In the alternative, top electrode 710 and bottom electrode 740 can be constructed with Pt, W, Ta, Al, Ru, or Ir. Switching layer 730 can be constructed with TaOx, AlOx, or Wox, etc. Switching layer 730 also be constructed from any single layer oxide, or with an oxygen scavenger metal such as Ti, or it could be constructed with multiple layers combing different oxides and metals such as HfO2/Al2O3, HfO2/Hf/TaOx, or HfO2/Ti/TiOx.

As shown in FIG. 7B, RRAM cell 700 is connected to selector 750 (for cell selection purpose), creating an RRAM memory cell (bit-cell). In this drawing, selector 750 is a transistor with its drain connecting to the bottom electrode 740 of RRAM cell 700, its gate connecting to a wordline of an array in which RRAM cell 700 is located, and its source connecting to a sourceline of the array. Top electrode 710 of RRAM cell 700 connects to a bitline of an array. Alternative embodiments for the selector can include a bi-directional diode or a switch.

As discussed earlier, the set operation in a RRAM cell can be performed to write a "1" to the cell, and a reset operation can be performed to write a "0" to the cell.

With reference to Table 1, the following exemplary voltages and currents can be applied to memory cell 700 to perform form, set, and reset operations:

TABLE 1

| | Top Electrode 710 | Bottom Electrode 740 |
|---|---|---|
| Form | Vform | Iformcomp |
| Set | Vset | Isetcomp |
| Reset | Iresetcomp | Vreset |

Vform~1-4 V
Iformcomp~100 pA-20 uA
Vset~0.3-1 V
Isetcomp~10-50 uA
Vreset~0.5-1.5 V
Iresetcomp~20-150 uA When an array of RRAM is created, bit lines, word lines, and source lines can be utilized to select cells for a form, set, or reset operation and/or to unselect cells for a form, set, or reset operation. Wordlines, sourcelines and bitlines are used for selecting RRAM memory cells for form/set/reset/read operation. A selected wordline is used to couple the bottom electrode of a RRAM cell to ground in form/read/set and to a reset voltage in reset. A selected bitline is used to provide a form/set bias in form/set/read operation and to provide a ground level in reset. A selected sourceline is used to provide ground level in form/set/read operation and a reset bias in reset operation. For unselected terminals (SL/BL/WL), appropriate inhibit biases are used to prevent disturb (unwanted cell behavior). Examples of the voltages and currents that can be applied to these lines are shown in Tables 2 and 3:

TABLE 2

| Array Operation 1 | | | | | | |
|---|---|---|---|---|---|---|
| | BL | | WL | | SL | |
| | selected cell | unselected cell | selected cell | unselected cell | selected cell | unselected cell |
| READ 1 | Vblrd | 0 v | Vwlrd | 0 v | 0 v | 0 v |
| READ 2 | 0 v | 0 v | Vwlrd | 0 v | Vslrd | 0 v |

TABLE 2-continued

Array Operation 1

| | BL | | WL | | SL | |
|---|---|---|---|---|---|---|
| | selected cell | unselected cell | selected cell | unselected cell | selected cell | unselected cell |
| FORM-V | Vblform, I compliance | float/Vblformbias-unsel | Vwlform | Vwlformbias-unsel | 0 v | float/Vslformbias-unsel |
| FORM-I | Iblform, V compliance | float/Vblformbias-unsel | Vwlform | Vwlformbias-unsel | 0 v | float/Vslformbias-unsel |
| SET | Vblset, Iblset | 0 v | Vwlset | 0 v | 0 v | 0 v |
| RESET | 0 v/Vblreset, Iblreset | Vblresetbias-unsel/float | Vwlreset | 0 v | Vslreset, Islreset | 0 v |

TABLE 3

Array Operation 2

| | SL | | WL | | BL | |
|---|---|---|---|---|---|---|
| | selected cell | unselected cell | selected cell | unselected cell | selected cell | unselected cell |
| READ 1 | Vslrd | 0 v | Vwlrd | 0 v | 0 v | 0 v |
| READ 2 | 0 v | 0 v | Vwlrd | 0 v | Vblrd | 0 v |
| FORM-V | Vslform, I compliance | float/Vslformbias-unsel | Vwlform | Vwlformbias-unsel | 0 v | float/Vblformbias-unsel |
| FORM-I | Islform, V compliance | float/Vslformbias-unsel | Vwlform | Vwlformbias-unsel | 0 v | float/Vblformbias-unsel |
| SET | Vslset, Islset | 0 v | Vwlset | 0 v | 0 v | 0 v |
| RESET | 0 v/Vslreset, Islreset | Vslresetbias-unsel/float | Vwlreset | 0 v | Vblreset. Iblreset | 0 v |

In Array Operation 1 and Array Operation 2 of Tables 2 and 3, READ 2 is a reversed read of READ1, meaning the BL and SL terminals are interchanged during a read operation. In Array Operation 1, a high voltage is applied to the bitline for form and set operation and to the sourceline for reset operation. In Array Operation 2, a high voltage is applied to the source line for form and set operations and to the bit line for a reset operation. In Tables 1 and 2, "FORM-V" means forming with a voltage bias (fixed, ramp, or increment/decrement step) with a current compliance. "FORM-I" means forming with a current bias (fixed, ramp, or increment/decrement step) with a voltage compliance. In FORM-V or FORM-I, unselected wordlines are biased at a bias level to increase the breakdown of the un-selected select transistors.

Figure 8:
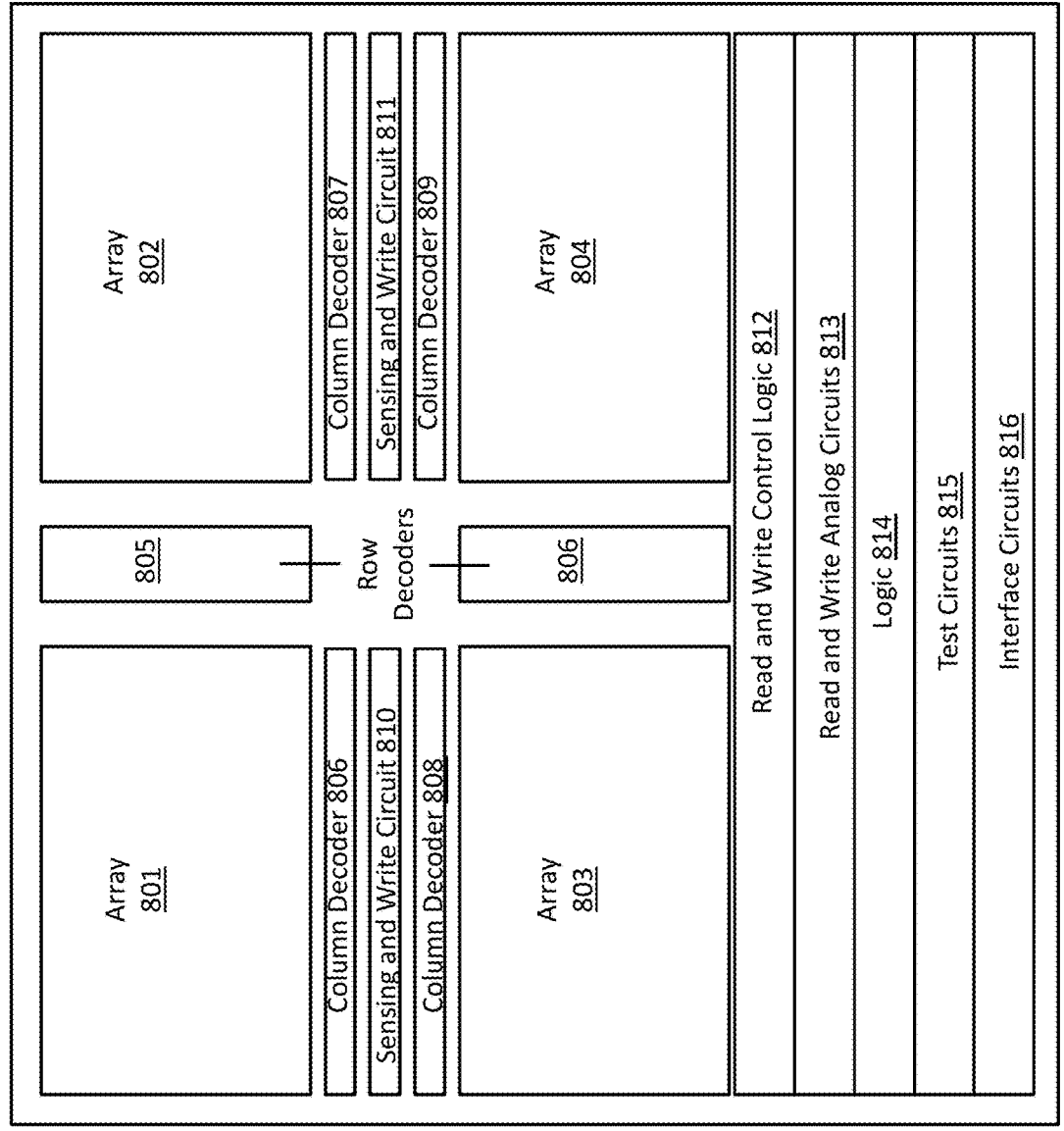
FIG. 8 depicts an exemplary die comprising arrays of RRAM cells and circuitry for performing read and write operations.

FIG. 8 depicts an embodiment of an RRAM system that can utilize the embodiments of the invention described herein. Die 800 comprises: memory arrays 801, 802, 803, and 804 for storing data, each memory array optionally utilizing one of the types of memory cells described above with reference to FIGS. 1-7, or other known types of RRAM cells; row decoder circuits 805 and 806 used to access the row in memory arrays 801 and 802 or 803 and 804, respectively, to be read from or written to (i.e., selected for a form, a set or reset operation); column decoder circuits 806, 807, 808, and 809 used to access the column in memory arrays 801, 802, 803, and 804, respectively, to be read from or written to; sensing and write circuit 810 used to read data from or write data to memory arrays 801 and 803 and sensing and write circuit 811 used to read data from or write data to memory arrays 802 and 804; read and write control logic 812; read and write analog circuits 813; logic 814 for providing various control functions, such as redundancy; test circuits 815 for performing testing including built-in self-testing; and interface pins 816 to connect to other nodes within the chip containing die 800.

Different array architectures that can be used for memory arrays 801, 802, 803, and 804 in FIG. 8 will now be described with reference to FIGS. 9-18. The RRAM memory cells in those arrays can follow any of the cell architecture of FIGS. 1-7 or other known RRAM cell architectures.

Figure 9:
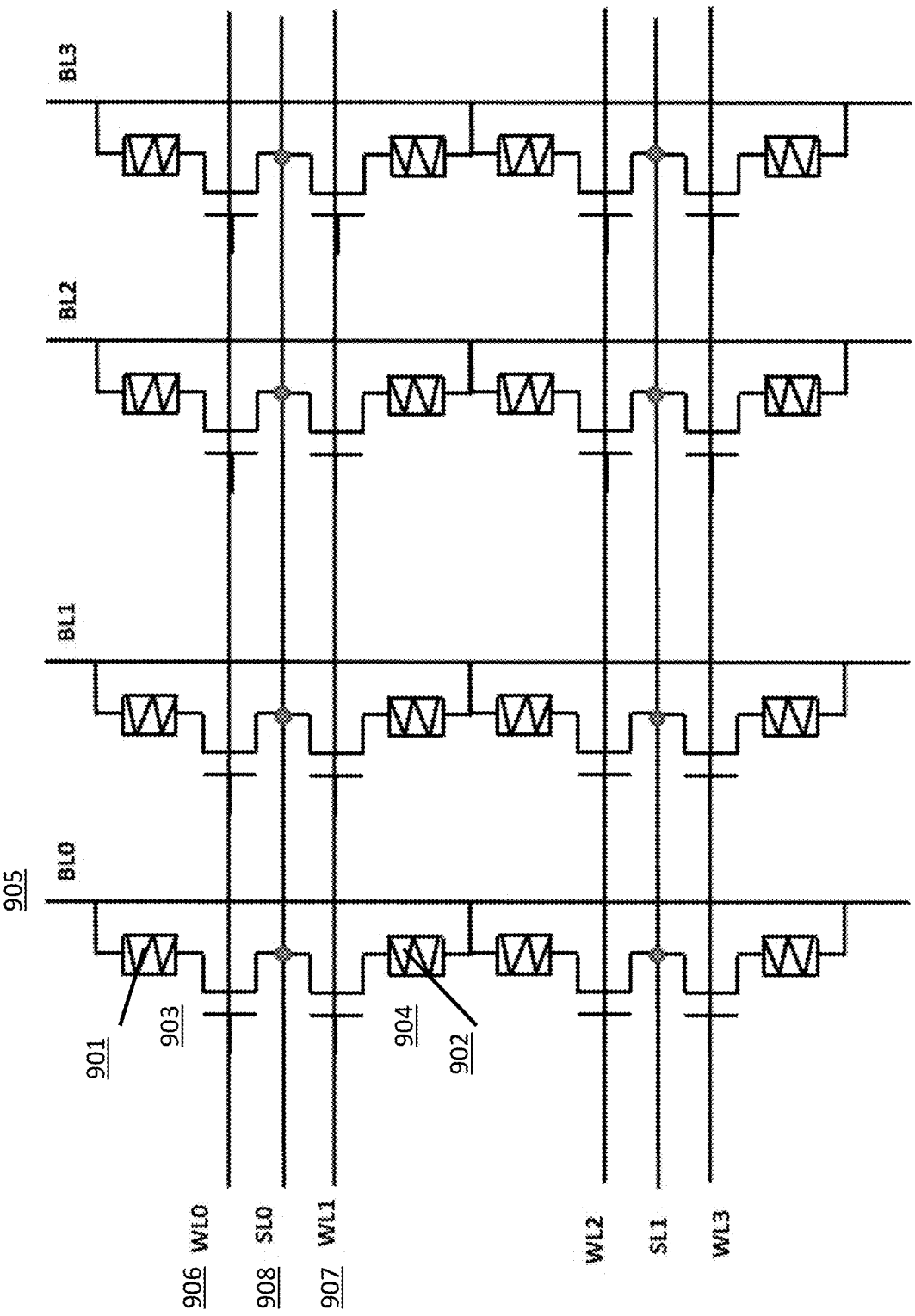
FIG. 9 depicts a prior art architecture of an array of RRAM cells.

FIG. 9 depicts a prior art architecture of RRAM memory array 900. RRAM memory cells are arranged into rows and columns within array 900. A memory cell is selected by activating a word line (which activates a row of cells within array 900) and a bit line (which activated a column of cells within array 900). In this architecture, adjacent rows of cells share a source line. For example, exemplary cells 901 and 902 both are coupled to source line 908 (labeled SL0). Cell 901 is coupled to word line 906 (WL0) and bit line 905 (BL0), and cell 902 is coupled to word line 907 (WL1) and bit line 905 (BL1). Here, cell 901 is coupled to select (control) transistor 903, and cell 902 is coupled to select transistor 904. Word line 906 controls the gate of select transistor 903, and word line 907 controls the gate of transistor 904. This configuration can be referred to as a "1T1R" configuration, as there is one select transistor for each RRAM cell.

Figure 10:
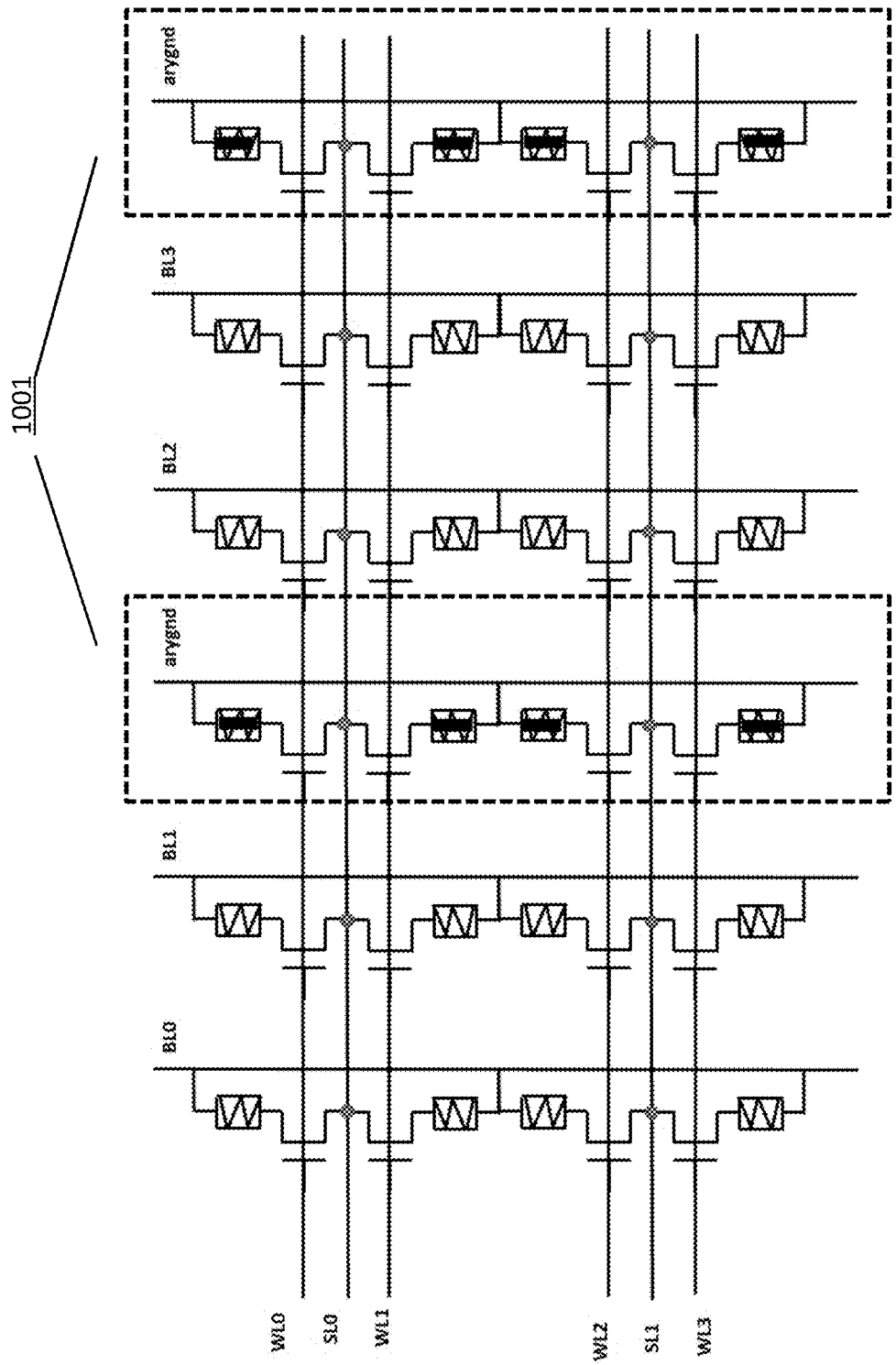
FIG. 10 depicts an embodiment of an array of RRAM cells.

FIG. 10 depicts an embodiment of an improved array architecture. RRAM array 1000 comprises many of the same elements as RRAM array 900, and those elements will not be described again here. Unlike array 900, array 1000 comprises a plurality of embedded ground elements 1001. Here, each embedded ground element 1001 comprises a (dummy) column of RRAM cells and select transistors that are not actually used as part of user array memory data. The RRAM cells are optionally shorted by a metal or via layer.

Alternatively the RRAM cells can be removed and drains of select transistor connecting to array ground columns directly. Rather, those columns can be coupled together to serve as array ground, meaning supplying bias for the source line during read or write operation. This configuration can be referred to as a "1T1R with embedded array ground" configuration, as there is 1 select transistor for each RRAM cell and also embedded ground elements in the array.

Figure 11:
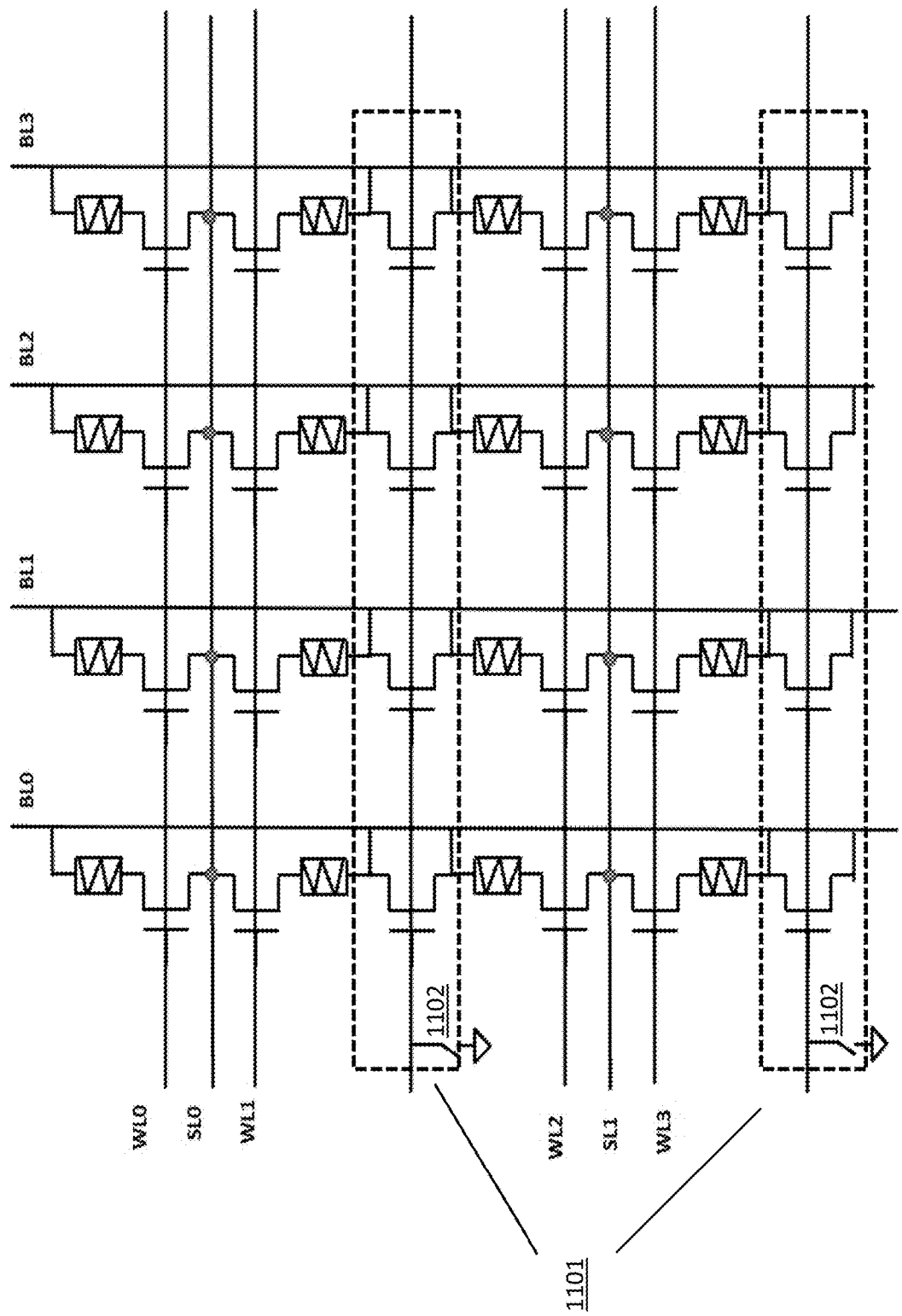
FIG. 11 depicts another embodiment of an array of RRAM cells.

FIG. 11 depicts another embodiment of an improved array architecture. RRAM array 1100 comprises many of the same elements as RRAM array 900, and those elements will not be described again here. Unlike array 900, array 1100 comprises a row 1101 of isolation transistors between each pair of adjacent rows of cells. Each row 1101 of isolation transistors does not perform a function in the actual operation of cells, but instead, simply provides electrical isolation between pairs of rows of cells. Optionally, each row 1101 is coupled to switch 1102 which selectively pulls row 1101 to ground. This configuration can be referred to as a "1.5T1R" configuration, as there are 1.5 control transistors for each RRAM cell.

Figure 12:
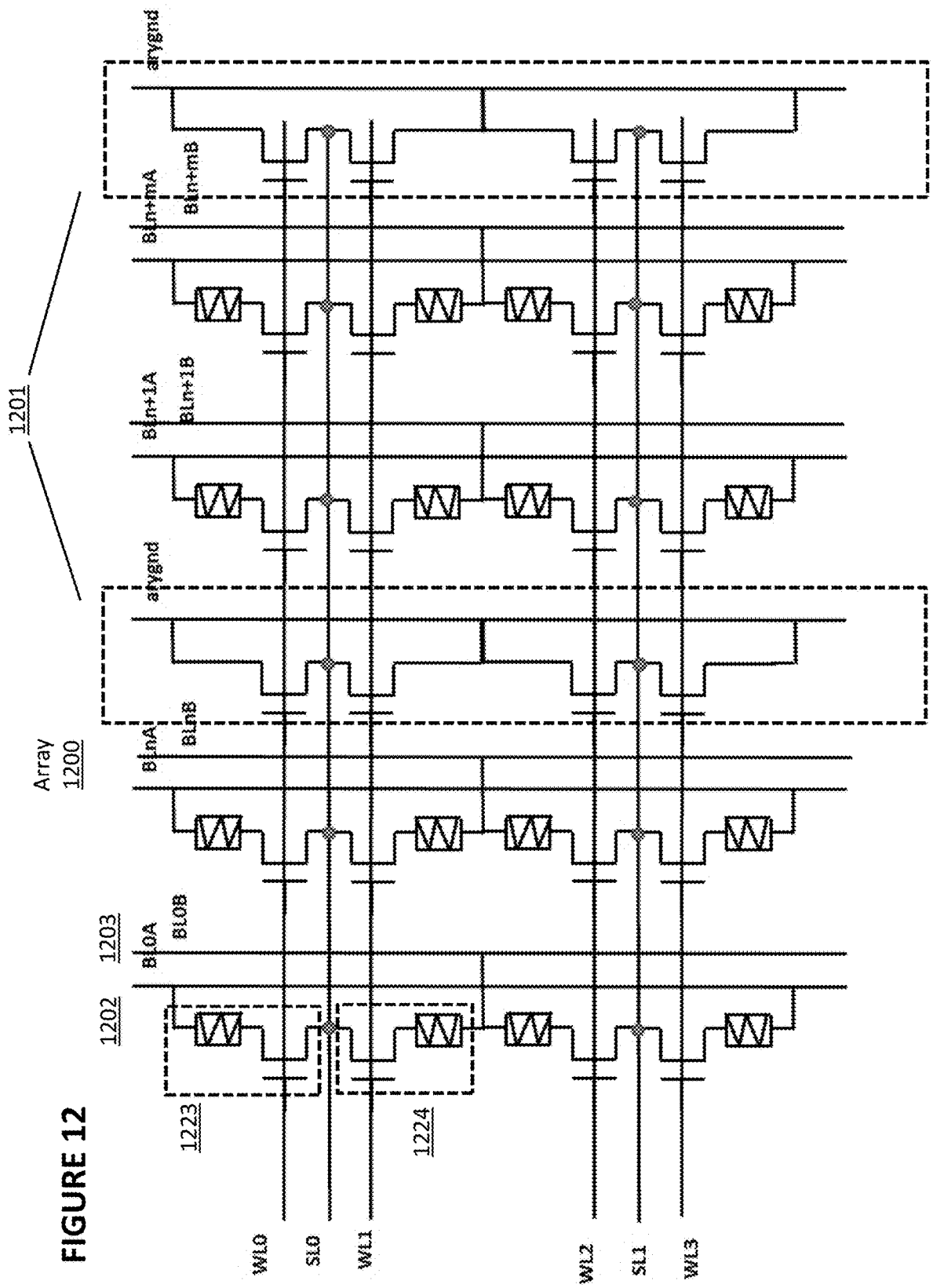
FIG. 12 depicts another embodiment of an array of RRAM cells.

FIG. 12 depicts another embodiment of an improved array architecture. RRAM array 1200 comprises many of the same elements as RRAM array 900, and those elements will not be described again here. Unlike array 900, array 1200 comprises a plurality of embedded ground elements 1201. Here, each embedded ground element 1201 comprises a column of RRAM cells and control transistors that are not actually used for the writing or reading of user data. Rather, those columns can be coupled together to serve as ground. In addition, each column of cells is coupled to a pair of bit lines (which are coupled together) instead of just one bit line. For example, in the left-most column shown in FIG. 12, the column of cells is coupled to bit lines 1202 (BL0A) and 1203 (BL0B), where bit lines 1202 and 1203 are coupled together. This configuration can be referred to as a "1T1R-BL pair with embedded array ground" configuration, as each column is connected to a bit line pair, and the array also contains embedded ground elements. This configuration serves as for example as a differential RRAM cells (cells 1223/1224) to implement one logical memory bit cell.

Figure 13:
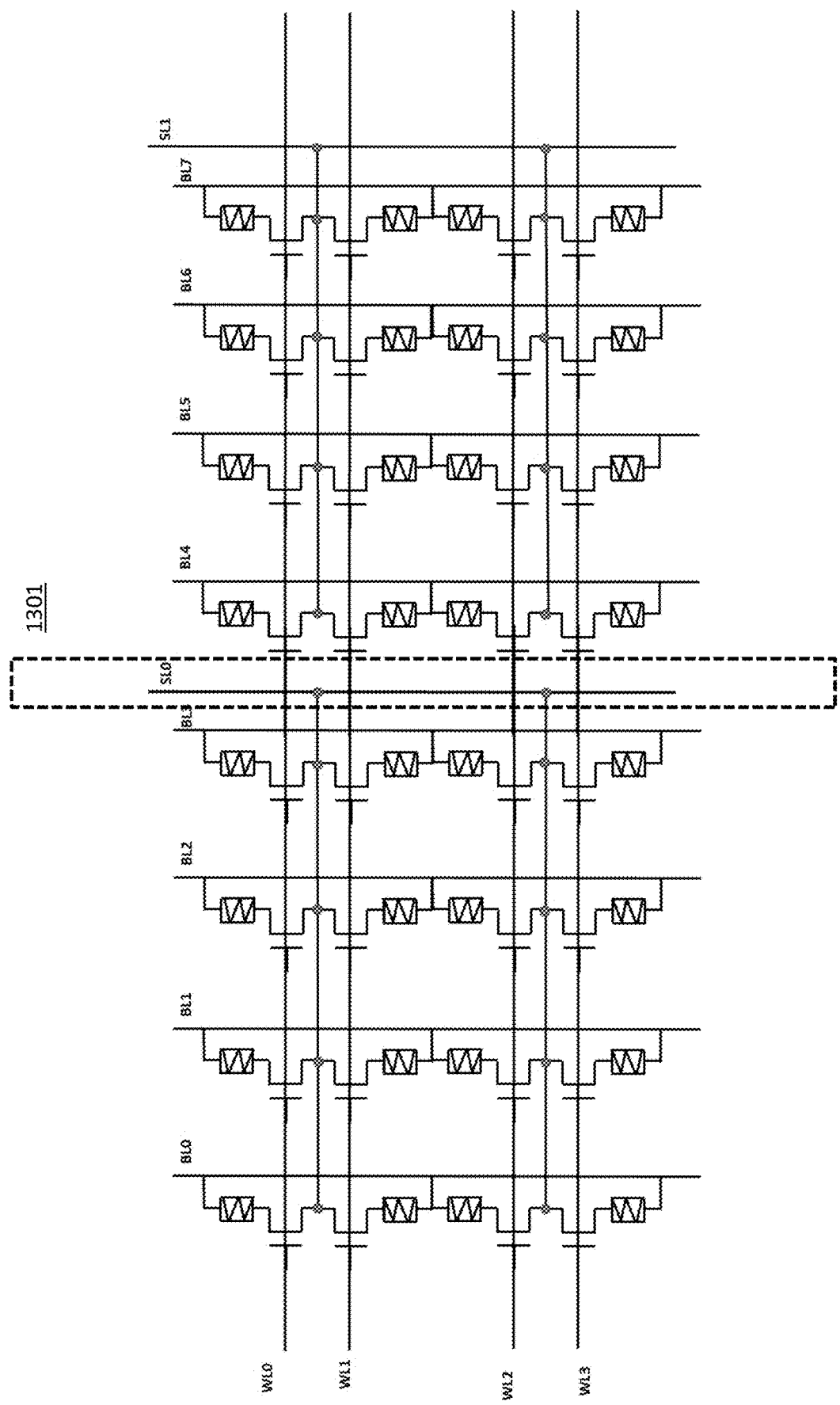
FIG. 13 depicts another embodiment of an array of RRAM cells.

FIG. 13 depicts another embodiment of an improved array architecture. RRAM array 1300 comprises many of the same elements as RRAM array 900, and those elements will not be described again here. Unlike array 900, array 1300 utilizes source lines that are coupled to two pairs of adjacent rows instead of just one pair of adjacent rows. The source lines are run vertically (orthogonal) to the wordline. Thus, exemplary source line 1301 (SL0) is coupled to 4 cell pairs in the first two rows as well as 4 cell pairs in the second two rows, or 8 cells total. This configuration can be referred to as a "Shared orthogonal SL 1T1R" configuration, as it utilizes shared orthogonal source lines.

Figure 14:
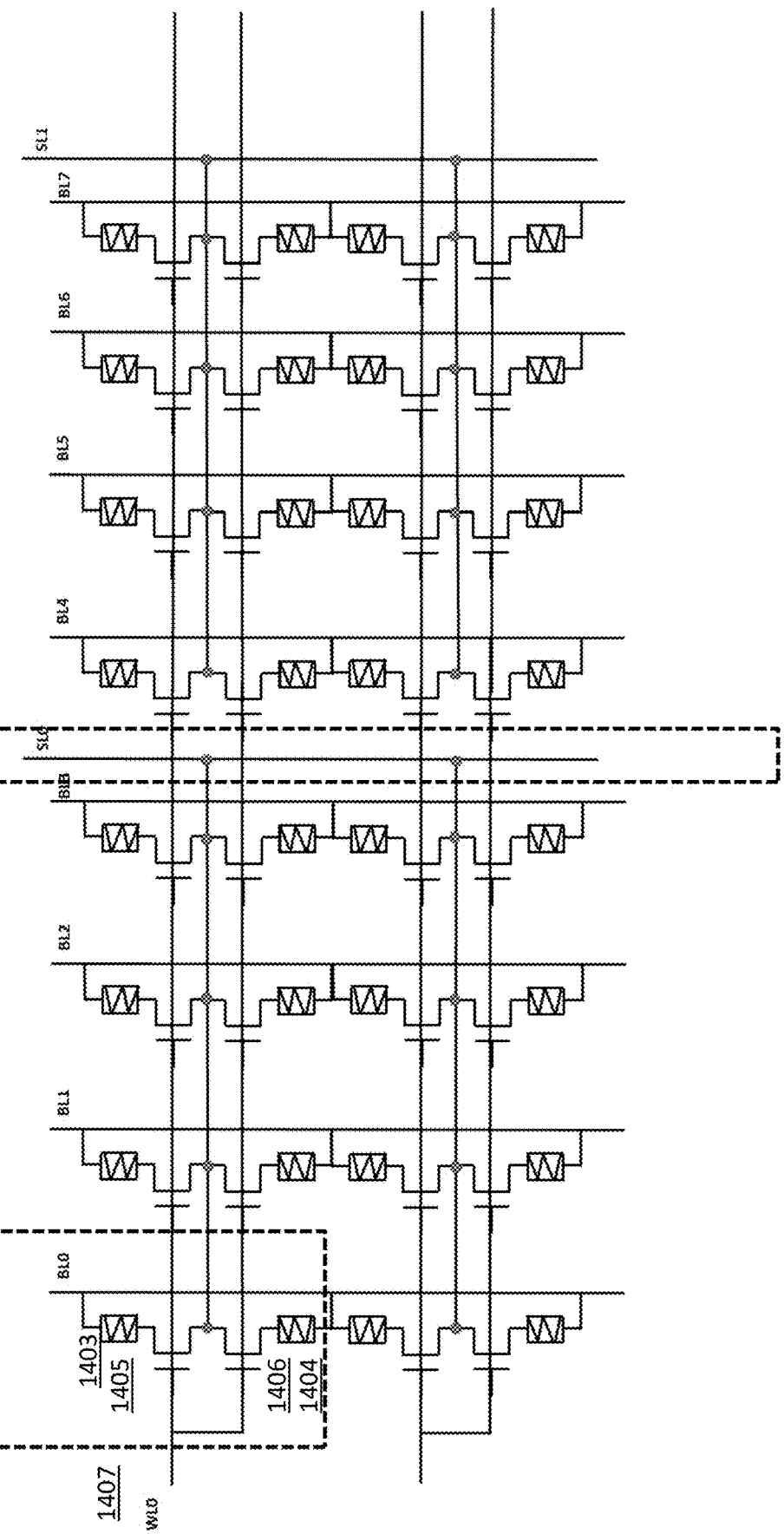
FIG. 14 depicts another embodiment of an array of RRAM cells.

FIG. 14 depicts another embodiment of an improved array architecture. RRAM array 1400 comprises many of the same elements as RRAM array 900, and those elements will not be described again here. Unlike array 900, array 1400 utilizes orthogonal source lines that are coupled to two pairs of adjacent rows instead of just one pair of adjacent rows. Thus, exemplary source line 1401 (SL0) is coupled to 4 cell pairs in the first two rows as well as 4 cell pairs in the second two rows, or 8 cells total. In addition, each pair of cells in adjacent rows is used to store 1 bit of data instead of 2 bits, and those cells share a common word line. For example, cell pair 1402 is depicted. Cell pair 1402 comprises cells 1403 and 1404 and select transistors 1405 and 1406. Select transistors 1405 and 1406 each are connected to word line 1407 (WL0) through their gates. This configuration can be referred to as a "2T2R" configuration, as it utilizes two transistors for each two RRAM cells, which together store one bit of data.

Figure 15:
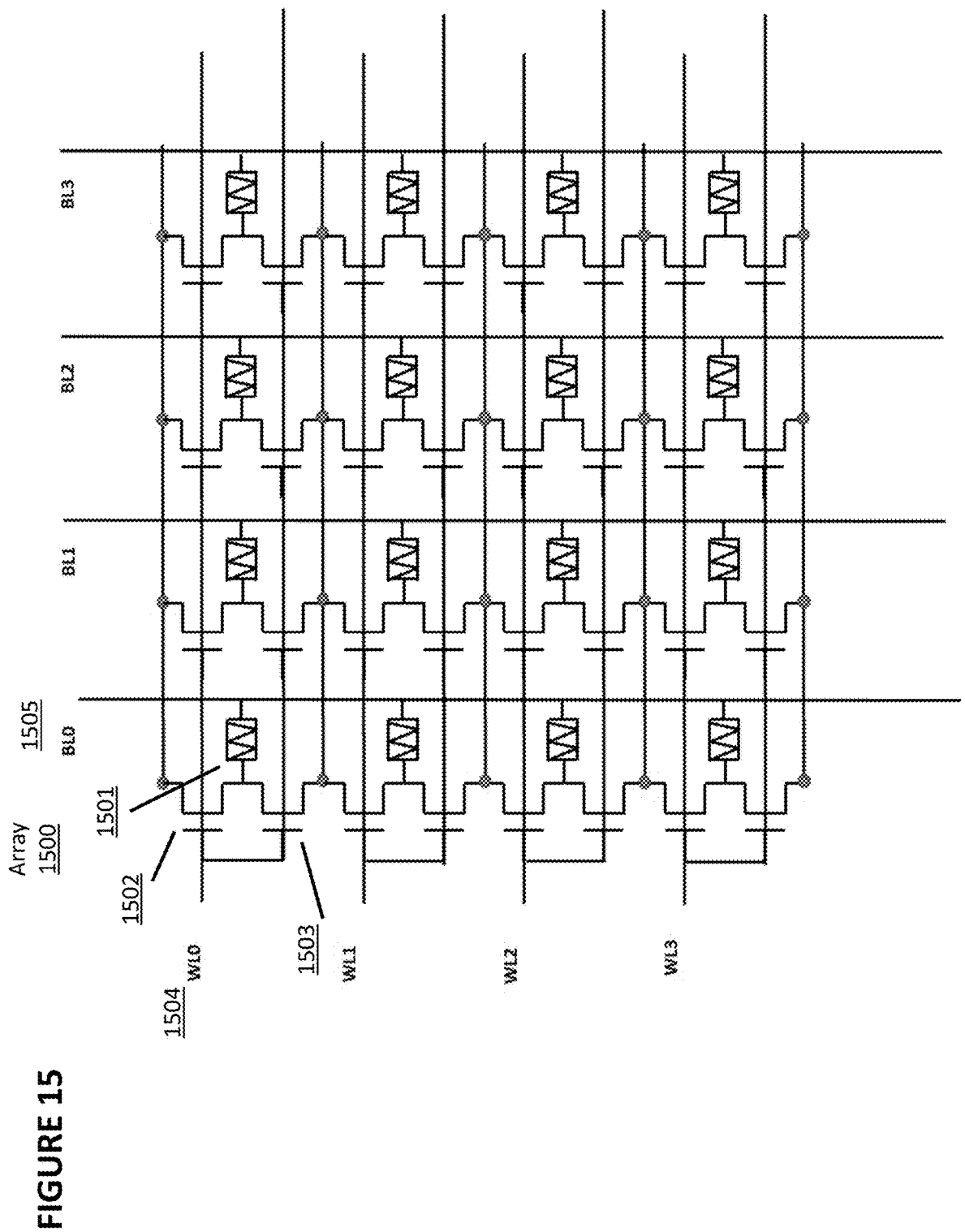
FIG. 15 depicts another embodiment of an array of RRAM cells.

FIG. 15 depicts another embodiment of an improved array architecture. RRAM array 1500 comprises many of the same elements as RRAM array 900, and those elements will not be described again here. Unlike array 900, array 1500 does not utilize source lines at all, and each memory cell is coupled to two control transistors coupled to the same word line. For example, exemplary cell 1501 is coupled to control transistors 1502 and 1503. The gates of control transistors 1502 and 1503 are coupled to word line 1504 (WL0). This configuration can be referred to as a "2T1R" configuration, as it utilizes two transistors for each RRAM cell.

Figure 16:
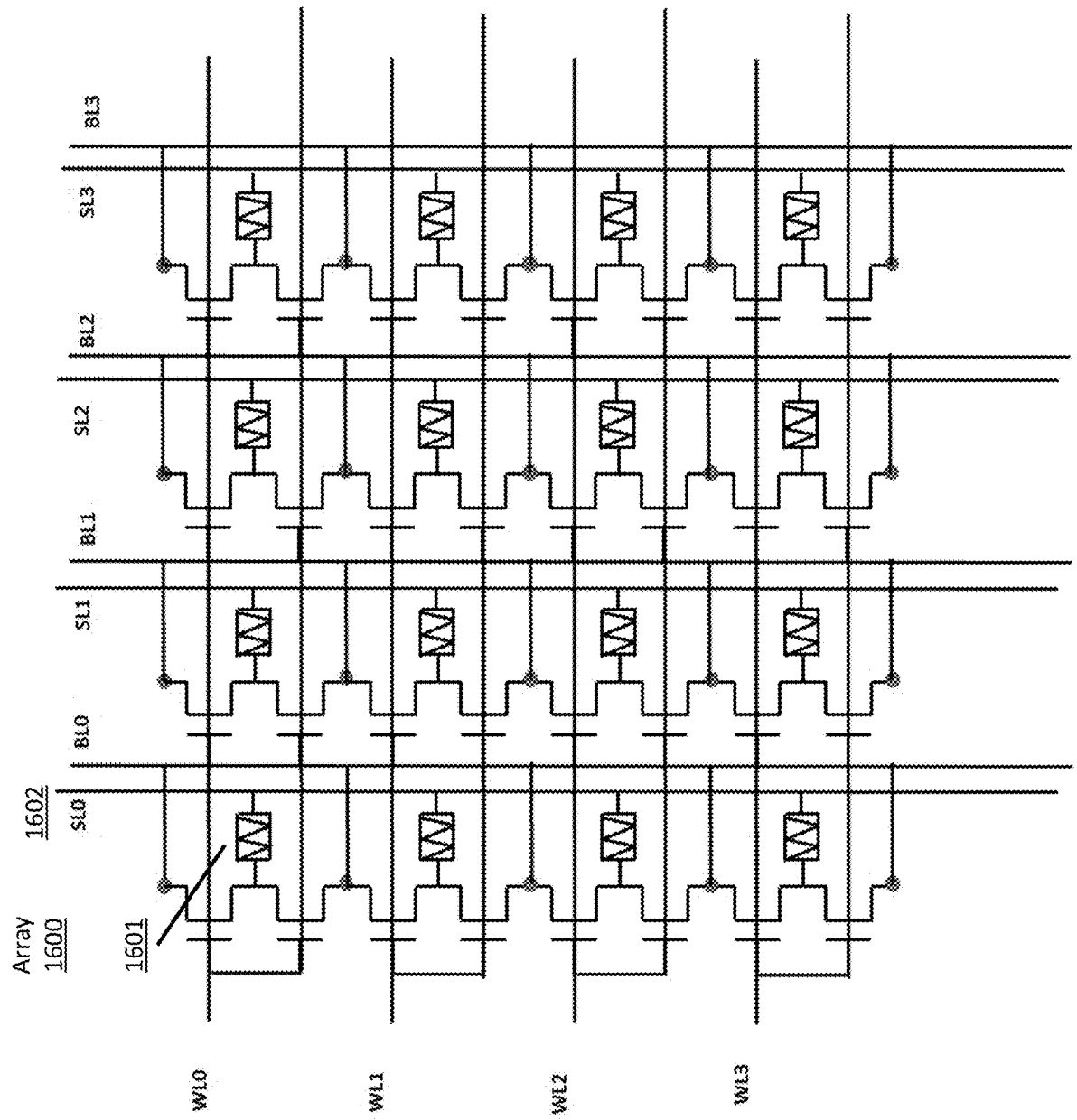
FIG. 16 depicts another embodiment of an array of RRAM cells.

FIG. 16 depicts another embodiment of an improved array architecture. RRAM array 1600 is identical to RRAM array 1500 in FIG. 15, except that RRAM array 1600 utilizes orthogonal source lines. The direction of the orthogonal sourcelines is same as that of the bitlines. Specifically, each column of RRAM cells shares a source line. For example, exemplary cell 1601 and all other cells in the same column as cell 1601 are coupled to source line 1602 (SL0). This configuration can be referred to as a "2T1R-symmetrical" configuration, as it utilizes two transistors for each RRAM cell and contains symmetrical paths between a source line and corresponding bit line.

Figure 17:
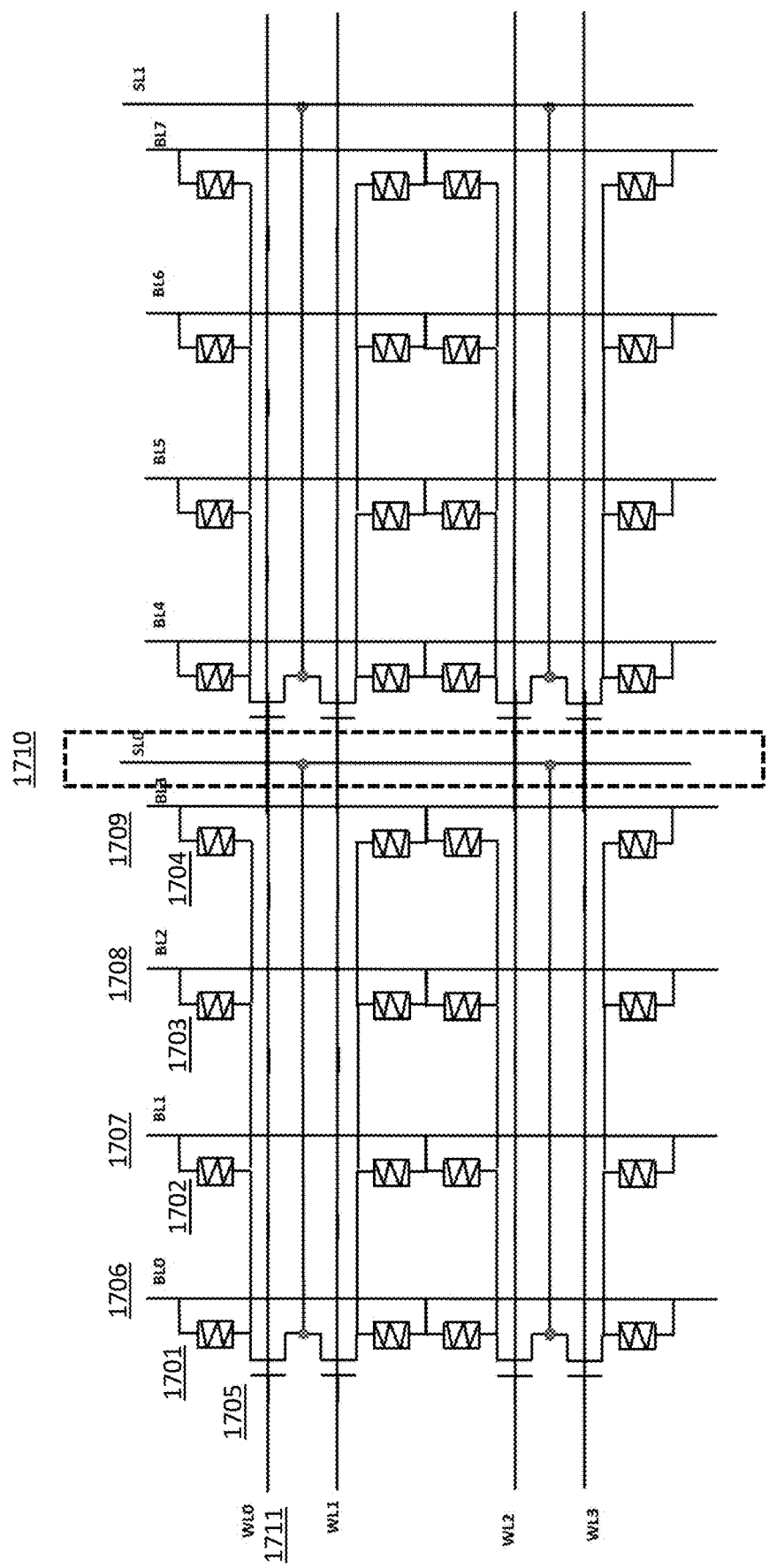
FIG. 17 depicts another embodiment of an array of RRAM cells.

FIG. 17 depicts another embodiment of an improved array architecture. RRAM array 1700 comprises many of the same elements as RRAM array 900, and those elements will not be described again here. Unlike array 900, array 1700 utilizes source lines that are coupled to two pairs of adjacent rows instead of just one pair of adjacent rows. Additionally the sourceline is orthogonal to the wordline. Thus, exemplary source line 1710 (SL0) is coupled to 4 cell pairs in the first two rows as well as 4 cell pairs in the second two rows, or 8 cells total. In addition, four RRAM cells in a row share the same control transistor. For example, exemplary RRAM cells 1701, 1702, 1703 and 1704 each is coupled to control transistor 1705, whose gate is coupled to word line 1711 (WL0). One terminal of control transistor is coupled to RRAM cells 1701, 1702, 1703, and 1704, and the other terminal is coupled to source line 1710 (SL0). RRAM cells 1701 1702, 1703, and 1704 are coupled to bit lines 1706 (BL0), 1707 (BL1), 1708 (BL2), and 1709 (BL3), respectively. This configuration can be referred to as a "1T4RSLv" configuration, as it utilizes one transistor and one source line for four RRAM cells.

Figure 18:
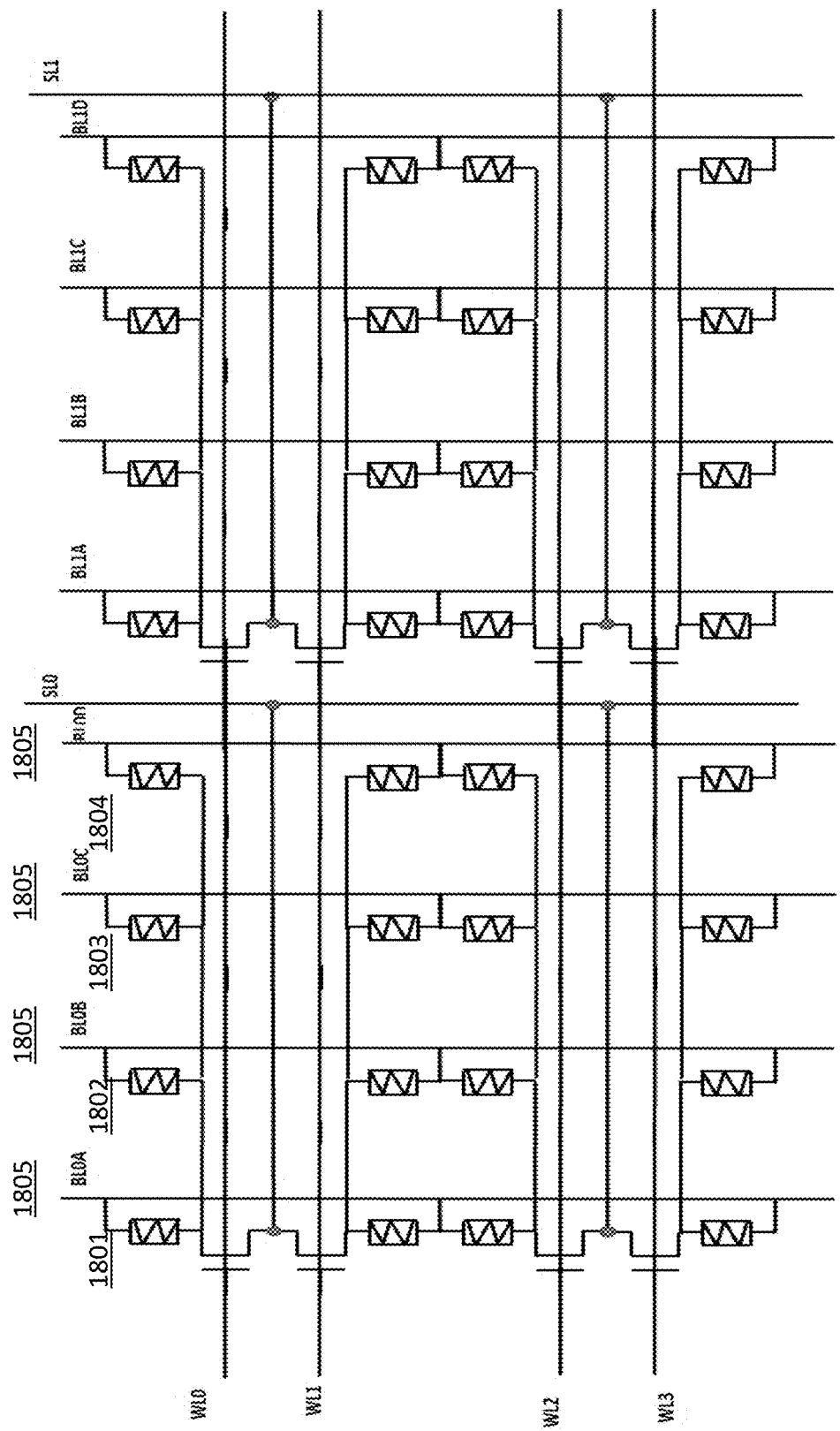
FIG. 18 depicts another embodiment of an array of RRAM cells.

FIG. 18 depicts another embodiment of an improved array architecture. RRAM array 1800 is identical to RRAM array 700 in FIG. 17, except that RRAM array 1800 uses four RRAM cells for each (logical) memory bit. For example, exemplary cells 1801, 1802, 1803, and 1804 are operated upon identically so that they store the same bit. They are coupled to the same bit line, here bit line 1805 (BL0A, BL0B, BL0C, and BL0D). This configuration can be referred to as a "1 bit=1T4RSLv," as it utilizes four cells, one control transistor, and one source line to store one bit.

Figure 19:
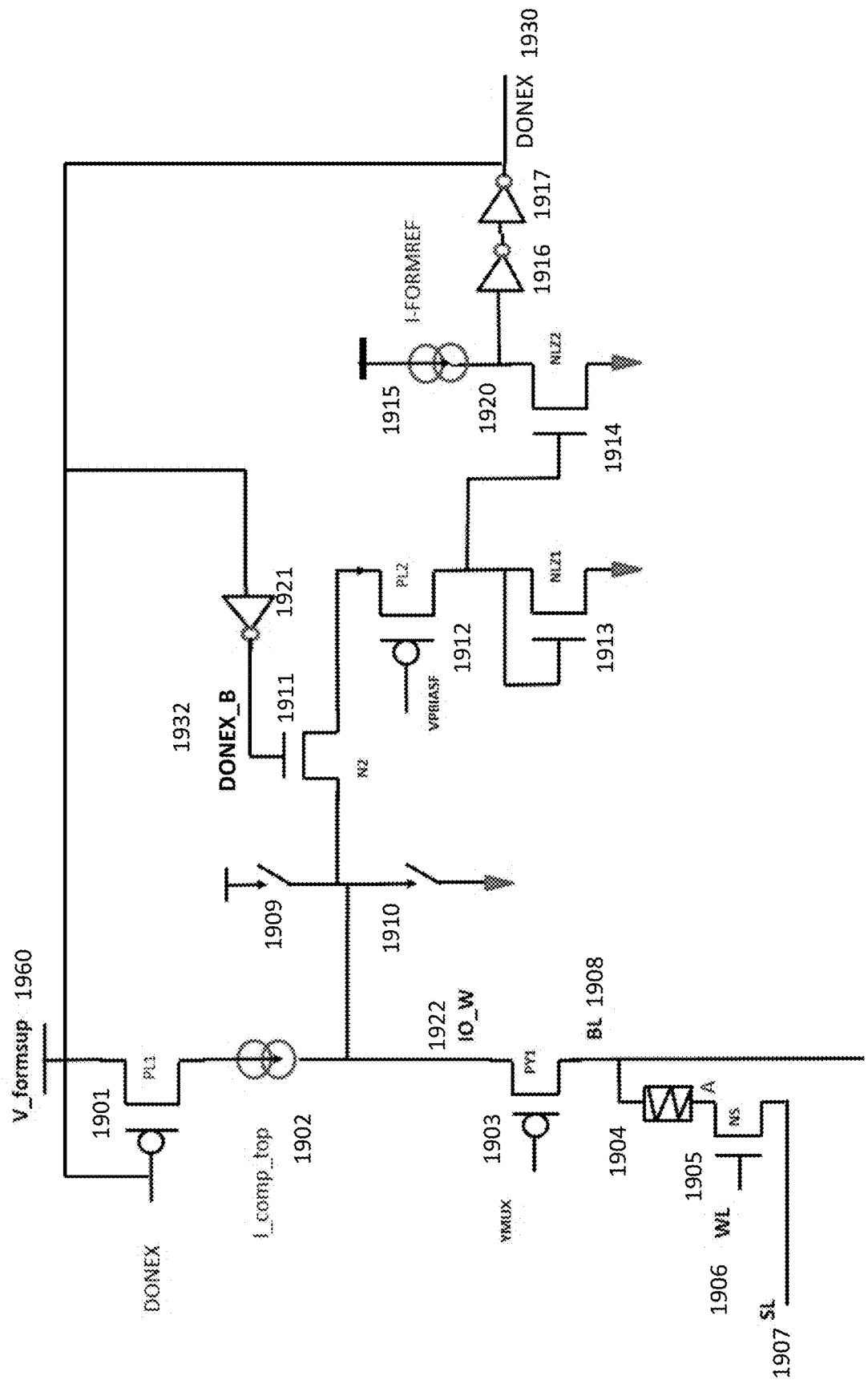
FIG. 19 depicts an embodiment of a form-while-verify circuit.

FIG. 19 depicts form-while-verify circuit 1900 using self-timed folded form current comparison, which performs a form operation on RRAM cell 1904 and automatically stops the operation once the form is complete by automatically and continuously comparing the RRAM cell current (Icell) to a target form current (Iform_target) during the form operation. Form-while-verify circuit 1900 comprises control PMOS transistor 1901, form voltage supply V_formsup 1960, top compliance current source I_comp_top 1902, ymux (y-multiplexer) PMOS transistor 1903 (which is part of the column decoder circuit for selecting the column in which RAM cell 1904 is located, alternatively the ymux can be a full CMOS multiplexer), select transistor 1905, positive bias switch 1909, ground bias switch 1910, enabling NMOS transistor 1911, cascoding (isolation) PMOS transistor 1912, NMOS transistors 1913 and 1914, reference current source I-FORMREF 1915, inverter 1921, and inverters 1916 and 1917.

Select transistor 1905 serves as an enabling (decoding) and/or as a mirror transistor to mirror a form bottom compliance current, e.g., 0.0002-100 uA, on the bottom electrode of the RRAM cell to limit the switching current in the RRAM cell 1904 during the operation. During the form operation the current flowing (hence growing rate and size of the filament) in the RRAM cell is constrained by the top compliance current 1902 and the bottom compliance in the select transistor 1905. During the form operation, the top compliance current I_comp_top 1902 and/or the bottom current compliance in the transistor 1905 can be a fixed, ramping, or stepped variable increment/decrement current bias (current waveform shaping). The PMOS transistor 1912 serves as a cascoding transistor to fold a resulting current (=I_comp_top-Icell) into the diode NMOS transistor 1913. Bias at the gate of the PMOS transistor 1912 determines a bias voltage at the node IO_W 1922.

At the beginning of the form operation, DONEX 1930 signal is '0.' This turns on PMOS transistor 1901 to pass the form voltage supply V_formsup 1960 into the IO_W 1922 and the bitline 1908. The form voltage supply V_formsup 1960 could be a fixed voltage, a ramping voltage, or a stepped variable increment/decrement voltage during the form operation (voltage waveform shaping). RRAM cell 1904 at this point has a very high resistance (e.g., in the mega ohms range), meaning it does not yet contain a filament, and PMOS transistor 1903 appears at this point to be connected to an open circuit. The voltage at IO_W 1922 therefore begins to increase quickly. The high voltage at IO_W 1922 eventually causes the filament to form in RRAM cell 1904, at which point the resistance of RRAM cell 1904 drops significantly, and current begins flowing through RRAM cell 1904. This causes the current in the NMOS transistors 1913 and 1914 to start to decrease. Meanwhile, current source 1915 causes the voltage 1920 at the input of inverter 1916 to increase once a form cell current is reached close to the target (leading to current in the transistors 1913 and 1914 to decrease towards below the current source 1915). At the point that a form cell current target is reached, that voltage flips from a '0' state to a '1' state, causing the output of inverter 1917 also to change from '0' to '1,' signifying that the form operation is complete. At this point, a filament effectively shorts the bottom to the top electrode of the RRAM cell. That change in state turns off PMOS transistor 1901, which in turns stops the form voltage from being applied to RRAM cell 1904. The resistivity of formed cell is in the orders of 5-100× reduction versus the initial virgin unformed cell.

A numerical example is as follows. The current source I_comp_top 1902 is set to 30 uA. The initial Icell of the RRAM cell is assumed to be 0.1 uA. The reference current I-FORMREF 1915 is set to 10 uA. The form target current Iform_target=I_comp_top-I-FORMREF, e.g., 30 uA-10 uA=~20 uA. At the beginning of the operation, a current=the current 1902-Icell, i.e., =30 uA-0.1 uA=29.9 uA, flows into the diode connected NMOS transistor 1913 by KCL (Kirchoff's Current Law) law. This current is mirrored into the mirror NMOS transistor 1914. The current in transistor 1914 is compared versus the reference form current 1915. Since the current in the transistor 1914 (29.9 uA) is greater than the reference current 1915 (10 uA), the voltage on the node 1920 is pulled to ground, hence the signal DONEx is low. The DONEx being low turns on the PMOS transistor 1901, enabling a form voltage supply (V_formsup 1960) to pass thorough the IOW 1922 node and to the bitline BL 1903. This form supply voltage starts the RRAM cell 1904 to start forming a filament. As the filament is forming, the resistivity of the RRAM cell decreases, causing the Icell to increase from the initial current of 0.1 uA. At the point of Icell=20 uA, the current flows into the transistor 1913=30 uA-20 uA=10 uA. At this point, the voltage 1920 starts to increase. At the point of Icell=20.1 uA, the current flows into the transistor 1913=30 uA-20.1 uA=9.9 uA. At this point, the voltage 1920 increases to, for example, be greater than the trip point of the inverter 1916, causing the DONEX 1930 signal to go high, shutting off the PMOS transistor 1901, in turn shutting off the form supply voltage V_formsup 1960. Hence, the voltage on the bitline 1908 rapidly decreases towards ground, stopping the form operation.

Figure 20:
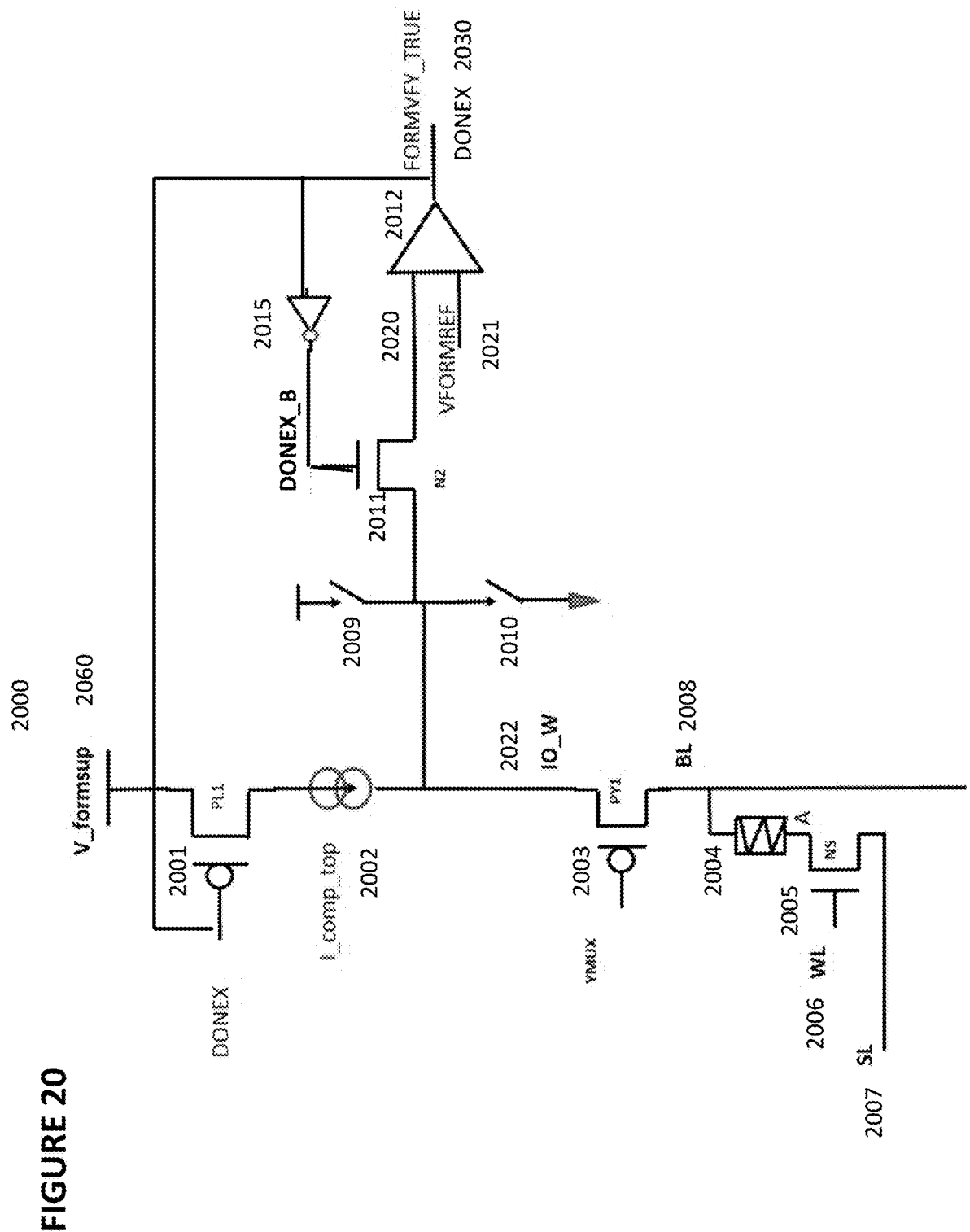
FIG. 20 depicts another embodiment of a form-while-verify circuit.

FIG. 20 depicts form-while-verify circuit 2000 using self-timed bitline voltage comparison, which performs a form operation on RRAM cell 2004 and automatically stops the operation once the form is complete by automatically and continuously comparing a voltage on the bitline (coupled through a mux) of a RRAM cell to a target reference form voltage during the form operation. Form-while-verify circuit 2000 comprises control PMOS transistor 2001, top compliance current source I_comp_top 2002, PMOS transistor 1903 (which is part of the column decoder circuit for selecting the column in which RAM cell 2004 is located), select transistor 2005, positive bias switch 2009, ground bias switch 2010, NMOS transistor 2011, inverter 2015 and comparator 2012. The negative input of comparator 2012 is a reference voltage VFORMREF 2021. The select transistor 2005 serves as an enabling (decoding) and/or a mirror transistor to mirror a form bottom compliance current on the bottom electrode of the RRAM cell to limit the AC switching current in the RRAM cell 2004 during the operation. The top compliance current 2002 determines the target form current Icell for the RRAM cell 2004. The circuit 2000 contains many of the same or similar components or operation details (such as current or voltage waveform shaping) described previously for the circuit 1900 and those components operation details will not be described again here for efficiency sake.

At the beginning of the form operation, DONEX 2030 signal is '0.' This turns on PMOS transistor 2001 (to pass the form voltage supply V_formsup 1960 into the node IO_W 1922 and the bitline 1908) and NMOS transistor 2011. RRAM cell 2004 at this point has a very high resistance (e.g., mega ohms), and PMOS transistor 2003 appears at this point to be connected to an open circuit. The voltage at the node IO_W 2022 therefore begins to increase quickly. The high voltage at IO_W eventually causes the filament to form in RRAM cell 2004, at which point the resistance of RRAM cell 2004 drops significantly, and current begins flowing through RRAM cell 2004. Once the cell current Icell reaches comparably to the compliance current I_comp_top 2002, the voltage IO_W 2022 starts to decreases. When the voltage of IO_W exceeds negatively below the VFORMREF 2021, the output DONEX 2030 of the comparator 2012 will flip from '0' to '1,' signifying that the form operation is complete. At this point the formed cell current Icell is comparable to the compliance current I_comp_top 2002. That change in state of the signal DONEX turns off PMOS transistor 2001, which in turns stops the form voltage from being applied to RRAM cell 2004.

Alternatively, the top compliance current 2002 can be replaced by a resistor load such as a resistor or a transistor acting as a resistor.

Figure 21:
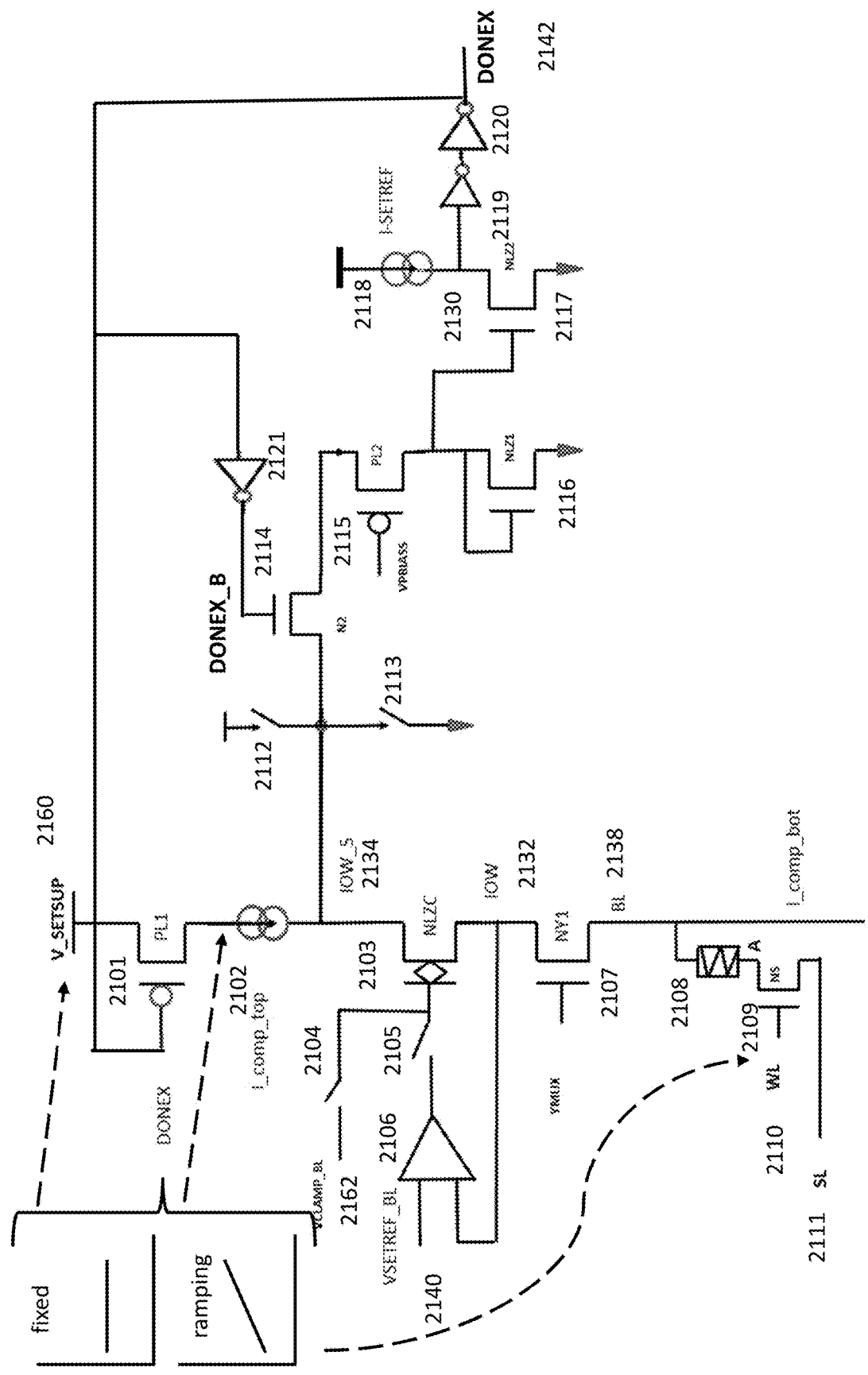
FIG. 21 depicts an embodiment of a set-while-verify circuit.

FIG. 21 depicts set-while-verify circuit 2100 using self-timed folded set current comparison, which performs a set operation on RRAM cell 2108 and automatically stops the operation once set is complete by automatically and continuously timewise comparing RRAM cell current (Icell) to a target set current (Iset target) during the form operation. Set-while-verify circuit 2100 comprises control PMOS transistor 2101, set supply voltage V-SETSUP 2160, top compliance current source IC_comp_top 2102, native NMOS transistor 2103, switches 2104 and 2105, comparator 2106, ymux NMOS transistor 2107, select transistor 2109, switches 2112 and 2113, NMOS transistor 2114, cascoding PMOS transistor 2115, mirror NMOS transistors 2116 and 2117, current source 2118, inverter 2121, and inverters 2119 and 2120 in the configuration shown. The select transistor 2109 serves as an enabling (decoding) and/or as a mirror transistor to mirror a form bottom compliance current, e.g., 0.0002-100 uA, on the bottom electrode of the RRAM cell to limit the switching current in the RRAM cell 2108 during the set operation. During the set operation, the current flowing (hence growing rate and size of the filament) in the RRAM cell is constrained by the top compliance current 2102 and the bottom compliance in the select transistor 2109. During the set operation, the top compliance current I_comp_top 2102 and/or the bottom current compliance in the transistor 2109 can be a fixed, a ramping, or a stepped variable increment/decrement current bias (set current waveform shaping). The PMOS transistor 2115 serves as a cascoding transistor to fold a resulting current (=I_comp_top−Icell) into the diode NMOS transistor 2116. Bias at the gate of the PMOS transistor 2115 determines a bias voltage at the node IO_W 2134.

At the beginning of the set operation, DONEX 2142 signal is '0.' PMOS 2101 is turned on, and NMOS transistor 2114 is turned on. Set power supply V_setsup 2160 passes into node IOW_S 2134. The set voltage supply V_SETSUP 2160 could be a fixed voltage, a ramping voltage, a stepped variable increment/decrement voltage during the set operation. The comparator 2106, by closed loop control action with the transistor 2103, will superimpose a set bias voltage equal to VSETREF_BL 2040 into node IOW_2132. And this voltage is passed through to bitline BL 2138, which couples to top electrode of the RRAM cell 2108. Alternatively instead of using the comparator 2106, a reference clamp voltage VCLAMP_BL 2162 (enabled by switch 2104) can apply to the gate of the transistor 2103 to superimpose a set bias voltage on the node IOW 2132 by source follower action of the transistor 2103. Alternatively by waveform voltage shaping of the either the VSETREF_BL 2140 or the VCLAMP_BL 2162, the set voltage on the BL 2212 could be a fixed voltage, a ramping voltage, a stepped variable increment/decrement voltage during the set operation RRAM cell 2108 at this point has a high resistance, e.g., hundreds of kilo-ohms, and draws very low current, e.g., hundreds of nA to a couple uA, meaning the RRAM cell has incomplete or partial filament (from a reset operation). At some point, the application of the BL voltage 2138 to RRAM cell 2108 causes the remaining open portion of the filament to start to set. This means the filament start to grow in size from an incomplete filament to a complete filament, meaning it starts to complete electrically the conducting path between bottom and top electrodes of the RRAM cell, and the resistance of RRAM 2108 goes down and RRAM 2108 begins drawing larger current (Icell). This causes the folded current in transistor 2116 and 2117 (=Icomp_top 2102=Icell) to start dropping. Once the set cell current Icell reaches comparably to the top compliance current I_comp_top 2102, the current in the transistor 2116/2117 drops below the reference current I-SETREF 2118. At this point, the current source 2118 causes the voltage at the input of inverter 2119 to increase. At some point, that voltage flips from a '0' state to a '1' state, causing the output of inverter 2120 also to change from '0' to '1,' signifying that the set operation is complete. That change in state turns off PMOS transistor 2101, which in turns stops the V_SETSUP voltage 2160 from being applied to the top electrode of the RRAM cell.

Figure 22:
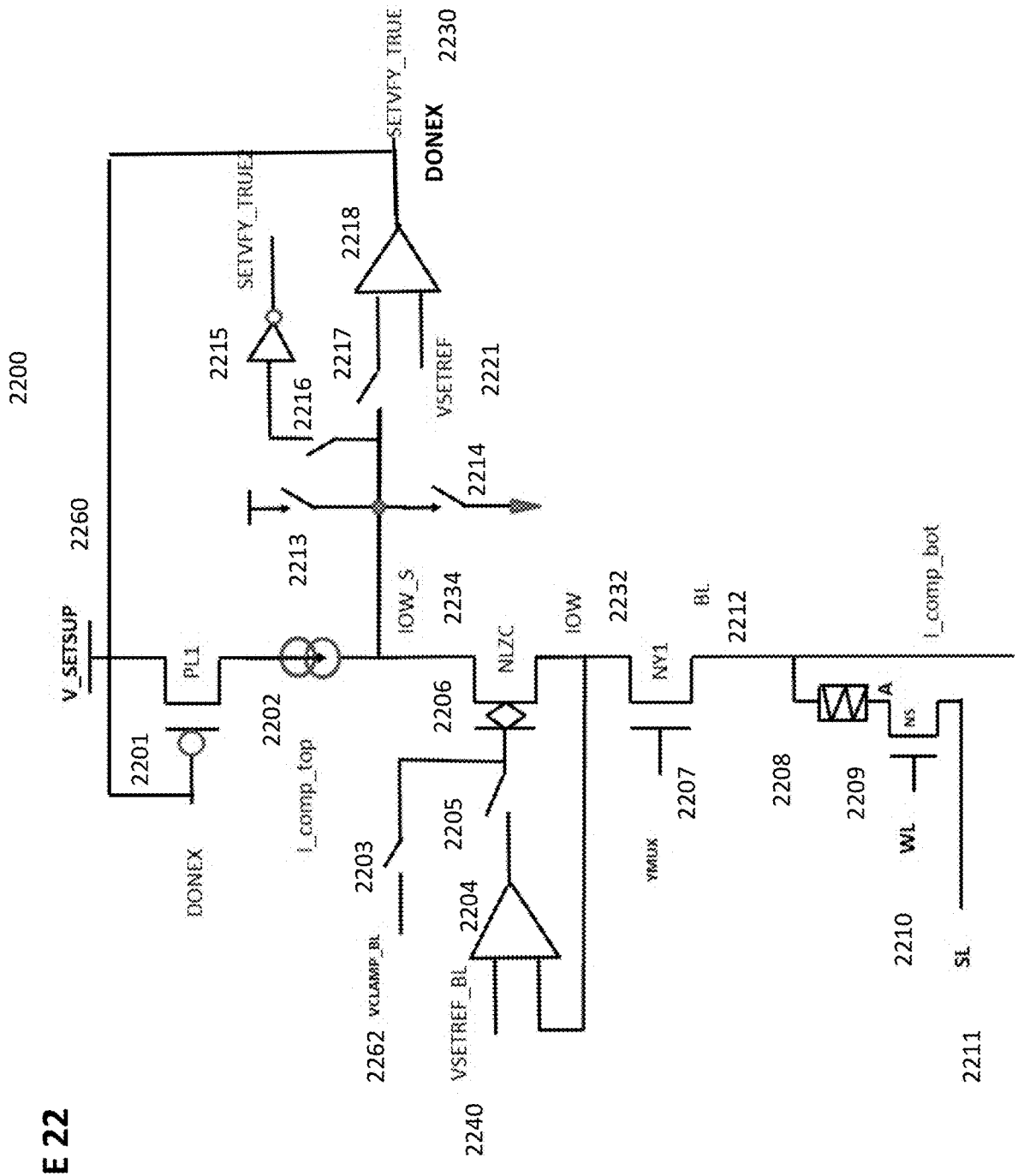
FIG. 22 depicts another embodiment of a set-while-verify circuit.

FIG. 22 depicts set-while-verify circuit 2200, which performs a set operation on RRAM cell 2208 and automatically stops the operation once set is complete by automatically and continuously comparing a voltage coupled to the bitline of a RRAM cell to a target reference set voltage during the set operation. Set-while-verify circuit 2200 comprises control PMOS transistor 2201, top compliance current source I_comp_top 2202, native NMOS transistor 2206, switches 2203 and 2205, comparator 2204, ymux NMOS transistor 2207, select transistor 2209, switches 2212 and 2213, switch 2216, inverter 2215, switch 2217, and comparator 2218 in the configuration shown. The circuit 2200 contains many of the same or similar components or operation details (such as current or voltage waveform shaping) described previously for the circuit 2100 and those components or operation details will not be described again here for efficiency sake.

At the beginning of the set operation, signal DONEX 2230 is '0.' Control PMOS 2201 is turned on and passes the set supply voltage V_SETSUP 2260 into node IOW_S 2234. The voltage at IOW_S 2234 begins to increase. RRAM cell 2208 at this point has a high resistance and draws little or low current. The rising voltage on the node IOW_S 2234 causes node IOW 2232 to increase to a set bias voltage determined by reference level VSETREF_BL 2240 on an input of the comparator 2204 (case of switch 2205 is closed and switch 2203 is opened). This voltage IOW 2232 passes to bitline BL 2212 through the ymux NMOS transistor 2207. At some point, the application of the set bias voltage to top electrode of the RRAM cell 2208 being high enough causes the remaining open portion of the filament to start to set, and the resistance of RRAM 2208 goes down and RRAM 2208 begins drawing larger (Icell) current. Once a target set cell current Icell is reached comparably to the top compliance current I_comp_top 2202, this causes voltage on the IOW_S 2234 to start dropping. When the voltage IOW_S 2234 exceeds negatively below the reference voltage VSETREF 2221, the output of comparator 2218 flips from '0' to '1,' signifying that the set operation is complete. That change in state turns off PMOS transistor 2201, which in turns stops the V_SETSUP voltage 2260 from being applied. This causes the voltage on the bitline BL 2212 to goes toward ground level, stopping the set operation.

Alternatively, the top compliance current 2202 can be replaced by a resistor load such as a resistor or a transistor acting as a resistor.

Figure 23:
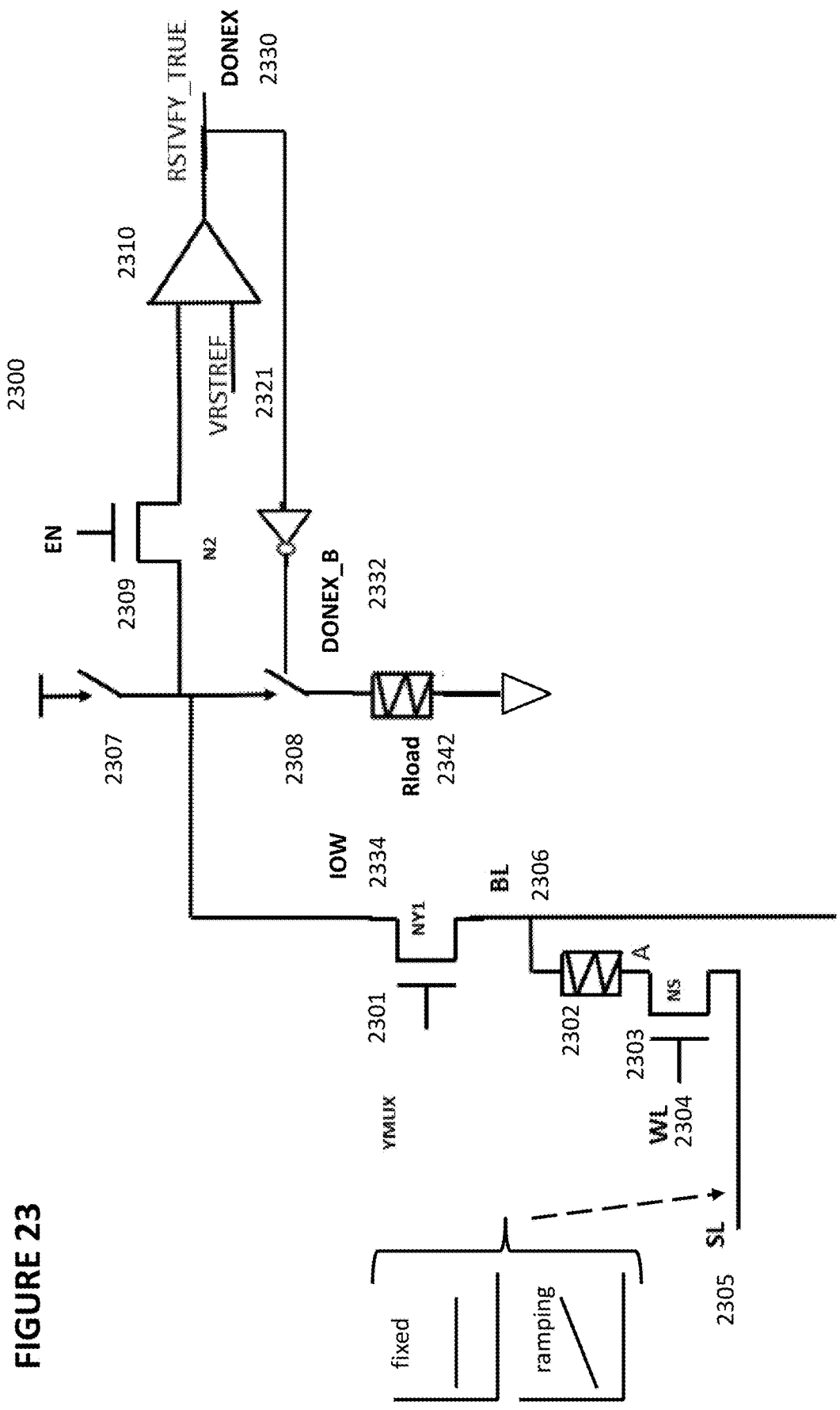
FIG. 23 depicts an embodiment of a reset-while-verify circuit

FIG. 23 depicts reset-while-verify circuit 2300, which performs a reset operation on RRAM cell 2302 and automatically stops the operation once reset is complete by automatically and continuously comparing a voltage coupled to the bitline of the RRAM cell to a target reset reference voltage during the reset operation. Reset-while-verify circuit 2300 comprises ymux NMOS transistor 2301, select transistor 2303, switches 2307 and 2308, NMOS transistor 2309, a reset load Rload 2342 (either a resistor or a transistor acting as a resistor), and comparator 2310 in the configuration shown.

At the beginning of the operation, resistance of RRAM cell is low (after a set operation), signal DONEX 2330 is '0,' and NMOS switch 2308 is on. Bit line BL 2306 is pulled towards ground. A reset voltage supply is applied to source line 2305 and is passed to bottom electrode of the RRAM cell 2302 through the NMOS transistor 2303 with WL 2304 being on. The reset voltage supply could be a fixed voltage, a ramping voltage, a stepped variable increment/decrement voltage during the set operation. The high cell current from original set state pulls node IOW 2334 toward a reset bias level (=Icell*Rload), This voltage is set to be greater than reset reference voltage VRSTREF 2321. At some point, RRAM cell 2302 is reset and a portion of its filament is destroyed. The resistance of RRAM cell 2302 then goes up dramatically. At this point the node IOW 2334, being pulled low by the Rload 2342, goes below the VRSTREF 2321 level, flipping the DONEX 2330 from '0' to '1'. This in turn turns off the switch 2308, floating the node IOW 2334, effectively stopping the reset operation.

Figure 24:
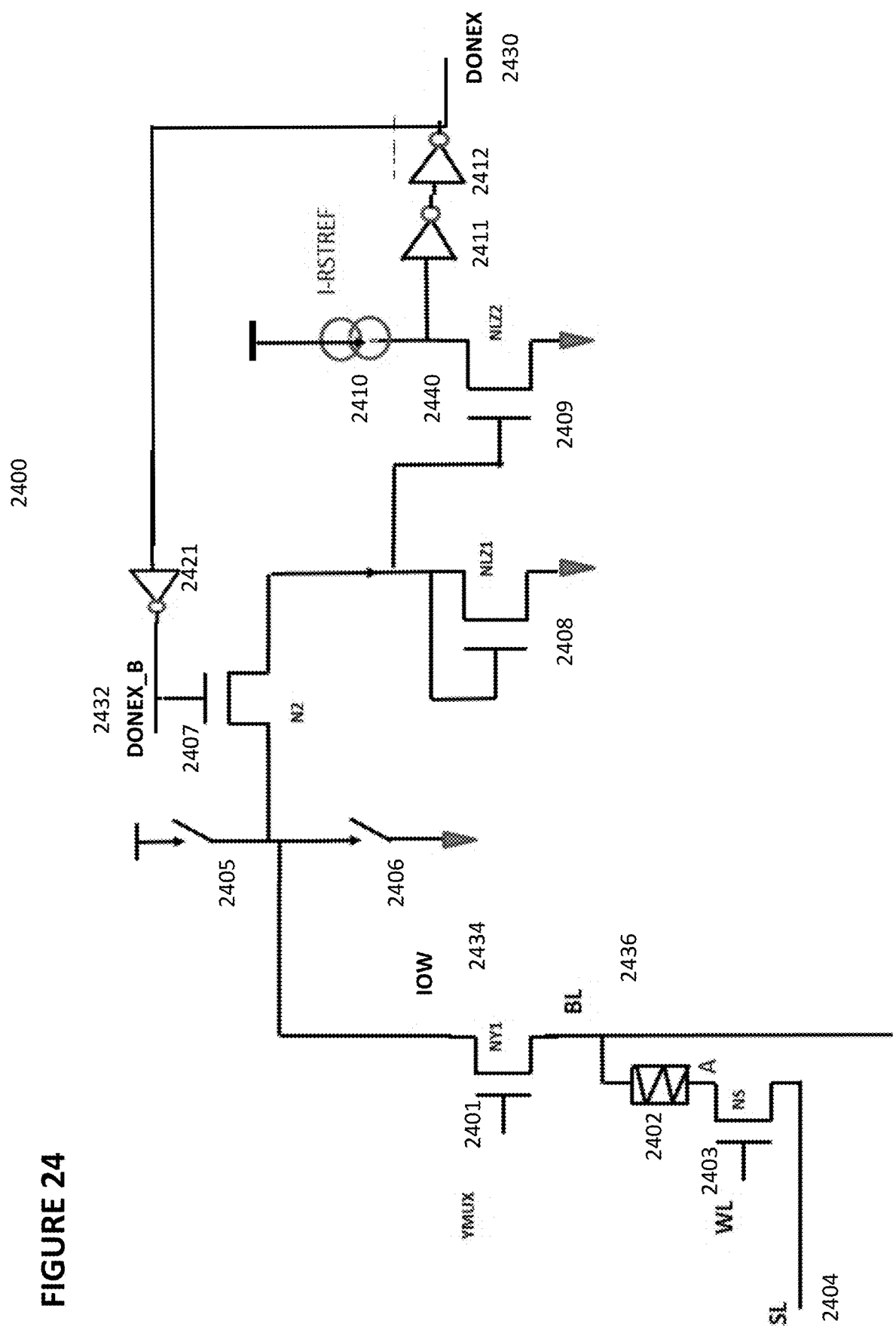
FIG. 24 depicts another embodiment of a reset-while-verify circuit

FIG. 24 depicts reset-while-verify circuit 2400, which performs a reset operation on RRAM cell 2402 and automatically stops the operation once reset is complete by automatically and continuously comparing RRAM cell current (Icell) to a target reset current (Ireset_target) during the reset operation. Reset-while-verify circuit 2400 comprises ymux NMOS transistor 2401, select transistor 2403, switches 2405 and 2406, NMOS transistors 2407, 2408, and 2409, current source I-RSTREF 2410, inverter 2421, and inverters 2411 and 2412 in the configuration shown. The transistor 2408 is diode connected and connected to bitline of selected RRAM cell, and serves to sense the cell current directly during the operation.

At the beginning of the operation, resistance of RRAM cell is low (after a set operation), signal DONEX 2430 is '0,' and NMOS transistor 2407 is on, connecting node IOW to drain/gate of the diode connected NMOS transistor 2408. Bit line 2436 is connected to IOW 2434 by the ymux NMOS transistor 2401. A reset voltage supply is applied to source line 2404. Initially high current cell (after a set operation) flows directly to the sensing transistor 2408 and is mirrored into the transistor 2409. This current is compared versus a reference reset current I-RSTREF 2410. Due to its initial cell (set) current being greater the reference reset current I-RSTREF 2410, node 2440 is pulled to ground, effectively pulling the DONEX 2430 equal to '0'. At some point after the reset voltage supply is coupled to bottom electrode of the RRAM cell 2402, the RRAM cell 2402 is reset and a portion of its filament is destroyed. The resistance of RRAM cell 2402 then goes up dramatically. At the point the cell current is less than the reference reset current I-RSTREF 2410, current source 2410 causes the node 2440 (the voltage on the input of inverter 2411) to flip from '0' to '1','' causing the output of inverter 2412 to also flip from '0' to '1,' signifying the end of the reset operation. This turns off the transistor 2407, floating the IOW 2434 and BL 2436, effectively stopping the reset operation.

Another embodiment using diode connected transistor to sense the current directly during set or form operation. On this case, a diode connected PMOS is connected to bitline of a selected RRAM cell. Source of the PMOS is connected to a set or form voltage supply. The current in the diode connected PMOS is mirrored into a current comparator to be compared versus a set/form reference current. Once the current in the diode connected PMOS reaches in parity the reference set/form current, the set/form operation stops.

Another embodiment using a load (a resistor or a transistor acting as a resistor) to sense the current directly during set or form operation. In this case, a first terminal of the load is connected to bitline of a selected RRAM cell. The second terminal of the load is connected to a set or form voltage supply. The voltage on the first terminal serves as a sensing node during operation to automatically stop the operation.

Figure 25:
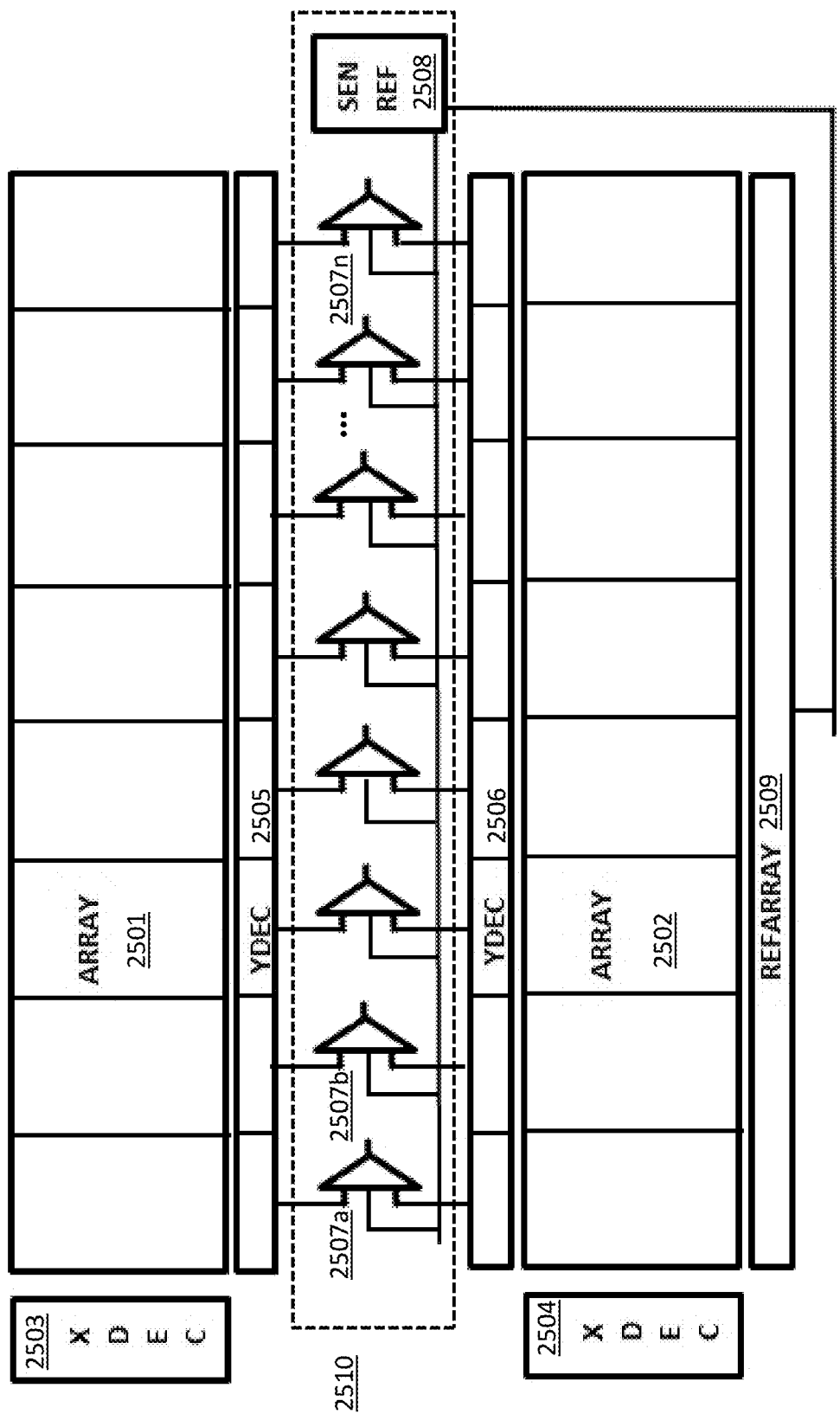
FIG. 25 depicts a sensing architecture for arrays of RRAM cells.

FIG. 25 depicts a flash memory system 2500 (which can be implemented on die 800). Flash memory system 2500 comprises arrays 2501 and 2502 (corresponding to arrays 801 and 803 in FIG. 8), row decoders 2503 and 2504 (corresponding to row decoders 805 and 806), column decoders 2505 and 2506 (corresponding to column decoders 806 and 808), and sensing circuit 2510 (corresponding to sensing circuit 810). Flash memory system 2500 further comprises reference array 2509 and sensing circuit current reference 2508.

Each column of flash memory cells in array 2501 is coupled to a bit line, such that there is one bit line for every column in array 2501. Similarly, each column of flash memory cells in array 2502 is coupled to a bit line, such that there is one bit line for every column in array 2502. Column decoders 2505 and 2506 connect selected bit lines to sensing circuit 2510 during a read operation for a selected address. Sensing circuit 2510 comprises a plurality of sense amplifier circuits 2507a, 2507b, . . . 2507n, where n is the number of bit lines that can be read concurrently and is referred to as the IO width of flash memory system 2500 (typically, n is 32 or 64). These sense amplifier circuits will be referred to collectively as sense amplifier circuits 2507.

In this embodiment, reference array 2509 is an array of dummy flash memory cells that are identical in structure to the flash memory cells of arrays 2501 and 2502 but which are not actually used to store user data. The reference array 2509 serves to generate read reference bias for sensing both arrays 2501 and 2502. In an alternative embodiment, reference array 2509 comprises regular reference transistors without flash memory cells. These regular reference transistors are sized and/or biased differently to provide different trip points (i.e., the current or voltage level that demarcates a "1" from a "0") for the sensing circuit 2510. In another alternative embodiment, reference array 2509 comprises regular reference resistors without flash memory cells. These regular reference resistors are sized differently to provide different trip points for the sensing circuit 2510.

Sensing circuit current reference 2508 is coupled to one or more of the dummy flash memory cells and generates a current. Using current mirror techniques, that current is mirrored in each of the sense amplifier circuits 2507. The mirrored reference current is them compared against a selected memory cell from array 2501 or 2502 to generate an output that indicates the value of the data stored in the selected memory cell.

Figure 26:
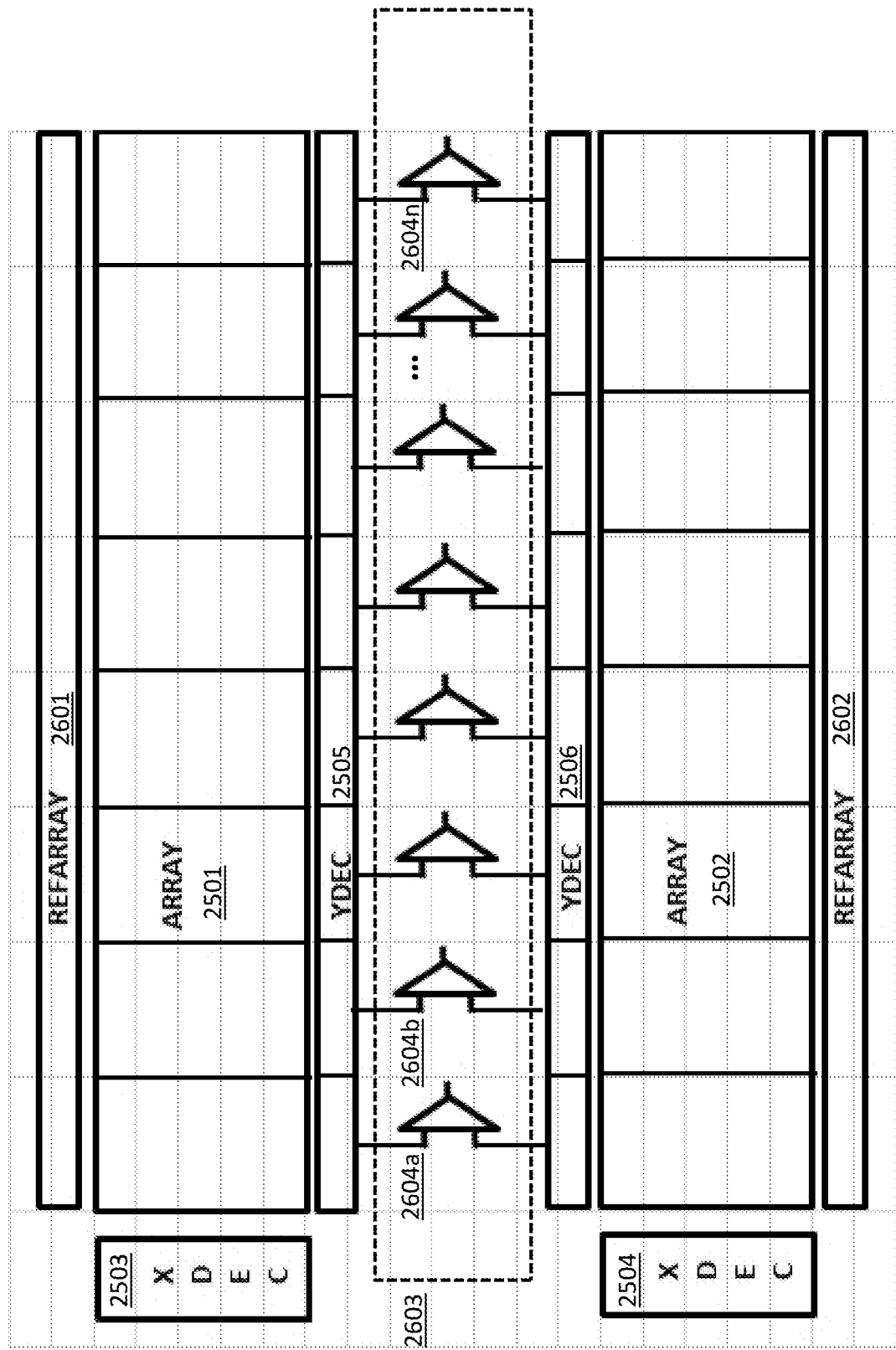
FIG. 26 depicts another sensing architecture for arrays of RRAM cells.

FIG. 26 depicts another flash memory system 2600 (which can be implemented on die 800). Flash memory system 2600, like flash memory system 2500, comprises arrays 2501 and 2502, row decoders 2503 and 2504, and column decoders 2505 and 2506. Flash memory system 2600 further comprises reference arrays 2601 and 2602 and sensing circuit 2603.

Each column of flash memory cells in array 2501 is coupled to a bit line, such that there is one bit line for every column in array 2501. Similarly, each column of flash memory cells in array 2502 is coupled to a bit line, such that there is one bit line for every column in array 2502. Column decoders 2505 and 2506 connect selected bit lines to sensing circuit 2603 during a read operation for a selected address. Sensing circuit 2603 comprises a plurality of sense amplifier circuits 2604*a*, 2604*b*, . . . 2604*n*, where n is the number of bit lines that can be read concurrently and is referred to as the IO width of flash memory system 2600 (typically, n is 32 or 64). These sense amplifier circuits will be referred to collectively as sense amplifier circuits 2604.

In this embodiment, reference arrays 2601 and 2602 both are an array of dummy flash memory cells that are identical in structure to the flash memory cells of arrays 2501 and 2502 but which are not actually used to store user data. When the selected memory cells are in array 2501, each sense amplifier circuit 2604 will be connected to a memory cell in reference array 2602, where that memory cell will act as a reference memory cell. When the selected memory cells are in array 2502, each sense amplifier circuit 2604 will be connected to a memory cell in reference array 2601 that will act as a reference memory cell. Thus, unlike flash memory system 2500, flash memory system 2600 does not require sensing circuit current reference 2508 or the use of current mirrors. In another alternative embodiment, reference arrays 2601 and 2602 comprise regular reference transistors without flash memory cells. These regular reference transistors are sized and/or biased differently to provide different trip points for the sensing circuit 2603. In another alternative embodiment, the reference arrays 2601 and 2602 comprise regular reference resistors without flash memory cells. These regular reference resistors are sized differently to provide different trip points for the sensing circuit 2603.

Figure 27:
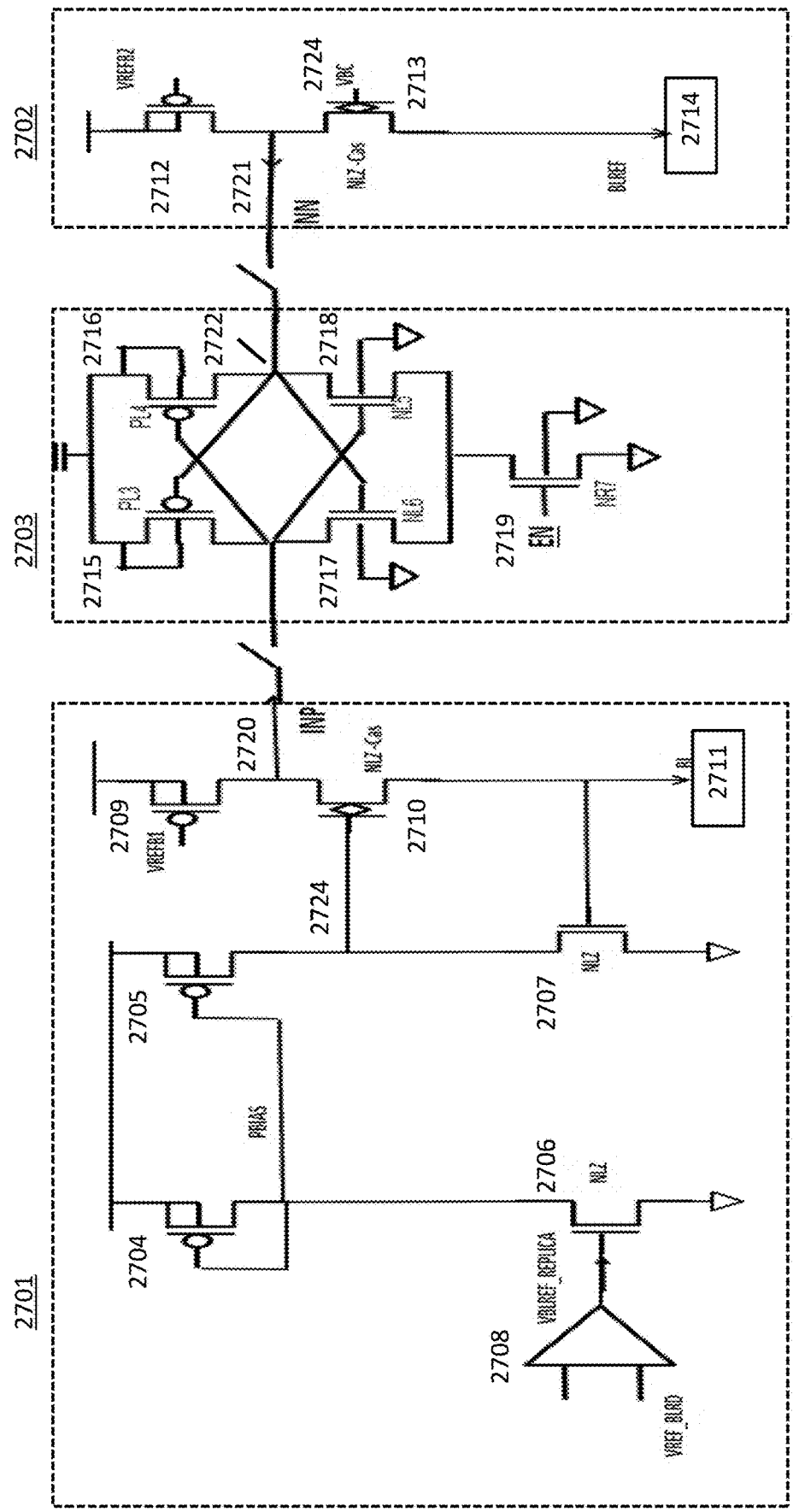
FIG. 27 depicts an embodiment of a sensing amplifier for use with a selected RRAM cell.

FIG. 27 depicts sense amplifier 2700. Sense amplifier 2700 comprises data read block 2701, reference read block 2702, and differential amplifier 2703.

Data read block 2701 connects to RRAM cell 2711, which is the selected cell for the read operation. Data read block 2701 comprises sensing load PMOS transistors 2704, 2705, and 2709, NMOS native transistor 2710, NMOS transistors 2706 and 2707, and comparator 2708 configured as shown. The transistor 2710 and 2713 (their gates connecting to node 2724) serves as cascoding transistor to isolate sensing node 2720 and reference node 2721 from bitlines of memory cells. The function of the transistors 2704/2705/2706/2707 together with transistors 2710 and 2713 serves to impose a fixed bitline read bias voltage. It works by replicating a reference transistor as a clamping replica transistor for the bitline as following. A fixed read bitline reference voltage, e.g., 0.2 v, is imposed on gate of the NMOS transistor (reference transistor) 2706, this results in a fixed current flowing in this device. This current is mirrored from the diode connected PMOS transistor 2704 into the PMOS transistor 2705 and into the NMOS transistor (replica transistor) 2707. Since same current flows in the reference transistor 2706 and replica transistor 2707, gate of the replica transistor 2707 has to be same as the gate voltage of the reference transistor 2706, which is the fixed read bitline reference voltage. And since gate voltage of transistor 2710 is same as gate voltage of the transistor 2713, source of the transistor 2713 is similar to that of the transistor 2710.

Reference read block 2702 comprises PMOS transistor 2712, native NMOS transistor 2713, and reference circuit 2714. Reference circuit 2714 here can comprise a reference read cell or a reference current source.

Differential amplifier 2703 comprises input cross coupled PMOS transistors 2715 and 2716 and input cross coupled NMOS transistors 2717 and 2718 together forming a comparator, and NMOS enabling transistor 2719 (which also acts as a transient bias tail current for the cross coupled NMOS transistors 2717 and 2718).

During operation, differential amplifier block 2703 will compare sensing node 2720 provided by data read block 2701 reference node 2721 provided by reference read block 2702 to generate output 2722. If the read reference current drawn at reference node 2721 exceeds the memory cell current drawn at sensing node 2720 (signifying that a "0" is stored in the selected RRAM cell 2711), then output 2722 will be low. If the read reference current drawn at reference node 2721 is less than the memory cell current drawn at sensing node 2720 (signifying that a "1" is stored in the selected memory RRAM cell 2711), then output 2722 will be high.

Figure 28:
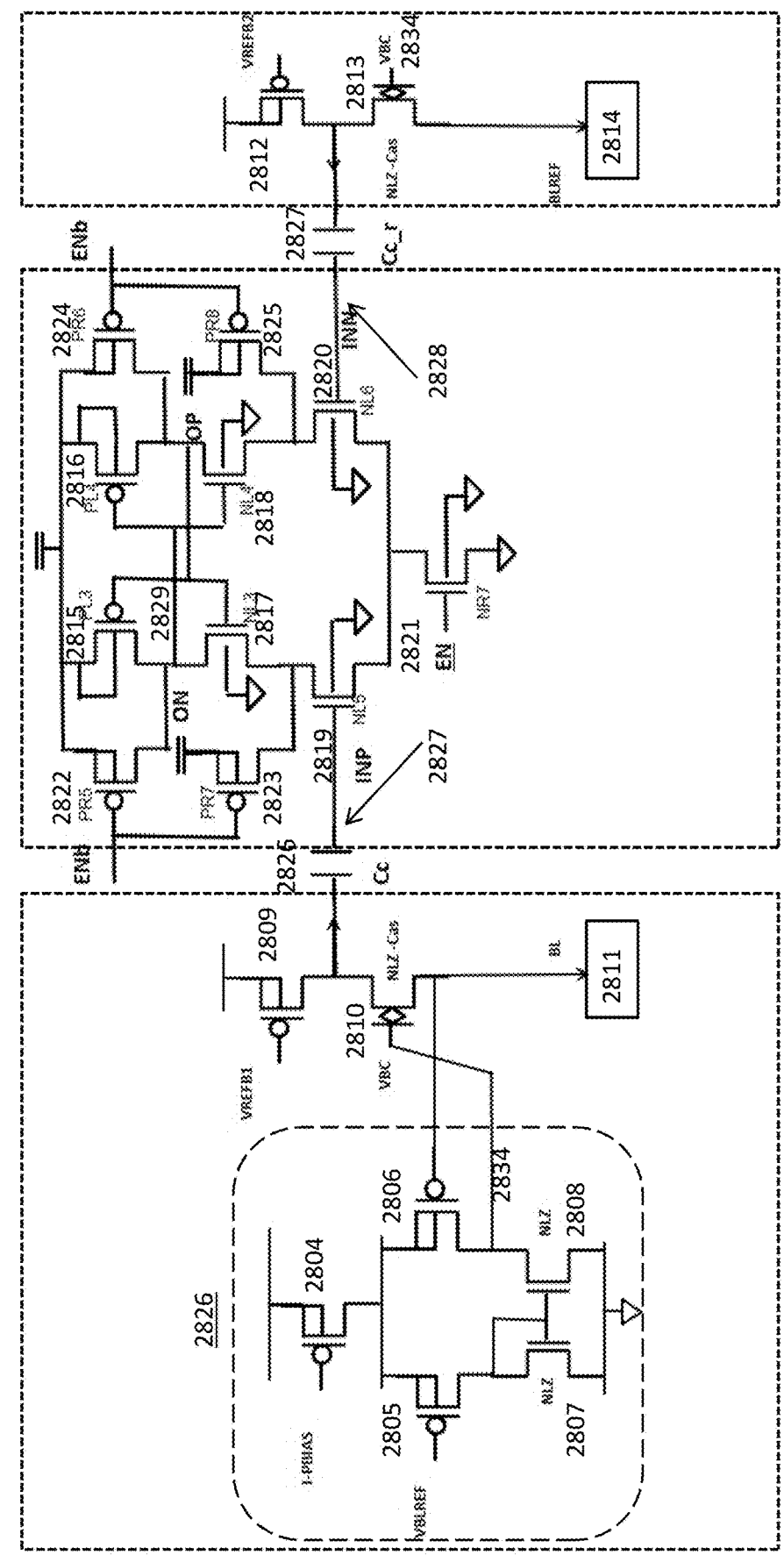
FIG. 28 depicts another embodiment of a sensing amplifier for use with a selected RRAM cell.

FIG. 28 depicts sense amplifier 2800. Sense amplifier 2800 comprises data read block 2801, reference read block 2802, and differential amplifier 2803.

Data read block 2801 connects to RRAM cell 2811, which is the selected cell for the read operation. Data read block 2801 comprises sensing load PMOS transistor 2809, and NMOS native transistor 2810. Data read block 2801 further comprises op amp 2826, which provides provide a bit line bias during the read operation. Op amp 2826 comprises PMOS transistors 2804, 2805, and 2806 and NMOS transistors 2807 and 2808. The op amp 2826 will superimpose a read bitline reference voltage on the bitline 2811 by maintaining gate voltage of the transistor 2806 to be same as gate voltage (which is equal to a input read bitline reference voltage) of the transistor 2905. The cascoding transistors 2810 and 2813 have same gate voltage to maintain similar source voltages on main array bitline and reference bitline.

Reference read block 2802 comprises PMOS transistor 2812, native NMOS transistor 2813, and reference circuit 2814. Reference circuit 2814 here can comprise a reference read cell or a reference current source.

Differential amplifier 2803 comprises input cross coupled PMOS transistors 2815 and 2816 and input cross coupled NMOS transistors 2817 and 2818 together forming a comparator, and NMOS enabling transistor 2821. Differential amplifier 2803 further comprises input NMOS transistors 2819 and 2820 and bias PMOS transistors 2822, 2823, 2824, and 2825.

Differential amplifier 2803 is coupled to data read block 2801 by capacitor 2826, and differential amplifier 2803 is coupled to reference read block 2802 by capacitor 2827.

During operation, differential amplifier block 2803 will compare sensing node 2827 provided by data read block 2801 and reference node 2828 provided by reference read block 2802 to generate output 2829. If the read reference current drawn at reference node 2828 exceeds the memory cell current drawn at sensing node 2827 (signifying that a "0" is stored in the selected RRAM cell 2811), then output 2829 will be low. If the read reference current drawn at reference node 2828 is less than the memory cell current drawn at sensing node 2827 (signifying that a "1" is stored in the selected memory RRAM cell 2811), then output 2829 will be high.

Figure 29:
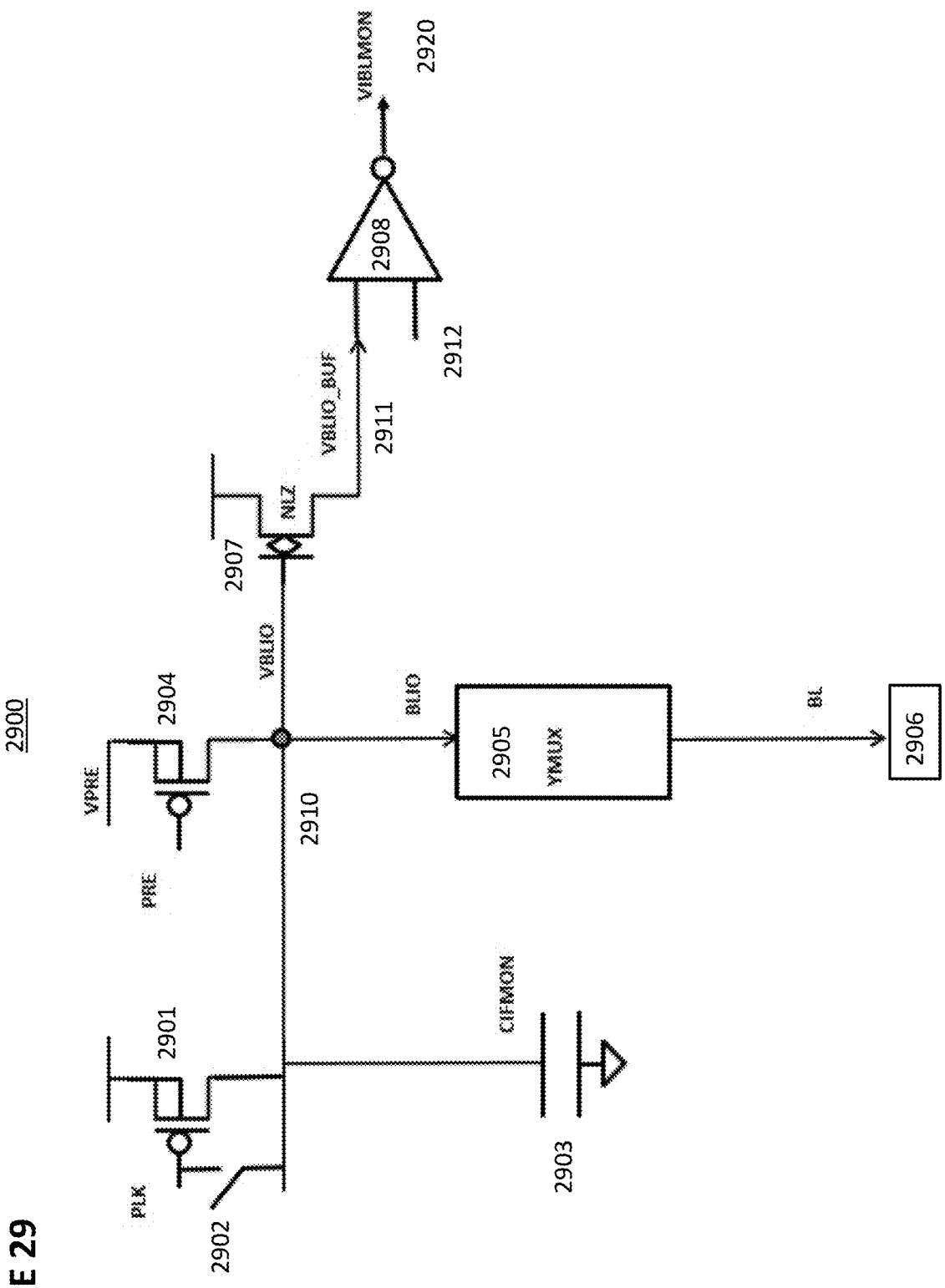
FIG. 29 depicts an embodiment of a current monitor for use with a selected RRAM cell.

FIG. 29 depicts current measurement (monitor) unit 2900. Current measurement unit 2900 comprises leakage compensation PMOS transistor 2901, switch 2902, capacitor 2903, pre-charging PMOS transistor 2904, column decoder ymux (Y-multiplexor) 2905, selected RRAM cell 2906, buffer native NMOS transistor 2907, and comparator 2908. Current measurement unit 2900 can detect very small currents, on the order of hundreds of pico-amps to nano-amps, by measuring the ramping rate. Specifically, firstly leakage compensation step is done as following. The RRAM cell 2906 is off (wordline is off), the PMOS transistor 2901 is used to measure the leakage on node 2910 in the off condition by diode connecting the PMOS transistor 2901 with switch 2902 closed. The bias drain/gate voltage is established by the leakage current flowing in the transistor 2901. Then the switch 2902 is off, At this point the transistor 2901 will hold the bias drain/gate voltage on its gate, thus creating a leakage current flows from high power supply to the node 2910, effectively cancelling the off condition leakage on the node 2910 flowing to ground. Next selected ymux 2905 is on connecting the node 2910 to the RRAM cell 2906. Next the PMOS transistor 2901 charges capacitor 2903 to a high reference voltage, after which PMOS transistor is turned off. The current drawn by RRAM cell 2906 will then discharge capacitor 2903, and at a certain point voltage on the node 2910 will go below the reference voltage 2912 of the comparator 2908, causing the output of comparator 2908 to flip. The rate determines the RRAM cell current by formula I=C*T/V, thus by measuring the timing the current can be determined. For example 1 na=10 pF*1V/10 ms.

Figure 30:
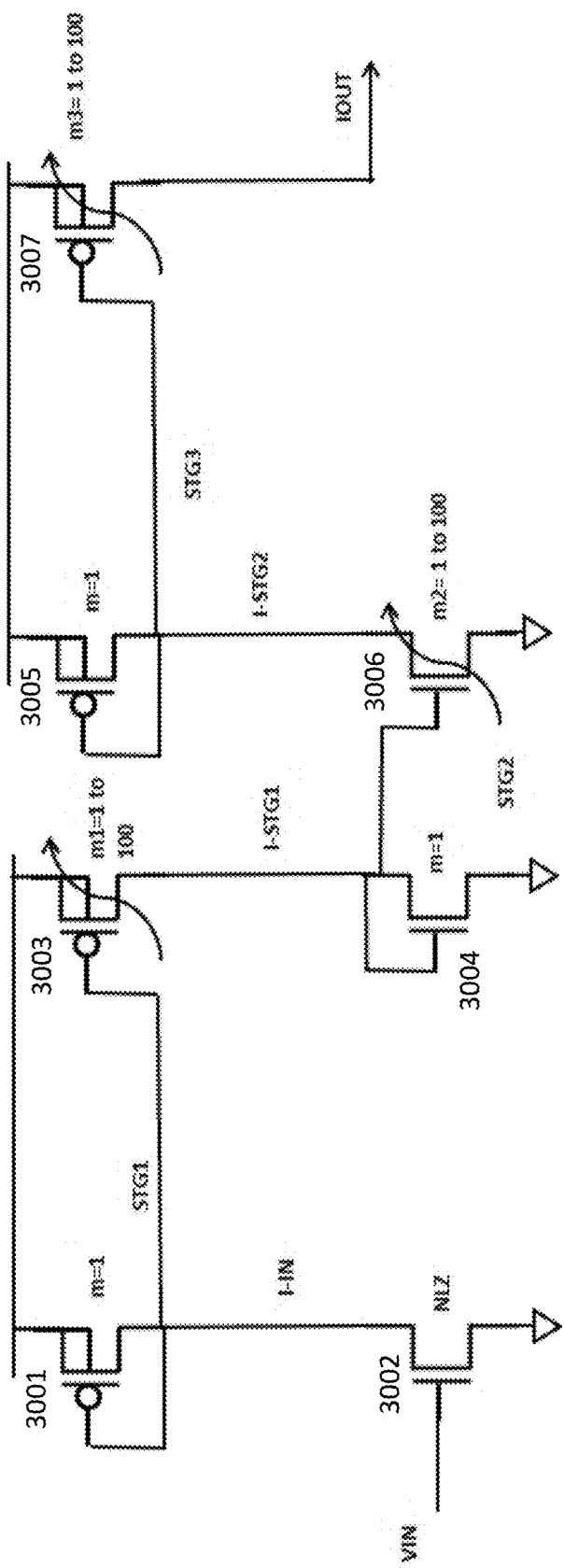
FIG. 30 depicts an embodiment of a current generator for use with a selected RRAM cell.

FIG. 30 depicts current generator 3000, which is useful for generating the I-form current needed during a form operation in a wide range, e.g., few nA to 100 uA. Current generator 3000 comprises PMOS transistor 3001 and 3005 and NMOS transistors 3002 and 3004. Current generator 3000 further comprises variable PMOS transistors 3003 and 3007 and variable NMOS transistor 3006, where the width-length ratio can be adjusted. By adjusting variable PMOS transistors 3003 (m=1 to 100) and 3007 (m=1 to 100) and variable NMOS transistor 3006 (m=1 to 100), such as enabling/trimming m factor of width unit of transistor, the output current IOut will be an amplified version of input current IIn by a factor as large as 10,000.

Figure 31:
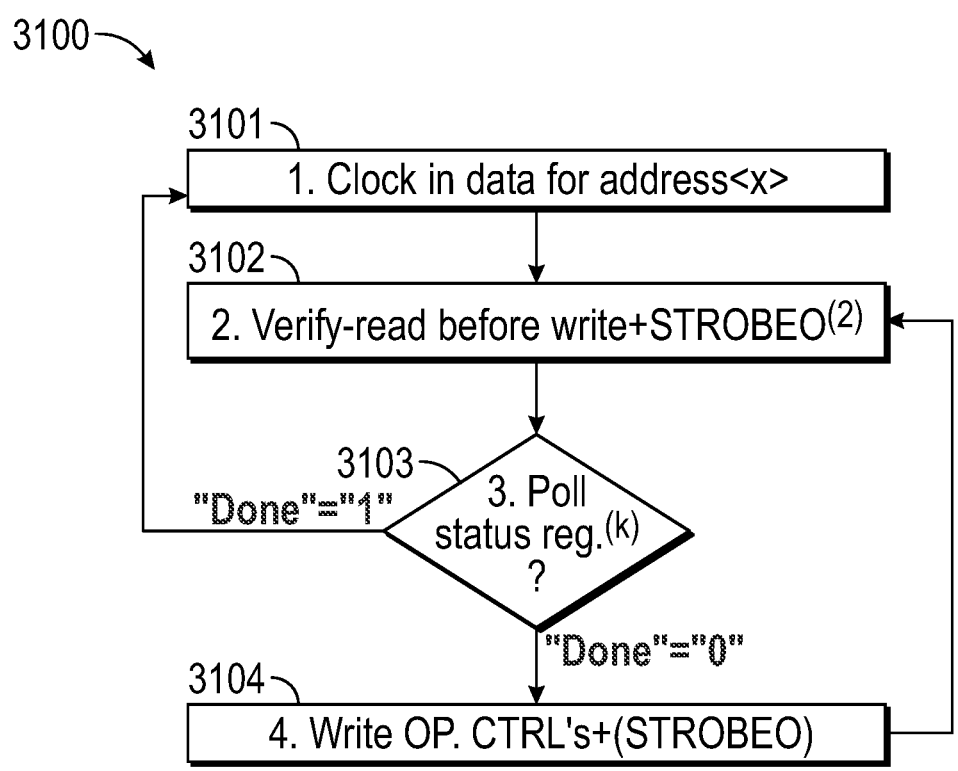
FIG. 31 depicts a write verify hybrid algorithm.

FIG. 31 depicts a write verify hybrid algorithm 3100. First, DATA is clocked in for the ADDRESS X (step 3101). A verify-read is performed before a write and strobe is performed (step 3102). The verify-read, write, strobe control is combination of internal control (such as sensing control and internal set/reset/form bias control) and external control (from control/address/data pins for write, polling, and read command inputs) such as from as Tester. The supplies (VSUPx, VREF, IREF) are provided from external or internal. The fixed, ramping, stepped current and voltage bias is done either by combination of external supply shaping and internal analog generator or by internal analog generator. The status register is the polled (step 3103). If the "Done" bit in the status register indicates a value of "1," then the operation is complete, and the system waits for the next DATA and ADDRESS pair to be clocked in. If the "Done" bit indicates a "0," then the system process to perform a write operation (step 3104). The "Done' bit is results of verifying the cell current reaching a target by internal sensing circuitry (FIGS. 25-29).

Figure 32:
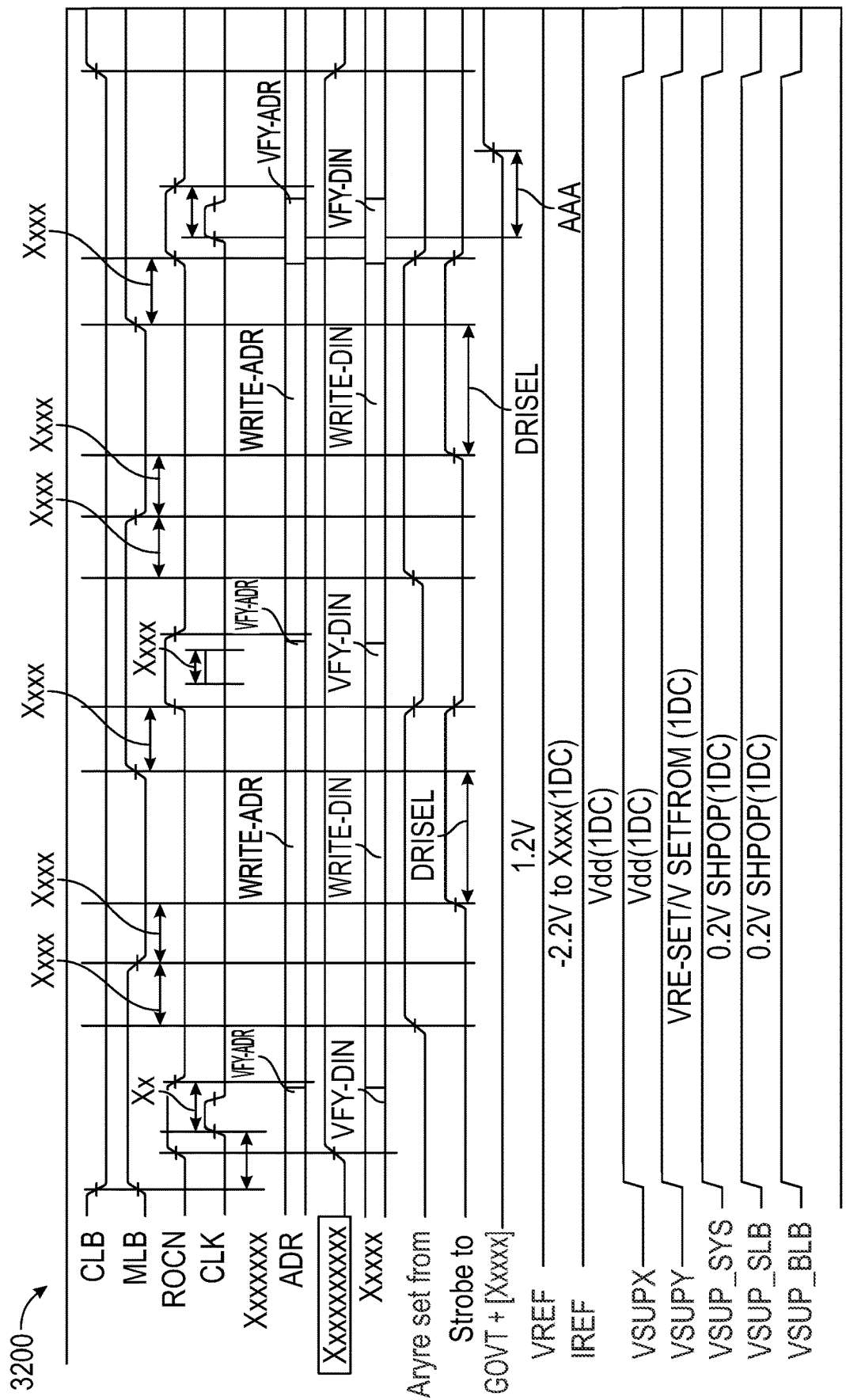
FIG. 32 depicts exemplary waveforms for the write verify hybrid algorithm of FIG. 31.

FIG. 32 depicts exemplary wareforms for the write verify hybrid algorithm 3100 of FIG. 31. External supplies VSUPx are provided to provide supply for set/reset/form and inhibit biases as well as for analog circuits (VREF, IREF). Control/address/data pins are generic to the macro.

Figure 33:
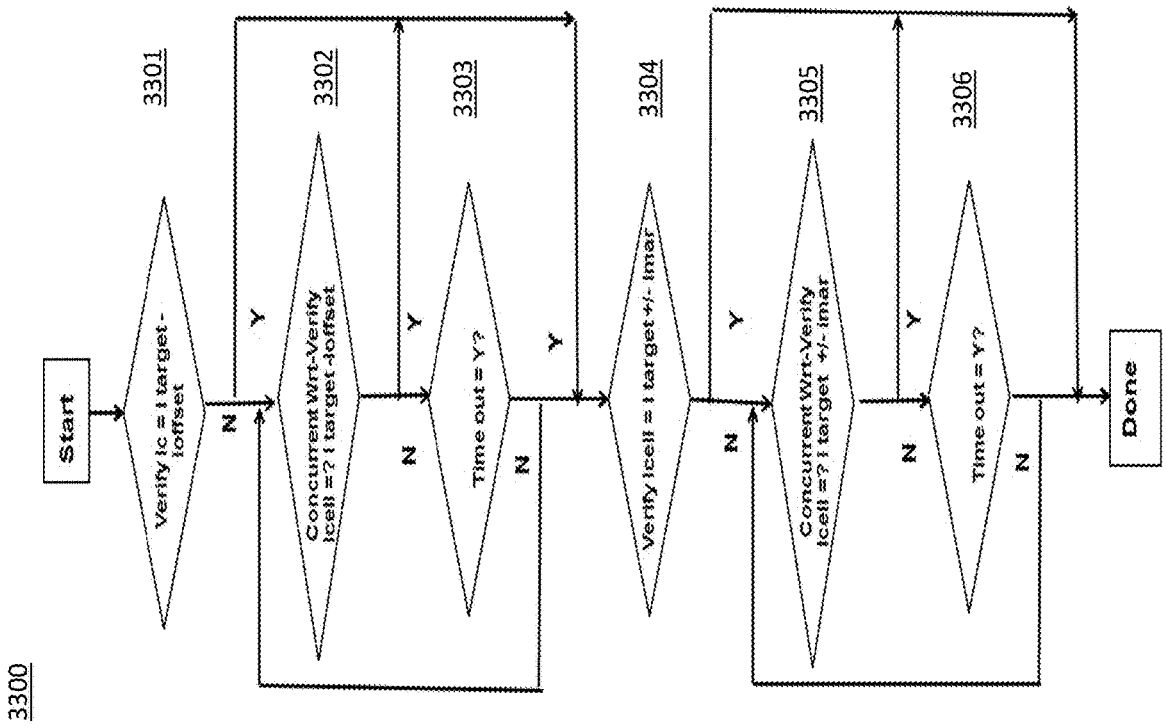
FIG. 33 depicts a concurrent write method.

FIG. 33 depicts concurrent write method 3300. Concurrent write (form/set/reset) verify means the verification of RRAM cell reaching the target is done automatically during the writing operation, such as described for FIGS. 19-24. In step 3301, the system determines if the current Icell is I target−I offset. If yes, then the system proceeds to step 3304. If no, then the system proceeds to step 3302. In step 3302, the system determines if the concurrent write-verify Icell is I target−I offset during the concurrent write-verify operation (verifying concurrently during the write operation). If no, then system proceeds to step 3303. If yes, the system proceeds to step 3304. In step 3303, the system determines if write timing exceeds a pre-determined timing (time out=yes or no). If yes, then proceed to the step 3304. If no, the system repeats step 3302. In step 3304, the system verifies that Icell=Itarget+/−Imar (target is within margin). If yes, then the method is complete. If no, then the system proceeds to step 3305. In step 3305, the system determines if the concurrent write-verify Icell is I target+/−I mar (verifying concurrently during the write operation). If yes, the method is complete. If no, the system proceeds to step 3306. In step 3306, the system determines if write timing exceeds a pre-determined timing (time out=yes or no). If yes, method is complete. If no, the system repeats step 3305. In the method described above, the write current and/or voltage bias can comprise of a fixed, ramp, or coarse and/or fine increment/decrement step pulses. In additional the pulse write timing can be variable pulsewidth. The target cell current can be large for the Ioffset and small for the Imar (Imargin).

Figure 34:
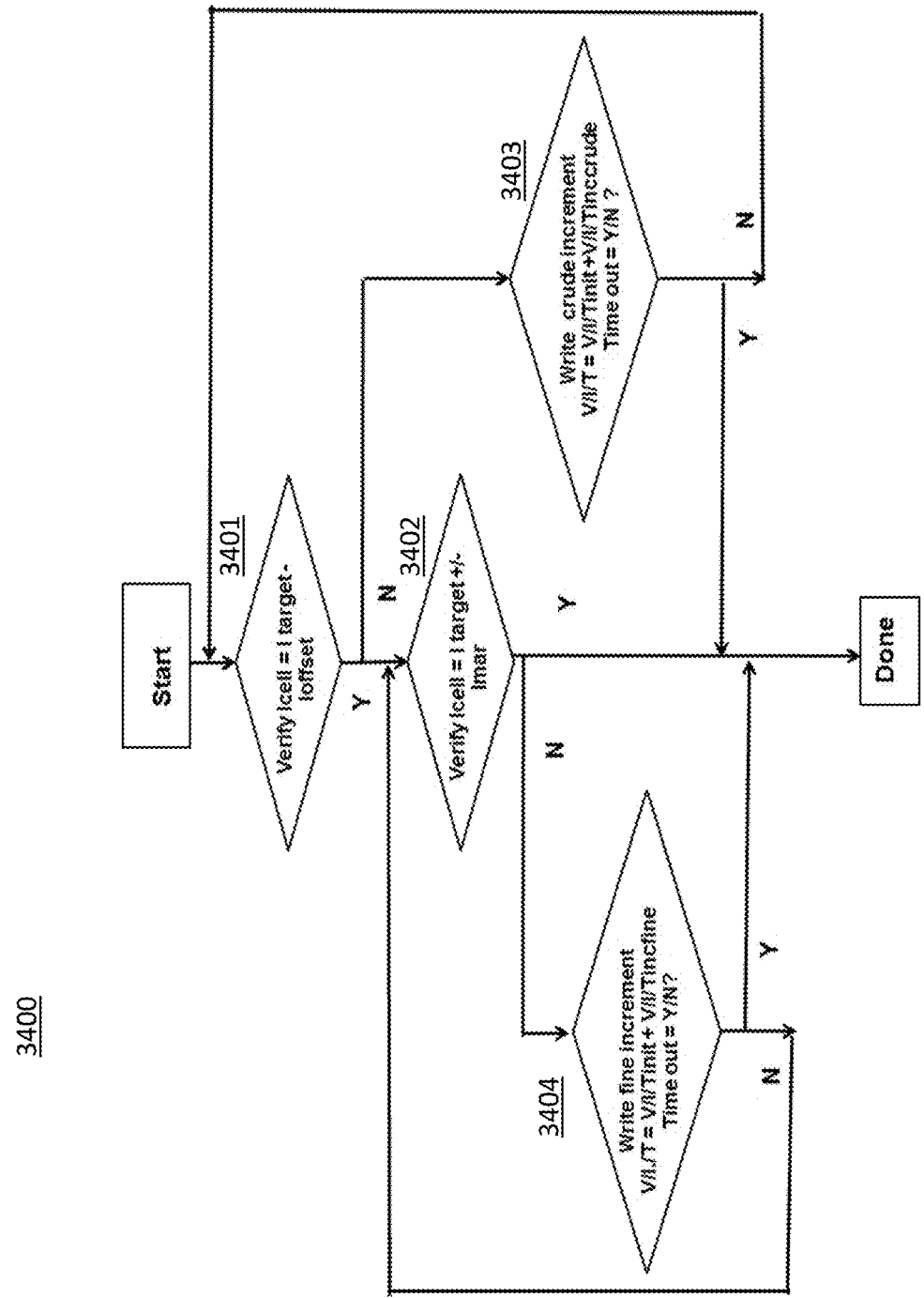
FIG. 34 depicts a concurrent form method.

FIG. 34 depicts verify-then-write (form/set/reset) method 3400. In step 3041, the system determines if Icell=I target−I offset. If yes, the system proceeds to step 3402. If no, the system proceeds to step 3403. In step 3402, the system determines if Icell=Itarget+/Imar (target cell current is within acceptable margin). If yes, the method is complete. If no, the system proceeds to step 3404. In step 3403, the system writes crude increment V/I/T=V/I/Tinit+V/I/Tinccrude (large voltage, current, and/or time pulse step) and then proceeds back to step 3401. In step 3404, the system writes fine increment V/I/T=V/I/Tinit+V/I/Tincfine (fine voltage, current, and/or time pulse step) and proceeds back to step 3402.

Figure 35:
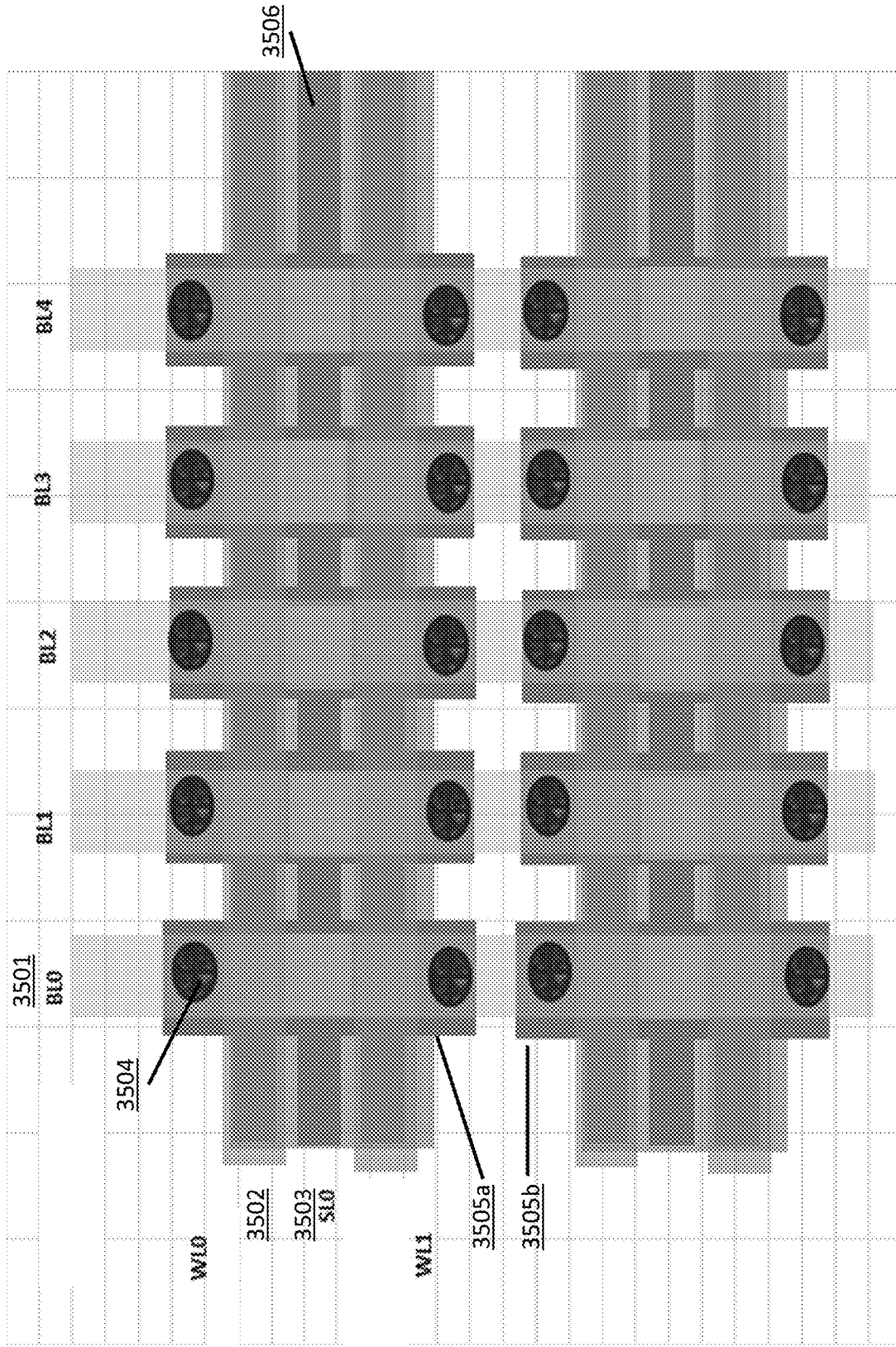
FIG. 35 depicts a top view layout of an embodiment of an array of RRAM cells.

FIG. 35 depicts exemplary RRAM cell top view layout 3500, which is an exemplary layout for the array 900 shown in FIG. 9. Exemplary RRAM cell 3504 is coupled to bit line 3501 (BL0), wordline 3502 (WL0) and source line 3503 (SL0). Diffusion area 3505a for top two cells and 3505b for bottom two cells in a bitline are separated. Diffusion 3506 connects all source lines of cells in two adjacent rows together.

Figure 36:
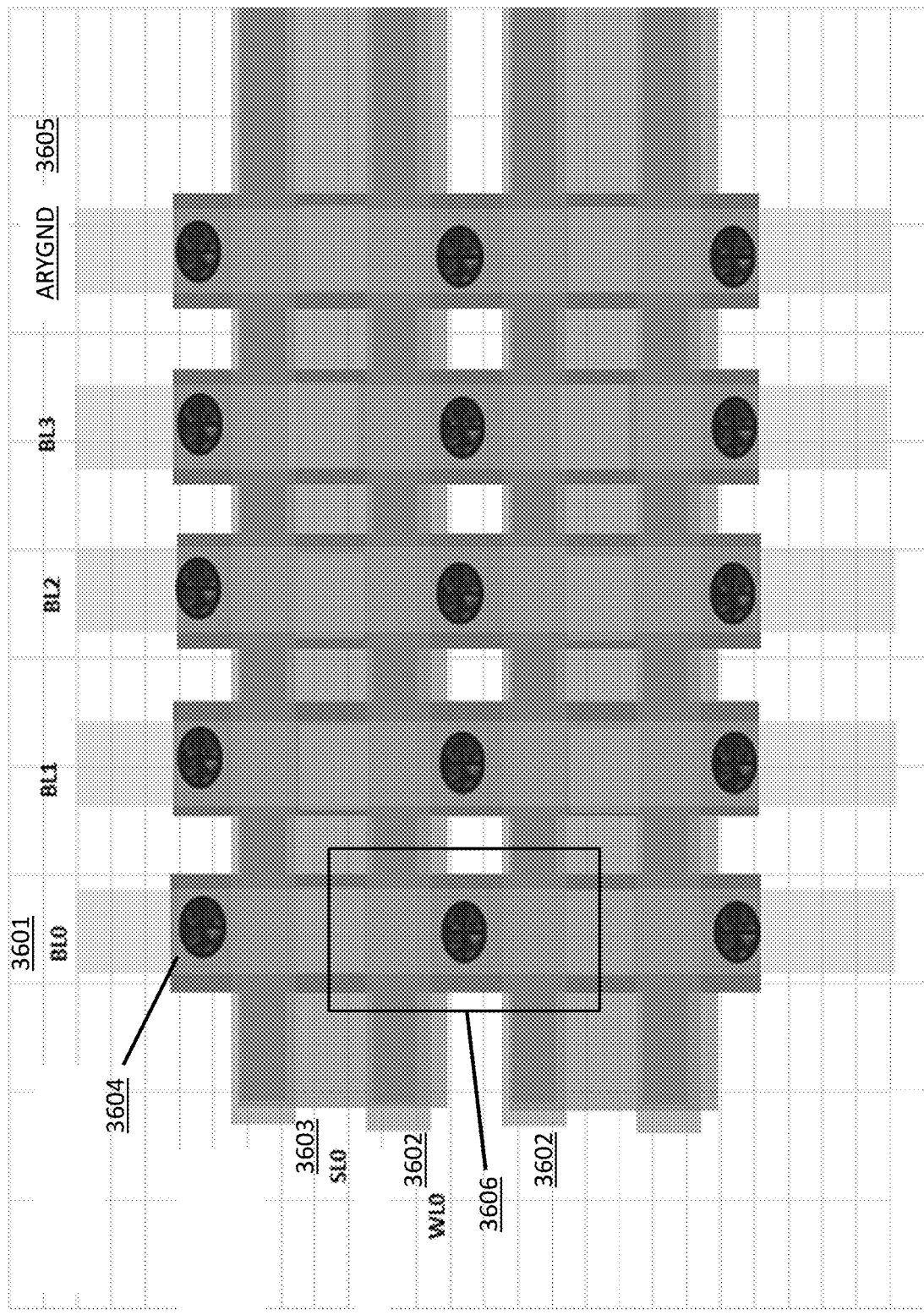
FIG. 36 depicts a top view layout of another embodiment of an array of RRAM cells.

FIG. 36 depicts exemplary RRAM cell top view layout 3600, which has an exemplary ground line layout for the array 1000 shown in FIG. 10 and exemplary cell layout for the array shown in FIG. 15. Exemplary RRAM cell 3604 is coupled to bit line 3601 (BL0), wordline 3602 (WL0) and source line 3603 (SL0). The array includes grounds lines, such as ground line 3605 (exemplary layout for the ground line of FIG. 10), embedded throughout the array. The cell layout 3606 corresponds to cell 1501/1502/1503 in FIG. 15.

Figure 37:
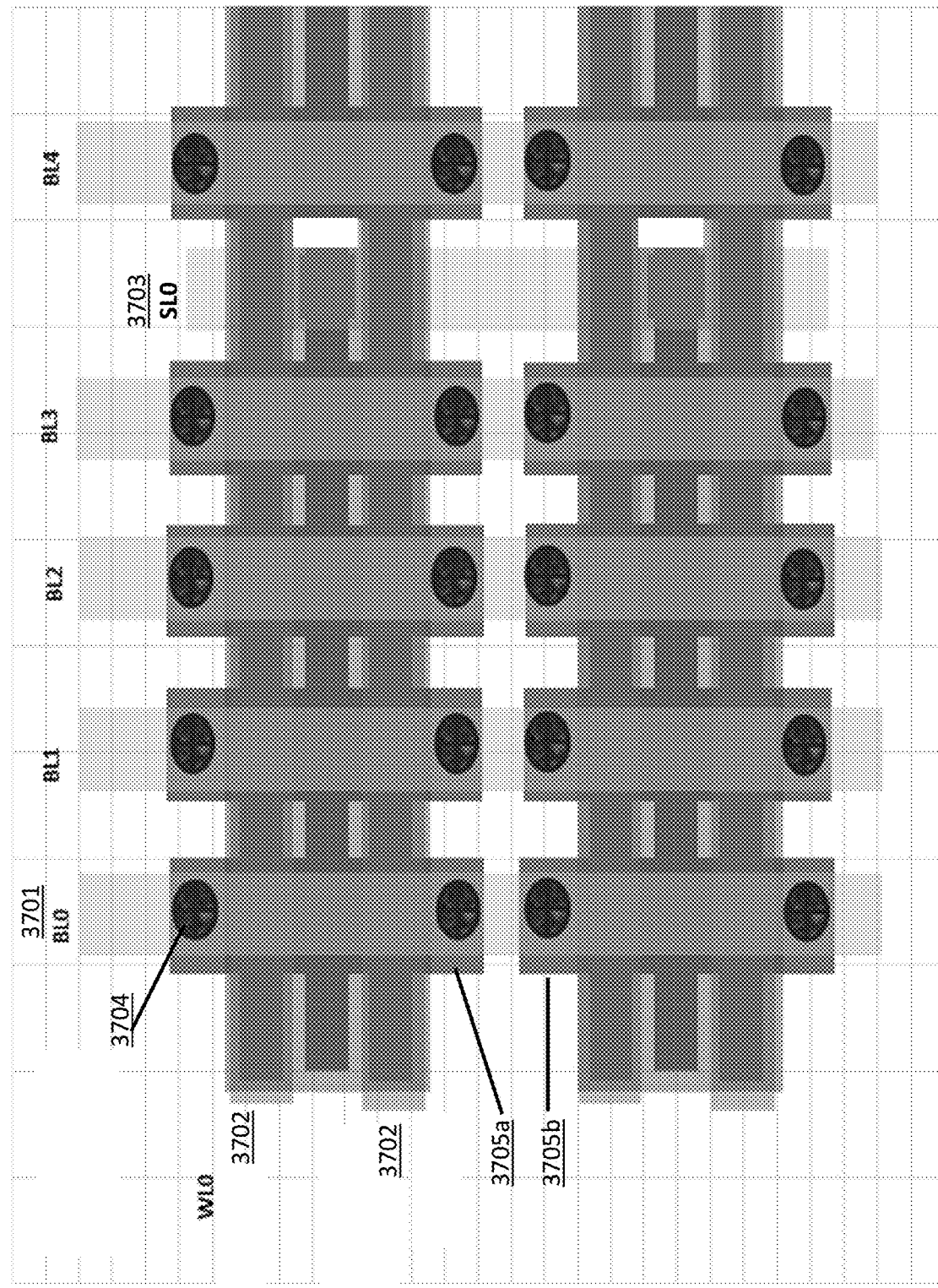
FIG. 37 depicts a top view layout of another embodiment of an array of RRAM cells.

FIG. 37 depicts exemplary RRAM cell top view layout 3700, which is an exemplary layout for the array 1400 shown in FIG. 14. Exemplary RRAM cell 3704 is coupled to bit line 3701 (BL0), wordline 3702 (WL0) and source line 3703 (SL0).

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A non-volatile memory system comprising:
an array of resistive random access memory (RRAM) cells organized into rows and columns, wherein each cell comprises a top electrode, a bottom electrode, and a switching layer between the top electrode and bottom electrode;
a plurality of bit lines, each bit line coupled to a column of RRAM cells;
a plurality of word lines, each word line coupled to a row of RRAM cells;
a plurality of source lines, each source line coupled to two adjacent rows of RRAM cells; and
a set-while-verify circuit for performing a set operation on a selected RRAM cell in the array by applying a ramping voltage to a bit line coupled to the selected RRAM cell until a current through the selected RRAM cell exceeds a target set current, wherein the set-while-verify circuit comprises a top compliance current source.

2. A non-volatile memory system comprising:
an array of resistive random access memory (RRAM) cells organized into rows and columns, wherein each cell comprises a top electrode, a bottom electrode, and a switching layer between the top electrode and bottom electrode;
a plurality of bit lines, each bit line coupled to a column of RRAM cells;
a plurality of word lines, each word line coupled to a row of RRAM cells;
a plurality of source lines, each source line coupled to two adjacent rows of RRAM cells; and
a set-while-verify circuit for performing a set operation on a selected RRAM cell in the array by applying a ramping voltage to a bit line coupled to the selected RRAM cell until a current through the selected RRAM cell exceeds a target set current, wherein the set-while-verify circuit comprises a bottom compliance current source.

* * * * *